(12) United States Patent
Buller et al.

(10) Patent No.: US 7,235,736 B1
(45) Date of Patent: Jun. 26, 2007

(54) MONOLITHIC INTEGRATION OF CYLINDRICAL SOLAR CELLS

(75) Inventors: Benyamin Buller, Cupertino, CA (US); Markus E. Beck, San Jose, CA (US)

(73) Assignee: Solyndra, Inc., Santa Clara, CA (US)

( * ) Notice: Subject to any disclaimer, the term of this patent is extended or adjusted under 35 U.S.C. 154(b) by 0 days.

(21) Appl. No.: 11/378,835

(22) Filed: Mar. 18, 2006

(51) Int. Cl.
*H01L 31/05* (2006.01)

(52) U.S. Cl. ............... 136/251; 136/246; 136/256; 136/259; 136/265

(58) Field of Classification Search ........... 136/243, 136/251, 246, 256, 259, 265
See application file for complete search history.

(56) References Cited

U.S. PATENT DOCUMENTS

| | | |
|---|---|---|
| 4,078,944 A | 3/1978 | Mlavsky |
| RE29,833 E * | 11/1978 | Mlavsky ............ 136/246 |
| 4,217,148 A | 8/1980 | Carlson |
| 4,292,092 A | 9/1981 | Hanak |
| 4,497,974 A | 2/1985 | Deckman et al. |
| 4,745,078 A | 5/1988 | Stetter et al. |
| 4,783,373 A | 11/1988 | Baumeister et al. |
| 4,784,701 A | 11/1988 | Sakai et al. |
| 4,892,592 A | 1/1990 | Dickson et al. |
| 5,348,589 A | 9/1994 | Arai et al. |
| 5,385,848 A | 1/1995 | Grimmer |
| 5,397,400 A | 3/1995 | Matsuno et al. |
| 5,437,736 A * | 8/1995 | Cole ............ 136/259 |
| 5,472,885 A | 12/1995 | Matsuno et al. |
| 5,580,509 A | 12/1996 | van den Berg et al. |
| 5,593,901 A | 1/1997 | Oswald et al. |
| 5,665,607 A | 9/1997 | Kawama et al. |
| 5,735,966 A * | 4/1998 | Luch ................ 136/244 |
| 6,018,123 A | 1/2000 | Takada et al. |
| 6,077,722 A | 6/2000 | Jansen et al. |

(Continued)

FOREIGN PATENT DOCUMENTS

DE 3801989 7/1989

(Continued)

OTHER PUBLICATIONS

Breel et al., 2004, "A Detailed Study of Monolithic Contacts and Electrical Losses in a Large-area Thin-film Module, " Prog. Photovolt: Res. Appl. 2005; 13: 297-310.

(Continued)

*Primary Examiner*—Nam Nguyen
*Assistant Examiner*—Anthony Fick
(74) *Attorney, Agent, or Firm*—Jones Day; Brett Lovejoy

(57) ABSTRACT

A solar cell unit comprising a substrate and a plurality of photovoltaic cells is provided. The substrate has a first end and a second end. The plurality of photovoltaic cells, which are linearly arranged on the substrate, comprises a first photovoltaic cell and a second photovoltaic cell. Each photovoltaic cell in the plurality of photovoltaic cells comprises (i) a back-electrode circumferentially disposed on the substrate, (ii) a semiconductor junction layer circumferentially disposed on the back-electrode, and, (iii) a transparent conductive layer circumferentially disposed on the semiconductor junction. The transparent conductive layer of the first photovoltaic cell in the plurality of photovoltaic cells is in serial electrical communication with the back-electrode of the second photovoltaic cell in the plurality of photovoltaic cells.

63 Claims, 23 Drawing Sheets

U.S. PATENT DOCUMENTS

| | | | |
|---|---|---|---|
| 6,121,541 | A | 9/2000 | Arya |
| 6,426,235 | B1 | 7/2002 | Matsushita et al. |
| 6,455,347 | B1 | 9/2002 | Hiraishi et al. |
| 6,518,596 | B1 | 2/2003 | Basore |
| 6,541,695 | B1 | 4/2003 | Mowles |
| 6,690,041 | B2 | 2/2004 | Armstrong et al. |
| 6,940,008 | B2 | 9/2005 | Shiotsuka et al. |
| 2003/0068559 | A1* | 4/2003 | Armstrong et al. ......... 429/234 |
| 2003/0121544 | A1 | 7/2003 | Hirata et al. |
| 2003/0180983 | A1 | 9/2003 | Oswald et al. |
| 2005/0040374 | A1 | 2/2005 | Chittibabu et al. |
| 2005/0072461 | A1 | 4/2005 | Kuchinski et al. |
| 2005/0098202 | A1* | 5/2005 | Maltby, Jr. .................. 136/256 |
| 2005/0253142 | A1 | 11/2005 | Negami et al. |
| 2005/0271796 | A1* | 12/2005 | Neudecker et al. ........... 427/58 |
| 2006/0086384 | A1 | 4/2006 | Nakata |
| 2006/0185714 | A1 | 8/2006 | Nam et al. |

FOREIGN PATENT DOCUMENTS

| | | |
|---|---|---|
| WO | WO 84/04425 | 11/1984 |

OTHER PUBLICATIONS

Brown et al., 1991, "Photovoltaic Manufacturing Technology-Phase I Final Subcontract Report Jan. 9,1991-Apr. 14,1991, " National Renewable Energy Laboratory: 1-57.

Hermann et al., 2006, "Comparative investigation of solar cell thin film processing using nanosecond and femtosecond lasers, " Journal of Physics D: Applied Physics 39: 453-460.

Westin, 2005, "Optimisation of Laser Scribing of Back Contact for Photovoltaic Modules, " Master of Science Programme EIGM of Luleå—Master's Thesis: 1-37.

Wiederman et al., 2002, "CIGS Module Development on Flexible Substrates, " IEEE, Proceedings of 2000 NCPV Program Review Meeting, Apr. 16-19, 2000: 575-578.

Wiederman et al., 2002, "CIGS Processing on Flexible Polyimide Substrates, " Global Solar Energy: 49-50.

Wiederman et al., 1998, "Module Interconnects on Flexible Substrates, " NCPV Photovoltaics Program Review, American Institute of Physics Proceedings of the 15$^{th}$ Conference, Denver Colorado, Sep. 1998: 177.

Website http://ww.agr.gc.ca/prfa/water/solar_e.htm. "Solar Powered Water Pumping Systems for Livestock Watering" from Jul. 1, 2003, available from www.archive.org. 5 pages.

"Tangram Technology Ltd.—Polymer Data File—PMMA" website, http:www.tangram.co.uk/TI-Polymer-PMMA.html from Jan. 12,2002. Available from www.archive.org. 7 pages.

Trupke, T. et al., "Improving solar cell efficiencies by down-conversion of high-energy photons" J. Appl. Phys. 92, 1668-1674. Aug. 2002.

\* cited by examiner

MONOLITHIC INTEGRATION OF CYLINDRICAL SOLAR CELLS

1. FIELD OF THE INVENTION

This invention relates to solar cell assemblies for converting solar energy into electrical energy and more particularly to improved solar cell assemblies.

2. BACKGROUND OF THE INVENTION

Solar cells are typically fabricated as separate physical entities with light gathering surface areas on the order of 4-6 cm$^2$ or larger. For this reason, it is standard practice for power generating applications to mount the cells in a flat array on a supporting substrate or panel so that their light gathering surfaces provide an approximation of a single large light gathering surface. Also, since each cell itself generates only a small amount of power, the required voltage and/or current is realized by interconnecting the cells of the array in a series and/or parallel matrix.

A conventional prior art solar cell structure is shown in FIG. 1. Because of the large range in the thickness of the different layers, they are depicted schematically. Moreover, FIG. 1 is highly schematic so that it represents the features of both "thick-film" solar cells and "thin-film" solar cells. In general, solar cells that use an indirect band gap material to absorb light are typically configured as "thick-film" solar cells because a thick film of the absorber layer is required to absorb a sufficient amount of light. Solar cells that use a direct band gap material to absorb light are typically configured as "thin-film" solar cells because only a thin layer of the direct band-gap material is needed to absorb a sufficient amount of light.

The arrows at the top of FIG. 1 show the source of direct solar illumination on the cell. Layer 102 is the substrate. Glass or metal is a common substrate. In thin-film solar cells, substrate 102 can be a polymer-based backing, metal, or glass. In some instances, there is an encapsulation layer (not shown) coating substrate 102. Layer 104 is the back electrical contact for the solar cell.

Layer 106 is the semiconductor absorber layer. Back electrical contact 104 makes ohmic contact with absorber layer 106. In many but not all cases, absorber layer 106 is a p-type semiconductor. Absorber layer 106 is thick enough to absorb light. Layer 108 is the semiconductor junction partner-that, together with semiconductor absorber layer 106, completes the formation of a p-n junction. A p-n junction is a common type of junction found in solar cells. In p-n junction based solar cells, when semiconductor absorber layer 106 is a p-type doped material, junction partner 108 is an n-type doped material. Conversely, when semiconductor absorber layer 106 is an n-type doped material, junction partner 108 is a p-type doped material. Generally, junction partner 108 is much thinner than absorber layer 106. For example, in some instances junction partner 108 has a thickness of about 0.05 microns. Junction partner 108 is highly transparent to solar radiation. Junction partner 108 is also known as the window layer, since it lets the light pass down to absorber layer 106.

In a typical thick-film solar cell, absorber layer 106 and window layer 108 can be made from the same semiconductor material but have different carrier types (dopants) and/or carrier concentrations in order to give the two layers their distinct p-type and n-type properties. In thin-film solar cells in which copper-indium-gallium-diselenide (CIGS) is the absorber layer 106, the use of CdS to form junction partner 108 has resulted in high efficiency cells. Other materials that can be used for junction partner 108 include, but are not limited to, SnO$_2$, ZnO, ZrO$_2$, and doped ZnO.

Layer 110 is the counter electrode, which completes the functioning cell. Counter electrode 110 is used to draw current away from the junction since junction partner 108 is generally too resistive to serve this function. As such, counter electrode 110 should be highly conductive and transparent to light. Counter electrode 110 can in fact be a comb-like structure of metal printed onto layer 108 rather than forming a discrete layer. Counter electrode 110 is typically a transparent conductive oxide (TCO) such as doped zinc oxide (e.g., aluminum doped zinc oxide), indium-tin-oxide (ITO), tin oxide (SnO$_2$), or indium-zinc oxide. However, even when a TCO layer is present, a bus bar network 114 is typically needed in conventional solar cells to draw off current since the TCO has too much resistance to efficiently perform this function in larger solar cells. Network 114 shortens the distance charge carriers must move in the TCO layer in order to reach the metal contact, thereby reducing resistive losses. The metal bus bars, also termed grid lines, can be made of any reasonably conductive metal such as, for example, silver, steel or aluminum. In the design of network 114, there is design a trade off between thicker grid lines that are more electrically conductive but block more light, and thin grid lines that are less electrically conductive but block less light. The metal bars are preferably configured in a comb-like arrangement to permit light rays through layer 110. Bus bar network layer 114 and layer 110, combined, act as a single metallurgical unit, functionally interfacing with a first ohmic contact to form a current collection circuit. In U.S. Pat. No. 6,548,751 to Sverdrup et al., hereby incorporated by reference herein in its entirety, a combined silver bus bar network and indium-tin-oxide layer function as a single, transparent ITO/Ag layer.

Layer 112 is an antireflective coating that can allow a significant amount of extra light into the cell. Depending on the intended use of the cell, it might be deposited directly on the top conductor as illustrated in FIG. 1. Alternatively or additionally, antireflective coating 112 made be deposited on a separate cover glass that overlays top electrode 110. Ideally, the antireflective coating reduces the reflection of the cell to very near zero over the spectral region in which photoelectric absorption occurs, and at the same time increases the reflection in the other spectral regions to reduce heating. U.S. Pat. No. 6,107,564 to Aguilera et al., hereby incorporated by reference herein in its entirety, describes representative antireflective coatings that are known in the art.

Solar cells typically produce only a small voltage. For example, silicon based solar cells produce a voltage of about 0.6 volts (V). Thus, solar cells are interconnected in series or parallel in order to achieve greater voltages. When connected in series, voltages of individual cells add together while current remains the same. Thus, solar cells arranged in series reduce the amount of current flow through such cells, compared to analogous solar cells arrange in parallel, thereby improving efficiency. As illustrated in FIG. 1, the arrangement of solar cells in series is accomplished using interconnects 116. In general, an interconnect 116 places the first electrode of one solar cell in electrical communication with the counter-electrode of an adjoining solar cell.

As noted above and as illustrated in FIG. 1, conventional solar cells are typically in the form of a plate structure. Although such cells are highly efficient when they are smaller, larger planar solar cells have reduced efficiency because it is harder to make the semiconductor films that form the junction in such solar cells uniform. Furthermore, the occurrence of pinholes and similar flaws increase in larger planar solar cells. These features can cause shunts across the junction. Accordingly, what are needed in the art are improved solar cell designs.

Discussion or citation of a reference herein will not be construed as an admission that such reference is prior art to the present invention.

3. SUMMARY OF THE INVENTION

One aspect of the present invention provides a solar cell unit comprising a substrate and a plurality of photovoltaic cells. The substrate has a first end and a second end. The plurality of photovoltaic cells, which are linearly arranged on the substrate, comprises a first photovoltaic cell and a second photovoltaic cell. Each photovoltaic cell in the plurality of photovoltaic cells comprises (i) a back-electrode circumferentially disposed on the substrate, (ii) a semiconductor junction layer circumferentially disposed on the back-electrode, and, (iii) a transparent conductive layer circumferentially disposed on the semiconductor junction. The transparent conductive layer of the first photovoltaic cell in the plurality of photovoltaic cells is in serial electrical communication with the back-electrode of the second photovoltaic cell in the plurality of photovoltaic cells. In some embodiments, the substrate is either (i) tubular shaped or (ii) a rigid solid rod shaped.

In some embodiments, the plurality of photovoltaic cells comprise (i) a first terminal photovoltaic cell at the first end of the substrate, (ii) a second terminal photovoltaic cell at the second end of said substrate, and (iii) at least one intermediate photovoltaic cell between the first terminal photovoltaic cell and the second photovoltaic cell. The transparent conductive layer of each intermediate photovoltaic cell in the at least one intermediate photovoltaic cell is in serial electrical communication with the back-electrode of an adjacent photovoltaic cell in the plurality of photovoltaic cells. In some embodiments, the adjacent photovoltaic cell is the first terminal photovoltaic cell or the second terminal photovoltaic cell. In some embodiments, the adjacent photovoltaic cell is another intermediate photovoltaic cell. In some embodiments, the plurality of photovoltaic cells comprises three or more photovoltaic cells, ten or more photovoltaic cells, fifty or more photovoltaic cells, or one hundred or more photovoltaic cells.

In some embodiments, a transparent tubular casing, made of plastic or glass, is circumferentially disposed onto the transparent conductive layer of all or a portion of the photovoltaic cells in the plurality of photovoltaic cells. In some embodiments the transparent tubular casing comprises aluminosilicate glass, borosilicate glass, dichroic glass, germanium/semiconductor glass, glass ceramic, silicate/fused silica glass, soda lime glass, quartz glass, chalcogenide/sulphide glass, fluoride glass, flint glass, or cereated glass. In some embodiments, the transparent tubular casing comprises a urethane polymer, an acrylic polymer, a fluoropolymer, a silicone, a silicone gel, an epoxy, a polyamide, or a polyolefin. In some embodiments, the transparent tubular casing comprises polymethylmethacrylate (PMMA), polydimethyl siloxane (PDMS), ethylene vinyl acetate (EVA), perfluoroalkoxy fluorocarbon (PFA), nylon, cross-linked polyethylene (PEX), polypropylene (PP), polyethylene terephtalate glycol (PETG), polytetrafluoroethylene (PTFE), polyvinyl chloride (PVC), or polyvinylidene fluoride (PVDF).

In some embodiments, the substrate comprises plastic, metal or glass. In some embodiments, the substrate comprises a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene. In some embodiments, the substrate comprises aluminosilicate glass, borosilicate glass, dichroic glass, germanium/semiconductor glass, glass ceramic, silicate/fused silica glass, soda lime glass, quartz glass, chalcogenide/sulphide glass, fluoride glass, a glass-based phenolic, flint glass, or cereated glass.

In some embodiments, the substrate is tubular shaped. In some embodiments, a fluid, such as air, nitrogen, water, or helium, is passed through said substrate. In some embodiments, the substrate comprises a solid rod.

In some embodiments, the back-electrode of a photovoltaic cell in the plurality of photovoltaic cells is made of aluminum, molybdenum, tungsten, vanadium, rhodium, niobium, chromium, tantalum, titanium, steel, nickel, platinum, silver, gold, an alloy thereof, or any combination thereof. In some embodiments, the back-electrode of a photovoltaic cell in the plurality of photovoltaic cells is made of indium tin oxide, titanium nitride, tin oxide, fluorine doped tin oxide, doped zinc oxide, aluminum doped zinc oxide, gallium doped zinc oxide, boron dope zinc oxide indium-zinc oxide, a metal-carbon black-filled oxide, a graphite-carbon black-filled oxide, a carbon black-carbon black-filled oxide, a superconductive carbon black-filled oxide, an epoxy, a conductive glass, or a conductive plastic.

In some embodiments, the semiconductor junction of a photovoltaic cell in said plurality of photovoltaic cells comprises a homojunction, a heterojunction, a heteroface junction, a buried homojunction, a p-i-n junction, or a tandem junction. In some embodiments, the transparent conductive layer of a photovoltaic cell in the plurality of photovoltaic cells comprises carbon nanotubes, tin oxide, fluorine doped tin oxide, indium-tin oxide (ITO), doped zinc oxide, aluminum doped zinc oxide, gallium doped zinc oxide, boron dope zinc oxide indium-zinc oxide or any combination thereof or any combination thereof.

In some embodiments, the semiconductor junction of a photovoltaic cell in the plurality of photovoltaic cells comprises an absorber layer and a junction partner layer, where the junction partner layer is circumferentially deposed on the absorber layer. In some embodiments, the absorber layer is copper-indium-gallium-diselenide and the junction partner layer is $In_2Se_3$, $In_2S_3$, ZnS, ZnSe, CdInS, CdZnS, $ZnIn_2Se_4$, $Zn_{1-x}Mg_xO$, CdS, $SnO_2$, ZnO, $ZrO_2$, or doped ZnO. In some embodiments, the plurality of photovoltaic cells further comprises an intrinsic layer circumferentially disposed on the semiconductor junction of the photovoltaic cell and the transparent conductive layer of the photovoltaic cell is disposed on said the intrinsic layer. In some embodiments, the intrinsic layer comprises an undoped transparent oxide such as undoped zinc oxide.

In some embodiments, the solar cell unit further comprises (i) a filler layer that is circumferentially disposed onto the transparent conductive layer of all or a portion of the photovoltaic cells in the plurality of photovoltaic cells, and (ii) a transparent tubular casing that is circumferentially disposed on the filler layer. In some embodiments, the filler layer comprises ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, or a urethane. In some embodiments, the solar cell unit further comprises a water resistant layer that is circumferentially disposed onto the transparent conductive layer of all or a portion of the photovoltaic cells in the plurality of photovoltaic cells as well as a transparent tubular casing that is circumferentially disposed on said water resistant layer. The water resistant layer can be made of, for example, clear silicone, SiN, $SiO_xN_y$, $SiO_x$, or $Al_2O_3$, where x and y are integers.

In some embodiments, the solar cell unit comprises a water resistant layer that is circumferentially disposed onto the transparent conductive layer of all or a portion of the photovoltaic cells in the plurality of photovoltaic cells as well as a transparent tubular casing that is circumferentially disposed on the water resistant layer. In some embodiments, the solar cell unit further comprises a transparent tubular casing that is circumferentially disposed onto the transparent conductive layer of all or a portion of the photovoltaic cells in the plurality of photovoltaic cells as well as an antireflective coating circumferentially disposed on the transparent tubular casing. In some embodiments, the antireflective coating comprises $MgF_2$, silicone nitrate, titanium nitrate, silicon monoxide, or silicone oxide nitrite.

In some embodiments, antireflective coating is circumferentially disposed onto the transparent conductive layer of all or a portion of the photovoltaic cells in the plurality of photovoltaic cells. In some embodiments, this antireflective coating comprises $MgF_2$, silicone nitrate, titanium nitrate, silicon monoxide, or silicone oxide nitrite.

In some embodiments, a length of the solar cell is between 2 centimeters and 300 centimeters, between 2 centimeters and 30 centimeters, or between 30 centimeters and 300 centimeters.

Another aspect of the present invention provides a solar cell assembly comprising a plurality of solar cell units, each solar cell unit in the plurality of solar cell units having the structure of any of the solar cell units described above, such that the solar cell units in the plurality of solar cell units are arranged in coplanar rows to form the solar cell assembly.

Still another aspect of the present invention provides a solar cell assembly comprising (A) a plurality of solar cell units, each solar cell unit in the plurality of solar cell units having the structure of any of the solar cell units described above, and (B) a plurality of internal reflectors. The solar cell units in the plurality of solar cells units are geometrically arranged in a parallel or a near parallel manner thereby forming a planar array having a first face and a second face. Each respective internal reflector in the plurality of internal reflectors is configured between a corresponding first and second solar cell unit in the plurality of elongated solar cells such that a portion of the solar light reflected from the respective internal reflector is reflected onto the corresponding first and second elongated solar cell. In some embodiments, the solar cell assembly further comprises (C) a transparent electrically insulating substrate that covers all or a portion of said first face of said planar array. In some embodiments, the solar assembly still further comprises (D) a transparent insulating covering disposed on the second face of the planar array, thereby encasing the plurality of elongated solar cells between the transparent insulating covering and the transparent electrically insulating substrate. In some embodiments, the transparent insulating covering and the transparent insulating substrate are bonded together by a sealant. In some embodiments, the sealant is ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, or a urethane. In some embodiments, the plurality of elongated solar cells is configured to receive direct light from the first face and the second face of the planar array. In some embodiments, the solar cell assembly further comprises an albedo surface positioned to reflect sunlight into the plurality of solar cell units. In some embodiments, the albedo surface has an albedo that exceeds 80%. In some embodiments, a first solar cell unit and a second solar cell unit in the plurality of solar cell units is electrically arranged in series or parallel.

Still another aspect of the present invention provides a solar cell assembly comprising a plurality of solar cell units, each solar cell unit in the plurality of solar cell units having the structure of any of the solar cell units described above. Solar cell units in the plurality of solar cells units are geometrically arranged in a parallel or a near parallel manner thereby forming a planar array having a first face and a second face. In this aspect of the invention, the solar cell assembly further comprises (i) a transparent electrically insulating substrate that covers all or a portion of the first face of the planar array and (ii) a transparent insulating covering disposed on the second face of the planar array, thereby encasing the plurality of elongated solar cells between the transparent insulating covering and the transparent electrically insulating substrate. In some embodiments, the transparent insulating covering and the transparent insulating substrate are bonded together by a sealant such as, for example, ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, or a urethane.

Yet another aspect of the invention provides a solar cell unit comprising (A) substrates, (B) a first photovoltaic cell, and (C) a second photovoltaic cell. In some embodiments, the substrate is either (i) tubular shaped or (ii) a rigid cylindrical shaped. The first photovoltaic cell comprises a first back-electrode circumferentially disposed on a first portion of the substrate, a first semiconductor junction layer circumferentially disposed on the first back-electrode, and a first transparent conductive layer circumferentially disposed on the first semiconductor junction. The second photovoltaic cell comprises a second back-electrode circumferentially disposed on a second portion of the substrate, a second semiconductor junction layer circumferentially disposed on the second back-electrode, and a second transparent conductive layer circumferentially disposed on the second semiconductor junction. The first photovoltaic cell is adjacent to the second photovoltaic cell, the first transparent conductive layer is in serial electrical communication with the second back-electrode, the first transparent conductive layer is electrically isolated from the second transparent conductive layer, and the first back-electrode is electrically isolated from the second back-electrode.

Still another aspect of the invention provides a solar cell unit comprising (A) a substrate, (B) a first photovoltaic cell, (C) a second photovoltaic cell, (D) an insulative post, and (E) an electrically conductive via. In some embodiments, the substrate is either (i) tubular shaped or (ii) a rigid solid rod shaped. The first photovoltaic cell comprises a first back-electrode circumferentially disposed on a first portion of the substrate, a first semiconductor junction layer circumferentially disposed on the first back-electrode, and a first transparent conductive layer circumferentially disposed on the first semiconductor junction. The second photovoltaic cell comprises a second back-electrode circumferentially disposed on a second portion of the substrate, a second semiconductor junction layer circumferentially disposed on the second back-electrode, and a second transparent conductive layer circumferentially disposed on the second semiconductor junction. The insulative post (i) electrically separates the first back-electrode and the second back-electrode and (ii) electrically separates the first semiconductor junction and the second semiconductor junction. The electrically conductive via electrically connects the first transparent conductive layer with the second back-electrode in series.

Still another aspect of the invention provides a solar cell unit comprising (A) a substrate, (B) a first photovoltaic cell, (C) a second photovoltaic cell, and (D) an insulative post. In some embodiments, the substrate is either (i) tubular shaped or (ii) a rigid solid rod shaped. The first photovoltaic cell comprises a first back-electrode circumferentially disposed on a first portion of the substrate, a first semiconductor junction layer circumferentially disposed on the first back-electrode, and a first transparent conductive layer circumferentially disposed on the first semiconductor junction. The second photovoltaic cell comprises a second back-electrode circumferentially disposed on a second portion of the substrate, a second semiconductor junction layer circumferentially disposed on the second back-electrode, and a second transparent conductive layer circumferentially disposed on the second semiconductor junction. The insulative post (i) electrically separates the first back-electrode and the second back-electrode and (ii) electrically separates the first semiconductor junction and the second semiconductor junction. The first transparent conductive layer is in serial electrical communication with the second back-electrode. The first transparent conductive layer is electrically isolated from the second transparent conductive layer.

Still another aspect of the present invention provides a solar cell unit comprising a substrate, a first photovoltaic cell, a second photovoltaic cell, an insulative post, and an electrically conducting via. In some embodiments, the substrate is either (i) tubular shaped or (ii) a rigid solid rod shaped. The first photovoltaic cell comprises a first back-electrode circumferentially disposed on a first portion of said substrate, a first semiconductor junction layer circumferentially disposed on the first back-electrode, a first transparent conductive layer circumferentially disposed on the first semiconductor junction and an electrical conduit disposed on a portion of the first transparent oxide layer. The second photovoltaic cell comprises a second back-electrode circumferentially disposed on a second portion of the substrate, a second semiconductor junction layer circumferentially disposed on the second back-electrode, and a second transparent conductive layer circumferentially disposed on the second semiconductor junction. The insulative post (i) electrically separates the first back-electrode and the second back-electrode, (ii) electrically separates the first semiconductor junction and the second semiconductor junction, and (iii) electrically separates the first transparent conductive layer and the second transparent conductive layer. The electrically conductive via electrically connects the electrical conduit with the second back-electrode in series.

4. BRIEF DESCRIPTION OF THE DRAWINGS

Like reference numerals refer to corresponding parts throughout the several views of the drawings. Dimensions are not drawn to scale.

5. DETAILED DESCRIPTION

Disclosed herein are solar cell units comprising a plurality of photovoltaic cells linearly arranged on a substrate in a monolithically integrated manner.

5.1 Basic Structure

Figure 7:
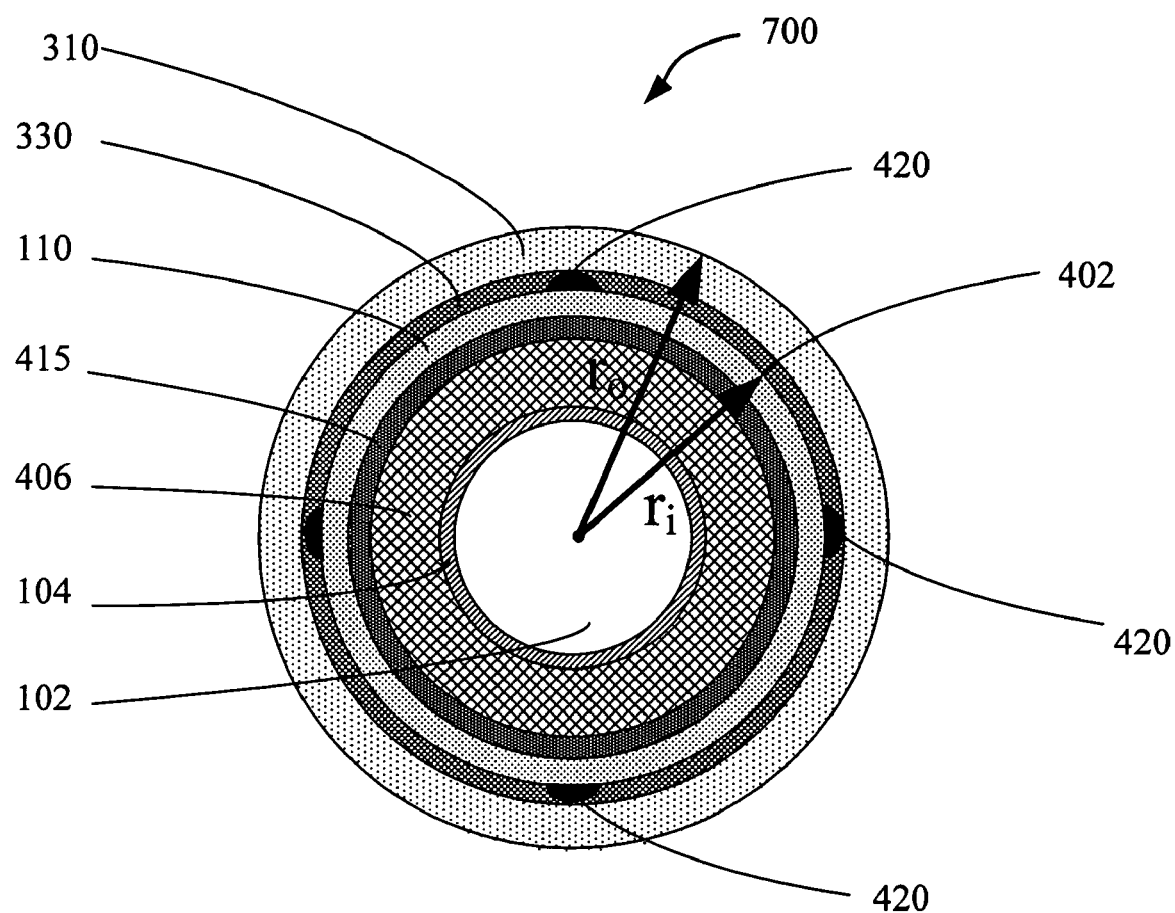
FIG. 7 is a cross-sectional view of a photovoltaic cell in accordance with an embodiment of the present invention.

FIG. 7 illustrates the cross-sectional view of an exemplary embodiment of a photovoltaic cell 700. In some embodiments, a solar cell unit comprises a plurality of photovoltaic cells 700 linearly arranged on substrate in a monolithically integrated manner. In some embodiments, the substrate is either (i) tubular shaped or (ii) a rigid solid rod shaped. In some embodiments the substrate is flexible tubular shaped.

Substrate 102. A substrate 102 serves as a substrate for the solar cell unit. In some embodiments, substrate 102 is either (i) tubular shaped or (ii) a rigid solid rod shaped. In some embodiments substrate 102 is any solid cylindrical shape or hollowed cylindrical shape. When substrate 102 is tubular shaped it can be either rigid or flexible. For example, in some embodiments substrate 102 is a hollow flexible fiber. In some embodiments, substrate 102 is a rigid tube made out plastic metal or glass. In some embodiments, substrate 102 is made of a plastic, metal, metal alloy, or glass. In some embodiments, substrate 102 is made of a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene. In some embodiments, substrate 102 is made of aluminosilicate glass, borosilicate glass, dichroic glass, germanium/semiconductor glass, glass ceramic, silicate/fused silica glass, soda lime glass, quartz glass, chalcogenide/sulphide glass, fluoride glass, a glass-based phenolic, flint glass, or cereated glass.

In some embodiments, substrate 102 is made of a material such as polybenzamidazole (e.g., Celazole®, available from Boedeker Plastics, Inc., Shiner, Texas). In some embodiments, the inner core is made of polymide (e.g., DuPont™ Vespel®, or DuPont™ Kapton®, Wilmington, Del.). In some embodiments, substrate 102 is made of polytetrafluoroethylene (PTFE) or polyetheretherketone (PEEK), each of which is available from Boedeker Plastics, Inc. In some embodiments, substrate 102 is made of polyamide-imide (e.g., Torlon® PAI, Solvay Advanced Polymers, Alpharetta, Ga.).

In some embodiments, substrate 102 is made of a glass-based phenolic. Phenolic laminates are made by applying heat and pressure to layers of paper, canvas, linen or glass cloth impregnated with synthetic thermosetting resins. When heat and pressure are applied to the layers, a chemical reaction (polymerization) transforms the separate layers into a single laminated material with a "set" shape that cannot be softened again. Therefore, these materials are called "thermosets." A variety of resin types and cloth materials can be used to manufacture thermoset laminates with a range of mechanical, thermal, and electrical properties. In some embodiments, the inner core is a phenoloic laminate having a NEMA grade of G-3, G-5, G-7, G-9, G-10 or G-11. Exemplary phenolic laminates are available from Boedeker Plastics, Inc.

In some embodiments, substrate 102 is made of polystyrene. Examples of polystyrene include general purpose polystyrene and high impact polystyrene as detailed in Marks' *Standard Handbook for Mechanical Engineers*, ninth edition, 1987, McGraw-Hill, Inc., p. 6-174, which is hereby incorporated by reference herein in its entirety. In still other embodiments, substrate 102 is made of cross-linked polystyrene. One example of cross-linked polystyrene is Rexolite® (available from San Diego Plastics Inc., National City, Calif.). Rexolite is a thermoset, in particular a rigid and translucent plastic produced by cross linking polystyrene with divinylbenzene.

In some embodiments, substrate 102 is a polyester wire (e.g., a Mylar® wire). Mylar® is available from DuPont Teijin Films (Wilmington, Del.). In still other embodiments, substrate 102 is made of Durastone®, which is made by using polyester, vinylester, epoxid and modified epoxy resins combined with glass fibers (Roechling Engineering Plastic Pte Ltd., Singapore.

In still other embodiments, substrate 102 is made of polycarbonate. Such polycarbonates can have varying amounts of glass fibers (e.g., 10%, 20%, 30%, or 40%) in order to adjust tensile strength, stiffness, compressive strength, as well as the thermal expansion coefficient of the material. Exemplary polycarbonates are Zelux® M and Zelux® W, which are available from Boedeker Plastics, Inc.

In some embodiments, substrate 102 is made of polyethylene. In some embodiments, substrate 102 is made of low density polyethylene (LDPE), high density polyethylene (HDPE), or ultra high molecular weight polyethylene (UHMW PE). Chemical properties of HDPE are described in Marks' *Standard Handbook for Mechanical Engineers*, ninth edition, 1987, McGraw-Hill, Inc., p. 6-173, which is hereby incorporated by reference herein in its entirety. In some embodiments, substrate 102 is made of acrylonitrile-butadiene-styrene, polytetrfluoro-ethylene (Teflon), polymethacrylate (lucite or plexiglass), nylon 6,6, cellulose acetate butyrate, cellulose acetate, rigid vinyl, plasticized vinyl, or polypropylene. Chemical properties of these materials are described in Marks' *Standard Handbook for Mechanical Engineers*, ninth edition, 1987, McGraw-Hill, Inc., pp. 6-172 through 6-175, which is hereby incorporated by reference in its entirety.

Additional exemplary materials that can be used to form the inner core are found in *Modern Plastics Encyclopedia*, McGraw-Hill; Reinhold Plastics Applications Series, Reinhold Roff, *Fibres, Plastics and Rubbers*, Butterworth; Lee and Neville, *Epoxy Resins*, McGraw-Hill; Bilmetyer, *Textbook of Polymer Science*, Interscience; Schmidt and Marlies, *Principles of high polymer theory and practice*, McGraw-Hill; Beadle (ed.), Plastics, Morgan-Grampiand, Ltd., 2 vols. 1970; Tobolsky and Mark (eds.), *Polymer Science and Materials*, Wiley, 1971; Glanville, *The Plastics's Engineer's Data Book*, Industrial Press, 1971; Mohr (editor and senior author), Oleesky, Shook, and Meyers, SPI *Handbook of Technology and Engineering of Reinforced Plastics Composites*, Van Nostrand Reinhold, 1973, each of which is hereby incorporated by reference herein in its entirety.

Back-electrode 104. A back-electrode 104 is circumferentially disposed on substrate 102. Back-electrode 104 serves as the first electrode in the assembly. In general, back-electrode 104 is made out of any material such that it can support the photovoltaic current generated by photovoltaic cell 700 with negligible resistive losses. In some embodiments, back-electrode 104 is composed of any conductive material, such as aluminum, molybdenum, tungsten, vanadium, rhodium, niobium, chromium, tantalum, titanium, steel, nickel, platinum, silver, gold, an alloy thereof, or any combination thereof. In some embodiments, back-electrode 104 is composed of any conductive material, such as indium tin oxide, titanium nitride, tin oxide, fluorine doped tin oxide, doped zinc oxide, aluminum doped zinc oxide, gallium doped zinc oxide, boron dope zinc oxide indium-zinc oxide, a metal-carbon black-filled oxide, a graphite-carbon black-filled oxide, a carbon black-carbon black-filled oxide, a superconductive carbon black-filled oxide, an epoxy, a conductive glass, or a conductive plastic. As defined herein, a conductive plastic is one that, through compounding techniques, contains conductive fillers which, in turn, impart their econductive properties to the plastic. In some embodiments, the conductive plastics used in the present invention to form back-electrode 104 contain fillers that form sufficient conductive current-carrying paths through the plastic matrix to support the photovoltaic current generated by solar cell unit 300 with negligible resistive losses. The plastic matrix of the conductive plastic is typically insulating, but the composite produced exhibits the conductive properties of the filler.

Semiconductor junction 406. A semiconductor junction 406 is formed around back-electrode 104. Semiconductor junction 406 is any photovoltaic homojunction, heterojunction, heteroface junction, buried homojunction, a p-i-n junction or a tandem junction having an absorber layer 106 that is a direct band-gap absorber (e.g., crystalline silicon) or an indirect band-gap absorber (e.g., amorphous silicon). Such junctions are described in Chapter 1 of Bube, *Photovoltaic Materials*, 1998, Imperial College Press, London, as well as Lugue and Hegedus, 2003, *Handbook of Photovoltaic Science and Engineering*, John Wiley & Sons, Ltd., West Sussex, England, each of which is hereby incorporated by reference in its entirety. Details of exemplary types of semiconductors junctions 406 in accordance with the present invention are disclosed in Section 5.2, below. In addition to the exemplary junctions disclosed in Section 5.2, below, junctions 406 can be multijunctions in which light traverses into the core of junction 406 through multiple junctions that, preferably, have successfully smaller band gaps.

In some embodiments, the semiconductor junction comprises an absorber layer 106 and a junction partner layer 108, wherein the junction partner layer 108 is circumferentially disposed on the absorber layer 106. In some embodiments, the absorber layer is copper-indium-gallium-diselenide and junction partner layer 108 is $In_2Se_3$, $In_2S_3$, ZnS, ZnSe, CdlnS, CdZnS, ZnIn$_2$Se$_4$, Zn$_{1-x}$Mg$_x$O, CdS, SnO$_2$, ZnO, ZrO$_2$, or doped ZnO. In some embodiments, absorber layer 108 is between 0.5 μm and 2.0 μm thick. In some embodiments a composition ratio of Cu/(In +Ga) in absorber layer 108 is between 0.7 and 0.95. In some embodiments, a composition ratio of Ga/(In +Ga) in absorber layer 108 is between 0.2 and 0.4. In some embodiments, absorber layer 108 comprises CIGS having a <110> crystallographic orientation, a <112> crystallographic orientation, or CIGS that is randomly oriented.

Optional intrinsic layer 415. Optionally, there is a thin intrinsic layer (i-layer) 415 circumferentially coating semiconductor junction 406. The i-layer 415 can be formed using any undoped transparent oxide including, but not limited to, zinc oxide, metal oxide, or any transparent material that is highly insulating. In some embodiments, i-layer 415 is highly pure zinc oxide.

Transparent conductive layer 110. A transparent conductive layer 110 is circumferentially deposed on the semiconductor junction layers 406 thereby completing the circuit. As noted above, in some embodiments, a thin i-layer 415 is circumferentially deposed on semiconductor junction 406. In such embodiments, transparent conductive layer 110 is circumferentially deposed on i-layer 415. In some embodiments, transparent conductive layer 110 is made of carbon nanotubes, tin oxide SnO$_x$ (with or without fluorine doping), indium-tin oxide (ITO), doped zinc oxide (e.g., aluminum doped zinc oxide), indium-zinc oxide, doped zinc oxide, aluminum doped zinc oxide, gallium doped zinc oxide, boron dope zinc oxide, or any combination thereof. Carbon nanotubes are commercially available, for example from Eikos (Franklin, Mass.) and are described in U.S. Pat. No. 6,988,925, which is hereby incorporated by reference herein in its entirety. In some embodiments, transparent conductive layer 110 is either p-doped or n-doped. For example, in embodiments where the outer semiconductor layer of junction 406 is p-doped, transparent conductive layer 110 can be p-doped. Likewise, in embodiments where the outer semiconductor layer of junction 406 is n-doped, transparent conductive layer 110 can be n-doped. In general, transparent conductive layer 110 is preferably made of a material that has very low resistance, suitable optical transmission properties (e.g., greater than 90%), and a deposition temperature that will not damage underlying layers of semiconductor junction 406 and/or optional i-layer 415. In some embodiments, transparent conductive layer 110 is an electrically conductive polymer material such as a conductive polytiophene, a conductive polyaniline, a conductive polypyrrole, a PSS-doped PEDOT (e.g., Bayrton), or a derivative of any of the foregoing. In some embodiments, transparent conductive layer 110 comprises more than one layer, including a first layer comprising tin oxide SnO$_x$ (with or without fluorine doping), indium-tin oxide (ITO), indium-zinc oxide, doped zinc oxide (e.g., aluminum doped zinc oxide) or a combination thereof and a second layer comprising a conductive polytiophene, a conductive polyaniline, a conductive polypyrrole, a PSS-doped PEDOT (e.g., Bayrton), or a derivative of any of the foregoing. Additional suitable materials that can be used to form transparent conductive layer 110 are disclosed in United States Patent publication 2004/0187917A1 to Pichler, which is hereby incorporated by reference herein in its entirety.

Optional electrode strips 420. In some embodiments in accordance with the present invention, counter-electrode strips or leads 420 are disposed on transparent conductive layer 110 in order to facilitate electrical current flow. In some embodiments, electrode strips 420 are thin strips of electrically conducting material that run lengthwise along the long axis (cylindrical axis) of the elongated solar cell. In some embodiments, optional electrode strips are positioned at spaced intervals on the surface of transparent conductive layer 110. For instance, in FIG. 7, electrode strips 420 run parallel to each other and are spaced out at ninety degree intervals along the cylindrical axis of the solar cell. In some embodiments, electrode strips 420 are spaced out at five degree, ten degree, fifteen degree, twenty degree, thirty degree, forty degree, fifty degree, sixty degree, ninety degree or 180 degree intervals on the surface of transparent conductive layer 110. In some embodiments, there is a single electrode strip 420 on the surface of transparent conductive layer 110. In some embodiments, there is no electrode strip 420 on the surface of transparent conductive layer 110. In some embodiments, there is two, three, four, five, six, seven, eight, nine, ten, eleven, twelve, fifteen or more, or thirty or more electrode strips on transparent conductive layer 110, all running parallel, or near parallel, to each down the long (cylindrical) axis of the solar cell. In some embodiments electrode strips 420 are evenly spaced about the circumference of transparent conductive layer 110, for example, as depicted in FIG. 7. In alternative embodiments, electrode strips 420 are not evenly spaced about the circumference of transparent conductive layer 110. In some embodiments, electrode strips 420 are only on one face of solar cell 700. Elements 102, 104, 406, 415 (optional), and 110 of FIG. 7 collectively comprise solar cell 402 of FIG. 7. In some embodiments, electrode strips 420 are made of conductive epoxy, conductive ink, copper or an alloy thereof, aluminum or an alloy thereof, nickel or an alloy thereof, silver or an alloy thereof, gold or an alloy thereof, a conductive glue, or a conductive plastic.

In some embodiments, there are electrode strips that run along the long (cylindrical) axis of the solar cell and these electrode strips are interconnected to each other by grid lines. These grid lines can be thicker than, thinner than, or the same width as the electrode strips. These grid lines can be made of the same or different electrically material as the electrode strips.

Optional filler layer 330. The addition of counter-electrode strips or leads 420 often renders the shape of the circular solar cells irregular. Care is taken to exclude air from the solar cell unit to avoid oxidation. Accordingly, in some embodiments of the present invention, as depicted in FIG. 7, a filler layer 330 of sealant such as ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, and/or a urethaneis coated over transparent conductive layer 110 to seal out air and, optionally, to provide complementary fitting to a transparent tubular casing 310. In some embodiments, filler layer 330 is a Q-type silicone, a silsequioxane, a D-type silicon, or an M-type silicon. However, in some embodiments, optional filler layer 330 is not needed even when one or more electrode strips 420 are present. Additional suitable materials for optional filler layer are described in copending U.S. patent application Ser. No. 11/378,847, entitled "Elongated Photovoltaic Solar Cells in Tubular Casings," filed Mar. 18, 2006, which is hereby incorporated herein by reference in its entirety.

Optional transparent tubular casing 310. In some embodiments that do not have an optional filler layer 330, transparent tubular casing 310 is circumferentially disposed on transparent conductive layer 110. In some embodiments that do have a filler layer 330, transparent tubular casing 310 is circumferentially disposed on optional filler layer 330. In some embodiments tubular casing 310 is made of plastic or glass. In some embodiments, solar cells 402, after being properly modified for future packaging as described below, are sealed in transparent tubular casing 310. As shown in FIG. 7, transparent tubular casing 310 fits over the outermost layer of solar cell 402. Methods, such as heat shrinking, injection molding, or vacuum loading, can be used to construct transparent tubular casing 310 such that they exclude oxygen and water from the system as well as to provide complementary fitting to underlying solar cells 402.

In some embodiments, transparent tubular casing 310 is made of aluminosilicate glass, borosilicate glass, dichroic glass, germanium/semiconductor glass, glass ceramic, silicate/fused silica glass, soda lime glass, quartz glass, chalcogenide/sulphide glass, fluoride glass, flint glass, or cereated glass. In some embodiments, transparent tubular casing 310 is made of a urethane polymer, an acrylic polymer, a fluoropolymer, a silicone, a silicone gel, an epoxy, a polyamide, or a polyolefin.

In some embodiments, transparent tubular casing 310 is made of a urethane polymer, an acrylic polymer, polymethylmethacrylate (PMMA), a fluoropolymer, silicone, polydimethyl siloxane (PDMS), silicone gel, epoxy, ethylene vinyl acetate (EVA), perfluoroalkoxy fluorocarbon (PFA), nylon/polyamide, cross-linked polyethylene (PEX), polyolefin, polypropylene (PP), polyethylene terephtalate glycol (PETG), polytetrafluoroethylene (PTFE), thermoplastic copolymer (for example, ETFE®, which is a derived from the polymerization of ethylene and tetrafluoroethylene: TEFLON® monomers), polyurethane/urethane, polyvinyl chloride (PVC), polyvinylidene fluoride (PVDF), Tygon®, vinyl, Viton®, or any combination or variation thereof. Additional suitable materials for optional filler layer 330 are disclosed in copending U.S. patent application Ser. No. 11/378.847, entitled "Elongated Photovoltaic Solar Cells in Tubular Casing," filed Mar. 18, 2006, which is hereby incorporated herein by reference in its entirety.

In some embodiments, transparent tubular casing 310 comprises a plurality of transparent tubular casing layers. In some embodiments, each transparent tubular casing is composed of a different material. For example, in some embodiments, transparent tubular casing 310 comprises a first transparent tubular casing layer and a second transparent tubular casing layer. Depending on the exact configuration of the solar cell, the first transparent tubular casing layer is disposed on transparent conductive layer 110, optional filler layer 330 or the water resistant layer. The second transparent tubular casing layer is disposed on the first transparent tubular casing layer.

In some embodiments, each transparent tubular casing layer has different properties. In one example, the outer transparent tubular casing layer has excellent UV shielding properties whereas the inner transparent tubular casing layer has good water proofing characteristics. Moreover, the use of multiple transparent tubular casing layers can be used to reduce costs and/or improve the overall properties of transparent tubular casing 310. For example, one transparent tubular casing layer may be made of an expensive material that has a desired physical property. By using one or more additional transparent tubular casing layers, the thickness of the expensive transparent tubular casing layer may be reduced, thereby achieving a savings in material costs. In another example, one transparent tubular casing layer may have excellent optical properties (e.g., index of refraction, etc.) but be very heavy. By using one or more additional transparent tubular casing layers, the thickness of the heavy transparent tubular casing layer may be reduced, thereby reducing the overall weight of transparent tubular casing 310.

Optional water resistant layer. In some embodiments, one or more water resistant layers are coated over solar cell 402 to prevent the damaging effects of water molecules. In some embodiments, such water resistant layers are circumferentially coated onto transparent conductive layer 110 prior to depositing optional filler layer 330 and optionally encasing solar cell 402 in transparent tubular casing 310. In some embodiments, such water resistant layers are circumferentially coated onto optional filler layer 330 prior optionally encasing the solar cell 402 in transparent tubular casing 310. In some embodiments, such water resistant layers are circumferentially coated onto transparent tubular casing 310 itself. In embodiments, where a water resistant layer is provided to seal molecular water from solar cell 402, it is important that the optical properties of the water resistant layer not interfere with the absorption of incident solar radiation by solar cell 402. In some embodiments, the water resistant layer is made of clear silicone. For example, in some embodiments, the water resistant layer is made of a Q-type silicone, a silsequioxane, a D-type silicon, or an M-type silicon. In some embodiments, the water resistant layer is made of clear silicone, SiN, $SiO_xN_y$, $SiO_x$, or $Al_2O_3$, where x and y are integers.

Optional antireflective coating. In some embodiments, an optional antireflective coating is also circumferentially deposed on solar cell 402 to maximize solar cell efficiency. In some embodiments, there is a both a water resistant layer and an antireflective coating deposed on solar cell 402. In some embodiments, a single layer serves the dual purpose of a water resistant layer and an anti-reflective coating. In some embodiments, antireflective coating, made of $MgF_2$, silicone nitrate, titanium nitrate, silicon monoxide, or silicone oxide nitrite. In some embodiments, there is more than one layer of antireflective coating. In some embodiments, there is more than one layer of antireflective coating and each layer is made of the same material. In some embodiments, there is more than one layer of antireflective coating and each layer is made of a different material.

Optional fluorescent material. In some embodiments, a fluorescent material (e.g., luminescent material, phosphorescent material) is coated on a surface of a layer of solar cell unit 270. In some embodiments, solar cell unit 270 includes a transparent tubular casing 310 and the fluorescent material is coated on the luminal surface and/or the exterior surface of the transparent tubular casing 310. In some embodiments, the fluorescent material is coated on the outside surface of the transparent conductive oxide. In some embodiments, solar cell unit 270 includes a transparent tubular casing 310 and optional filler layer 300 and the fluorescent material is coated on the optional filler layer. In some embodiments, solar cell unit 270 includes a water resistant layer and the fluorescent material is coated on the water resistant layer. In some embodiments, more than one surface of a solar cell unit 270 is coated with optional fluorescent material. In some embodiments, the fluorescent material absorbs blue and/or ultraviolet light, which some semiconductor junctions 406 of the present invention do not use to convert to electricity, and the fluorescent material emits light in visible and/or infrared light which is useful for electrical generation in some solar cell units 270 of the present invention.

Fluorescent, luminescent, or phosphorescent materials can absorb light in the blue or UV range and emit the visible light. Phosphorescent materials, or phosphors, usually comprise a suitable host material and an activator material. The host materials are typically oxides, sulfides, selenides, halides or silicates of zinc, cadmium, manganese, aluminum, silicon, or various rare earth metals. The activators are added to prolong the emission time.

In some embodiments, phosphorescent materials are incorporated in the systems and methods of the present invention to enhance light absorption by solar cell unit 270. In some embodiments, the phosphorescent material is directly added to the material used to make optional transparent tubular casing 310. In some embodiments, the phosphorescent materials are mixed with a binder for use as transparent paints to coat various outer or inner layers of each solar cell 700 in the solar cell unit 270, as described above.

Exemplary phosphors include, but are not limited to, copper-activated zinc sulfide (ZnS:Cu) and silver-activated zinc sulfide (ZnS:Ag). Other exemplary phosphorescent materials include, but are not limited to, zinc sulfide and cadmium sulfide (ZnS:CdS), strontium aluminate activated by europium ($SrAlO_3$:Eu), strontium titanium activated by praseodymium and aluminum (SrTiO3:Pr, Al), calcium sulfide with strontium sulfide with bismuth ((Ca,Sr)S:Bi), copper and magnesium activated zinc sulfide (ZnS:Cu,Mg), or any combination thereof.

Methods for creating phosphor materials are known in the art. For example, methods of making ZnS:Cu or other related phosphorescent materials are described in U.S. Pat. Nos. 2,807,587 to Butler et al.; 3,031,415 to Morrison et al.; 3,031,416 to Morrison et al.; 3,152,995 to Strock; 3,154,712 to Payne; 3,222,214 to Lagos et al.; 3,657,142 to Poss; 4,859,361 to Reilly et al., and 5,269,966 to Karam et al., each of which is hereby incorporated by reference herein in its entirety. Methods for making ZnS:Ag or related phosphorescent materials are described in U.S. Pat. Nos. 6,200, 497 to Park et al., 6,025,675 to Ihara et al.; 4,804,882 to Takahara et al., and 4,512,912 to Matsuda et al., each of which is hereby incorporated herein by reference in its entirety. Generally, the persistence of the phosphor increases as the wavelength decreases. In some embodiments, quantum dots of CdSe or similar phosphorescent material can be used to get the same effects. See Dabbousi et al., 1995, "Electroluminescence from CdSe quantum-dot/polymer composites," Applied Physics Letters 66 (11): 1316-1318; Dabbousi et al., 1997 "(CdSe)ZnS Core-Shell Quantum Dots: Synthesis and Characterization of a Size Series of Highly Luminescent Nanocrystallites," J. Phys. Chem. B, 101: 9463-9475; Ebenstein et al., 2002, "Fluorescence quantum yield of CdSe:ZnS nanocrystals investigated by correlated atomic-force and single-particle fluorescence microscopy," Applied Physics Letters 80: 4033-4035; and Peng et al., 2000, "Shape control of CdSe nanocrystals," Nature 404: 59-61; each of which is hereby incorporated by reference herein in its entirety.

In some embodiments, optical brighteners are used in the optional fluorescent layers of the present invention. Optical brighteners (also known as optical brightening agents, fluorescent brightening agents or fluorescent whitening agents) are dyes that absorb light in the ultraviolet and violet region of the electromagnetic spectrum, and re-emit light in the blue region. Such compounds include stilbenes (e.g., trans-1,2-diphenylethylene or (E)-1,2-diphenylethene). Another exemplary optical brightener that can be used in the optional fluorescent layers of the present invention is umbelliferone (7-hydroxycoumarin), which also absorbs energy in the UV portion of the spectrum. This energy is then re-emitted in the blue portion of the visible spectrum. More information on optical brighteners is in Dean, 1963, *Naturally Occurring Oxygen Ring Compounds*, Butterworths, London; Joule and Mills, 2000, *Heterocyclic Chemistry*, $4^{th}$ edition, Blackwell Science, Oxford, United Kingdom; and Barton, 1999, *Comprehensive Natural Products Chemistry* 2: 677, Nakanishi and Meth-Cohn eds., Elsevier, Oxford, United Kingdom, 1999.

Circumferentially disposed. In the present invention, layers of material are successively circumferentially disposed on a tubular substrate in order to form a solar cell. As used herein, the term circumferentially disposed is not intended to imply that each such layer of material is necessarily deposited on an underlying layer. In fact, the present invention teaches methods by which such some such layers can be molded or otherwise formed on an underlying layer. Nevertheless, the term circumferentially disposed means that an overlying layer is disposed on an underlying layer such that there is no annular space between the overlying layer and the underlying layer. Furthermore, as used herein, the term circumferentially disposed means that an overlying layer is disposed on at least fifty percent of the perimeter of the underlying layer. Furthermore, as used herein, the term circumferentially disposed means that an overlying layer is disposed along at least half of the length of the underlying layer.

Circumferentially sealed. In the present invention, the term circumferentially sealed is not intended to imply that an overlying layer or structure is necessarily deposited on an underlying layer or structure. In fact, the present invention teaches methods by which such layers or structures (e.g., transparent tubular casing 310) are molded or otherwise formed on an underlying layer or structure. Nevertheless, the term circumferentially sealed means that an overlying layer or structure is disposed on an underlying layer or structure such that there is no annular space between the overlying layer or structure and the underlying layer or structure. Furthermore, as used herein, the term circumferentially sealed means that an overlying layer is disposed on the full perimeter of the underlying layer. In typical embodiments, a layer or structure circumferentially seals an underlying layer or structure when it is circumferentially disposed around the full perimeter of the underlying layer or structure and along the full length of the underlying layer or structure. However, the present invention contemplates embodiments in which a circumferentially sealing layer or structure does not extend along the full length of an underlying layer or structure.

5.1.1 Manufacture of Monolithic Solar Cells on a Substrates Using a Cascade Technique FIGS. 2A-2K illustrate processing steps for manufacturing a solar cell unit 270 using a cascading technique. Each illustration in FIG. 2 shows the three-dimensional tubular profile of the solar cell unit 270 in various stages of manufacture. Below each three-dimensional tubular profile is a corresponding one-dimensional profile of the solar cell unit 270. What is shown in the one-dimensional profile is a cross-sectional view of one hemisphere of the corresponding solar cell unit 270. In typical embodiments, the solar cell unit 270 illustrated in FIG. 2 does not have an electrically conducting substrate 102. In the alternative, in embodiments where substrate 102 is electrically conducting, the substrate is circumferentially wrapped with an insulator layer so that back-electrode 104 of individual solar cells 700 are electrically isolated from each other.

Figure 1:
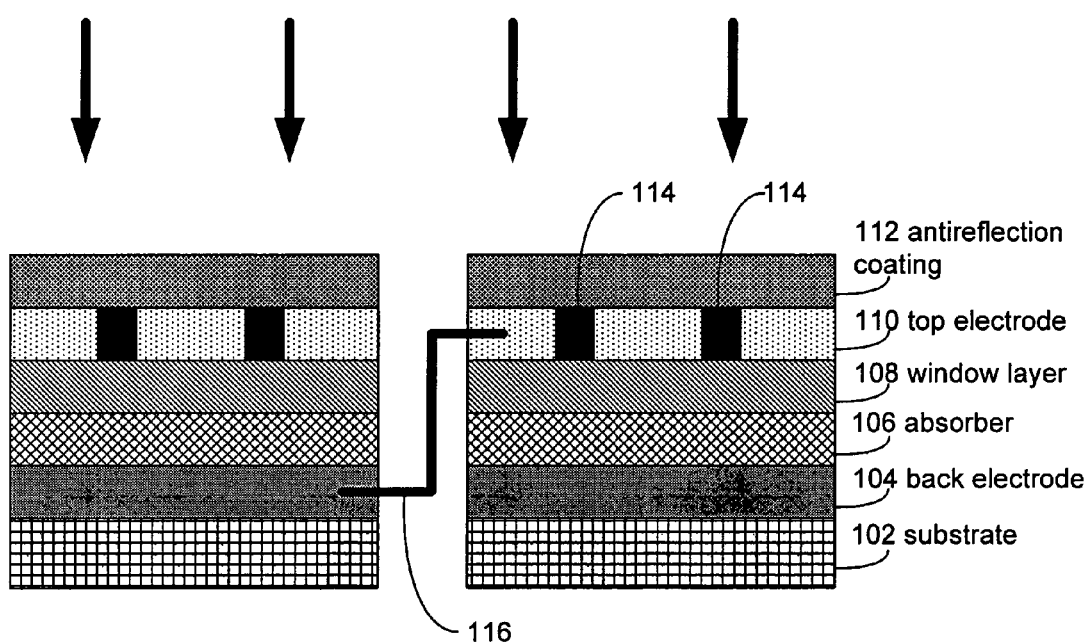
FIG. 1 illustrates interconnected solar cells in accordance with the prior art.
Figure 2A:
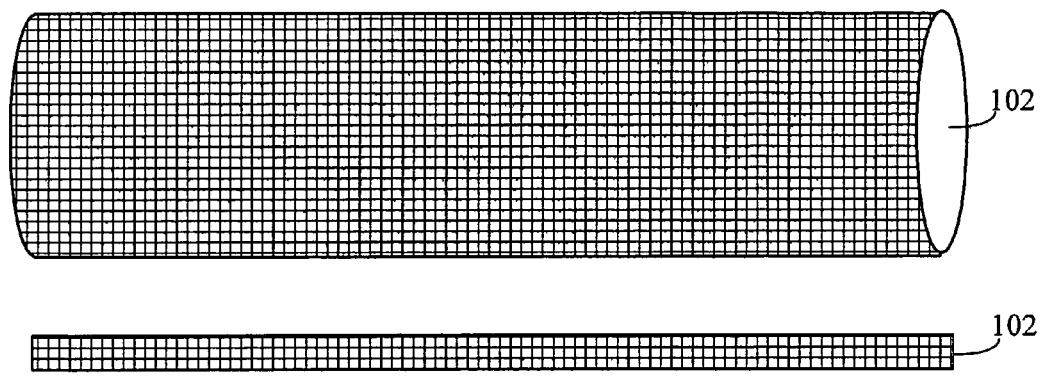
FIGS. 2A-2K illustrate processing steps for manufacturing a solar cell unit having a substrate using a cascade technique in accordance with the present invention.
Figure 2B:
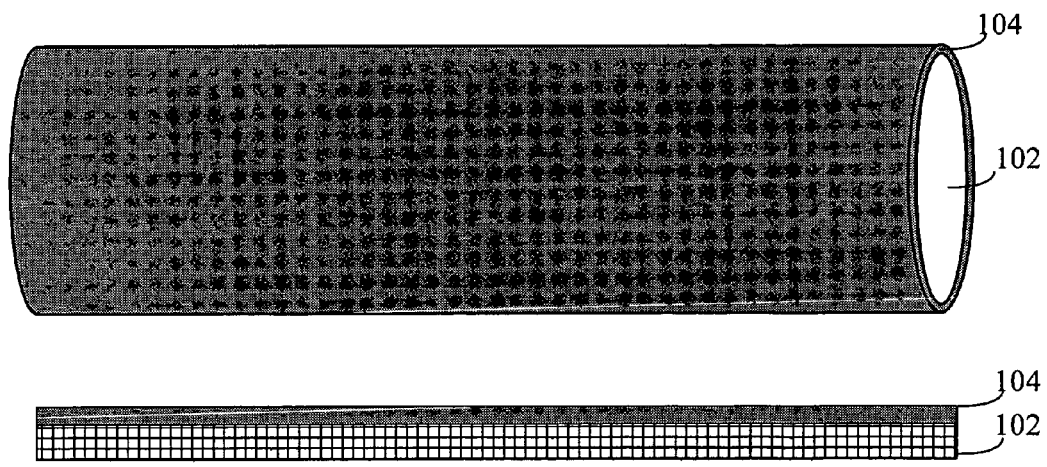
Figure 2C:
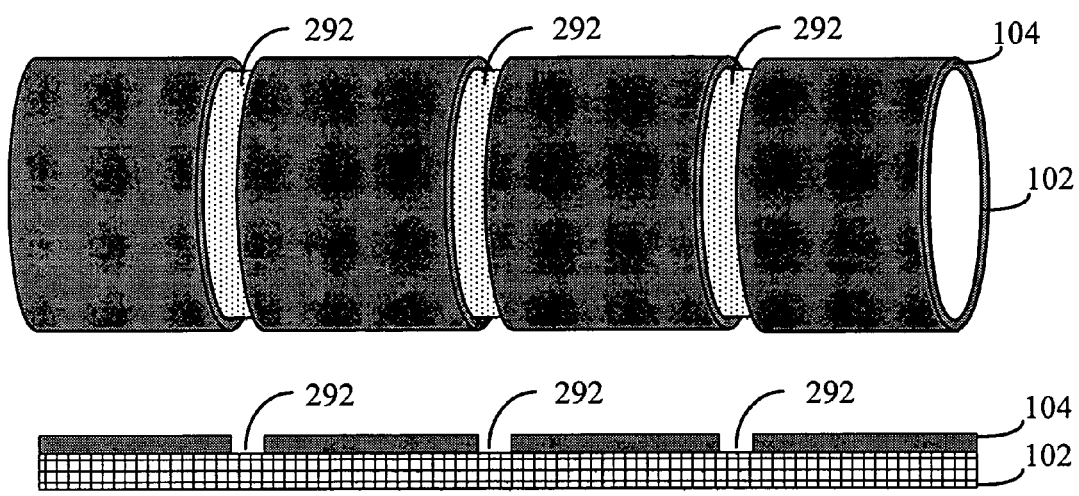
Figure 2D:
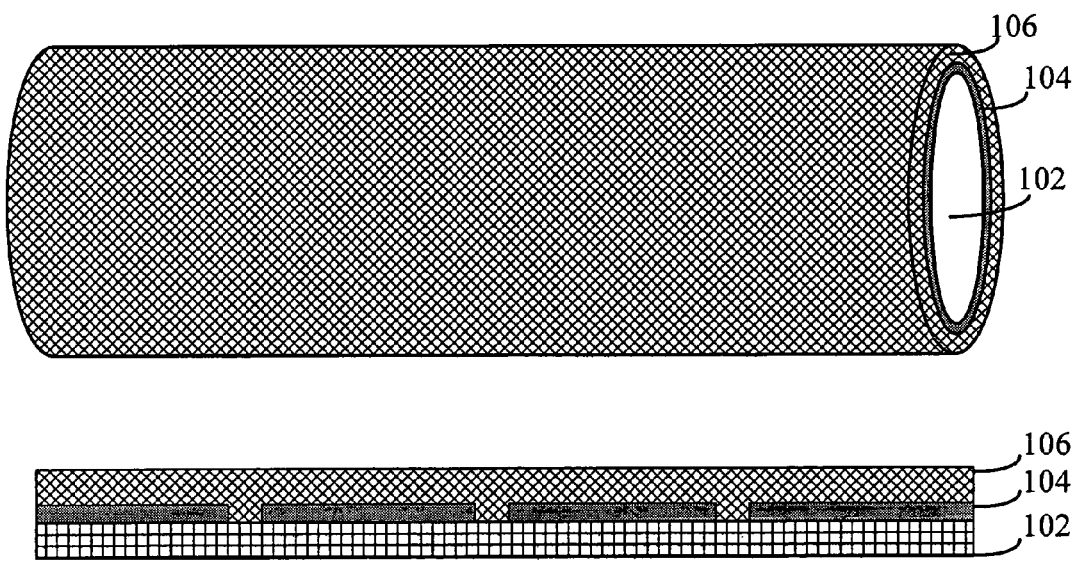
Figure 2E:
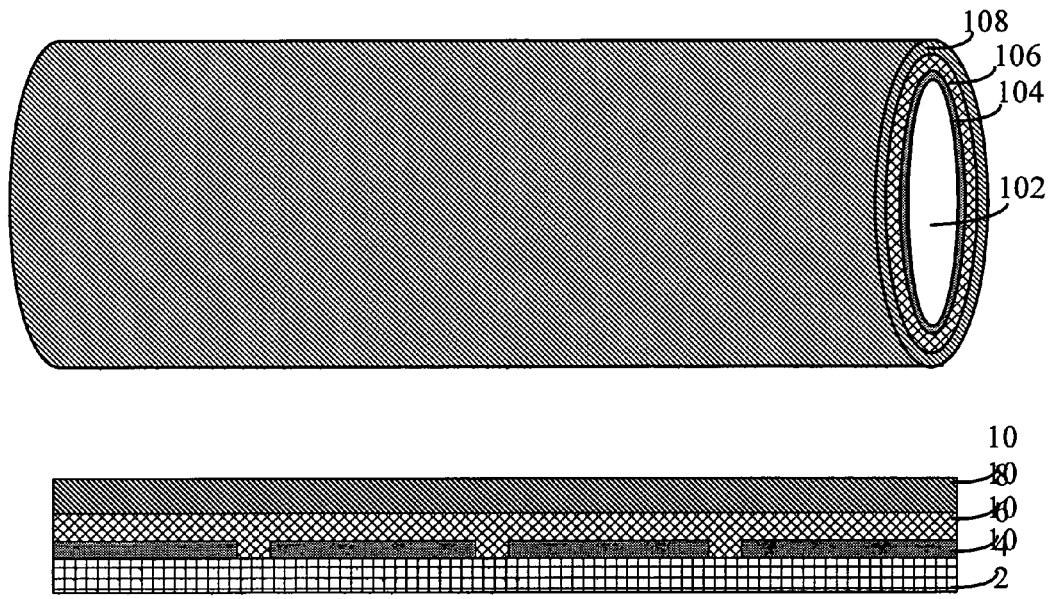
Figure 2F:
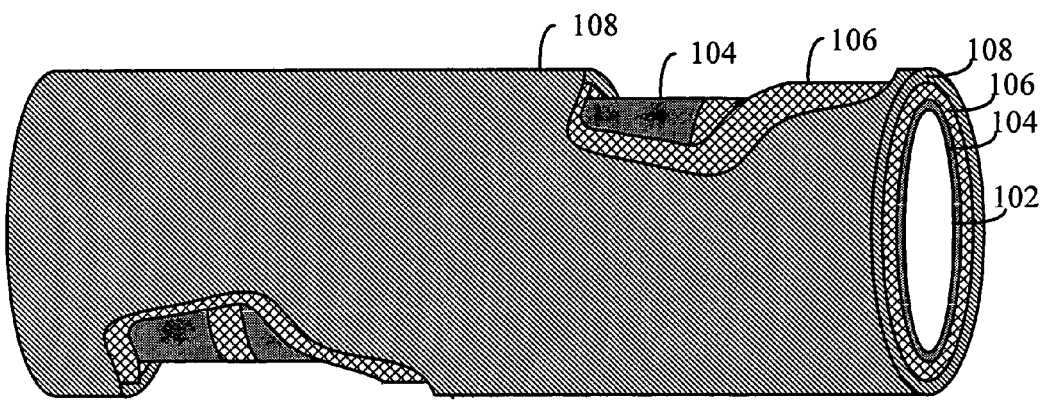
Figure 2G:
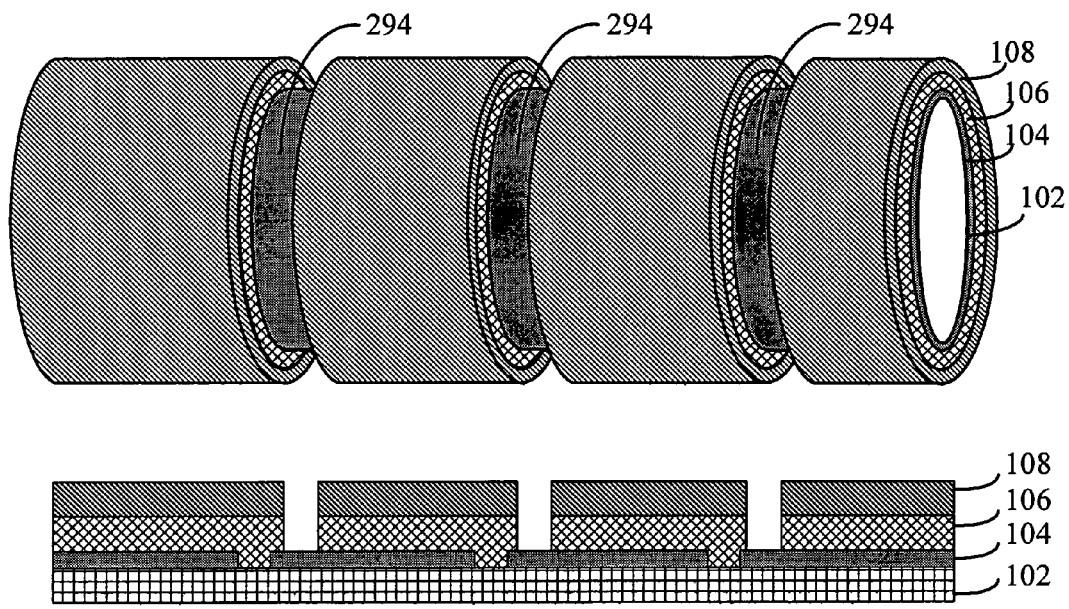
Figure 2H:
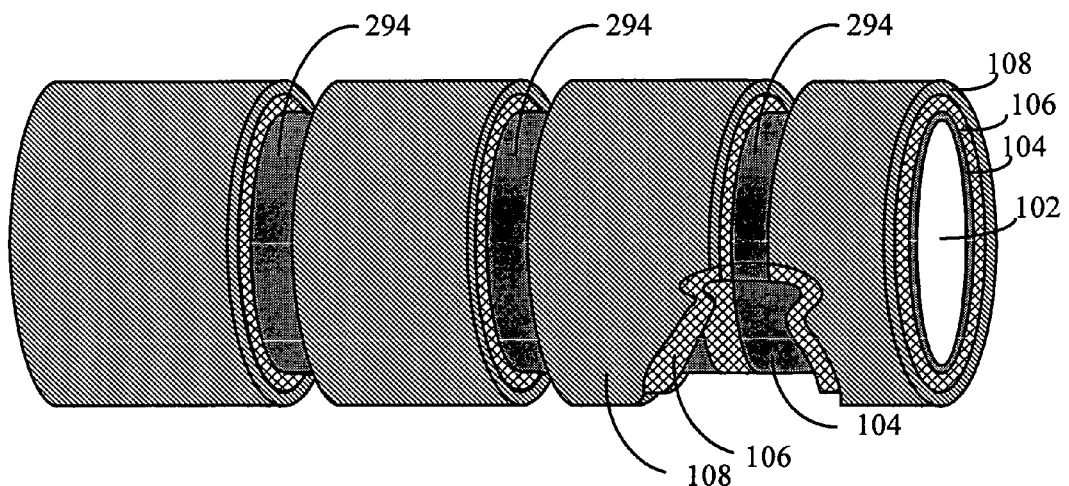
Figure 2I:
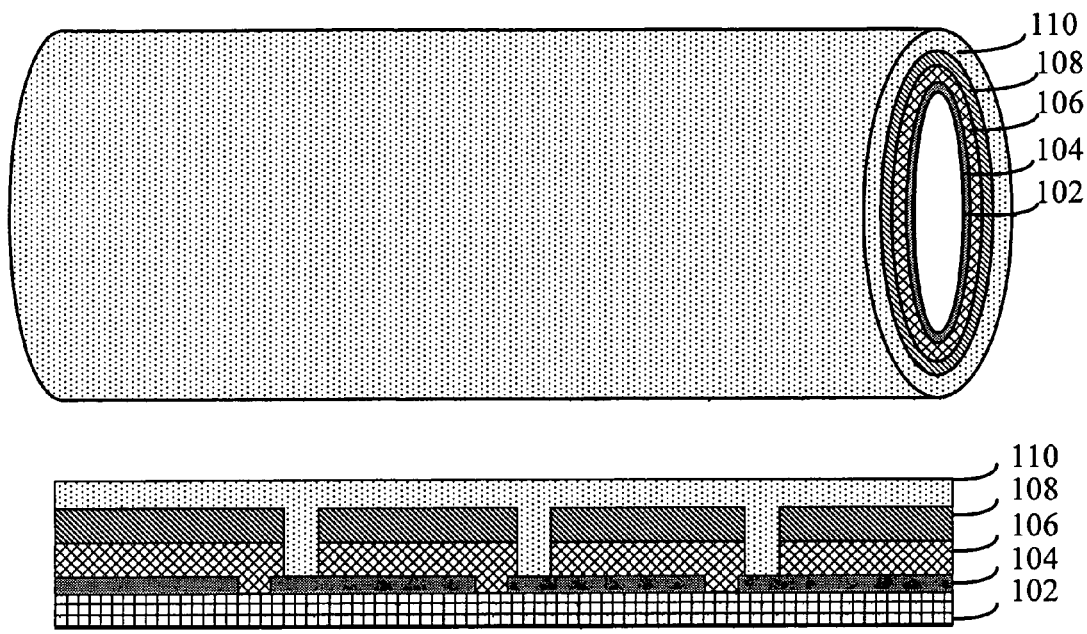
Figure 2J:
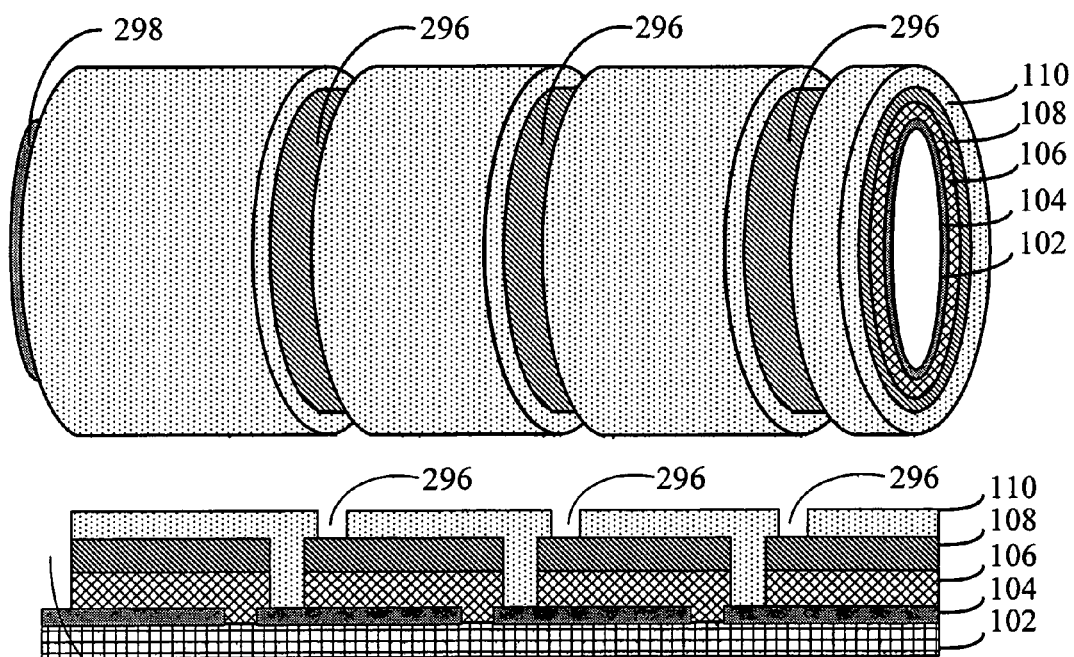
Figure 2K:
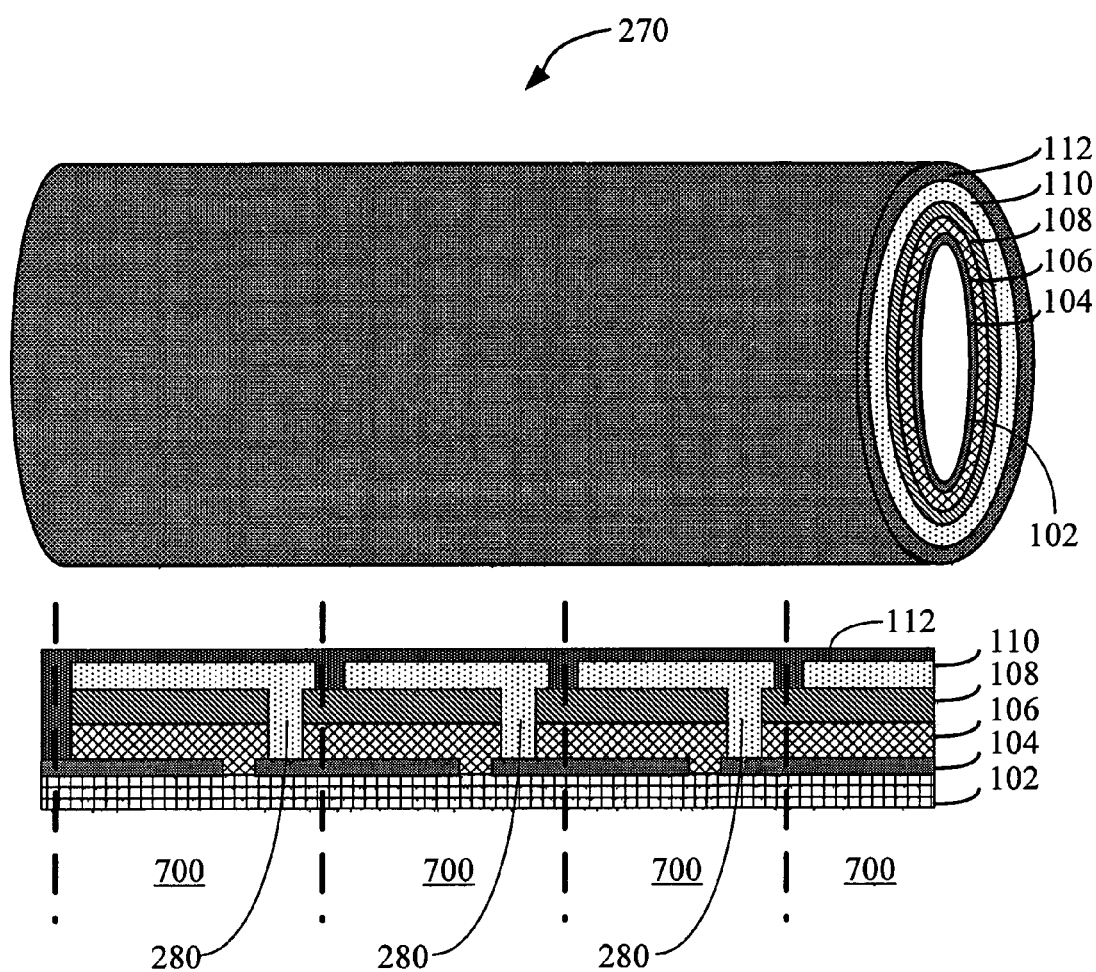

Referring to FIG. 2K, solar cell unit 270 comprises a substrate 102 common to a plurality of photovoltaic cells 700. Substrate 700 has a first end and a second end. The plurality of photovoltaic cells 700 are linearly arranged on substrate 102 as illustrated in FIG. 2K. The plurality of photovoltaic cells 700 comprises a first and second photovoltaic cell 700. Each photovoltaic cell 700 in the plurality of photovoltaic cells 700 comprises a back-electrode 104 circumferentially disposed on common substrate 102 and a semiconductor junction 406 circumferentially disposed on the back-electrode 104. In the case of FIG. 2K, semiconductor junction 406 comprises an absorber 106 and a window layer 108. Each photovoltaic cell 700 in the plurality of photovoltaic cells 700 further comprises a transparent conductive layer 110 circumferentially disposed on the semiconductor junction 406. In the case of FIG. 2K, the transparent conductive layer 110 of the first photovoltaic cell 700 is in serial electrical communication with the back-electrode of the second photovoltaic cell in the plurality of photovoltaic cells because of vias 280. In some embodiments, each via 280 extends the full circumference of the solar cell. In some embodiments, each via 280 does not extend the full circumference of the solar cell. In fact, in some embodiments, each via only extends a small percentage of the circumference of the solar cell. In some embodiments, each solar cell 700 may have one, two, three, four or more, ten or more, or one hundred or more vias 280 that electrically connect in series the transparent conductive layer 110 of the solar cell 700 with back-electrode 104 of an adjacent solar cell 700.

The process for manufacturing solar cell unit 270 will now be described in conjunction with FIGS. 2A through 2K. In this description, exemplary materials for each component of solar cell unit 270 will be described. However, a more comprehensive description of the suitable materials for each component of solar cell unit 270 is provided in Section 5.1 above. Referring to FIG. 2A, the process begins with substrate 102. Substrate 102 is solid cylindrical shaped or hollowed cylindrical shaped. In some embodiments, substrate 102 is either (i) tubular shaped or (ii) a rigid solid rod shaped. Substrate 102 can be made of a wide range of materials including glass, plastic, metal, or metal alloys.

Next, in FIG. 2B, back-electrode 104 is circumferentially disposed on substrate 102. Back-electrode 104 may be deposited by a variety of techniques, including some of the techniques disclosed in Section 5.6, below. In some embodiments, back-electrode 104 is circumferentially disposed on substrate 102 by sputtering. See for example, Section 5.6.11, below. In some embodiments, back-electrode 104 is circumferentially disposed on substrate 102 by electron beam evaporation. In some embodiments, substrate 102 is made of a conductive material. In such embodiments, it is possible to circumferentially dispose back-electrode 104 onto substrate 102 using electroplating. See, for example, Section 5.6.21, below. In some embodiments, substrate 102 is not electrically conducting but is wrapped with a metal foil such as a steal foil or a titanium foil. In these embodiments, it is possible to electroplate back-electrode 104 onto the metal foil using electroplating techniques described, for example, in Section 5.6.21, below. In still other embodiments, back-electrode 104 is circumferentially disposed on substrate 102 by hot dipping.

Referring to FIG. 2C, back-electrode 104 is patterned in order to create grooves 292. Grooves 292 run the full perimeter of back-electrode 104, thereby breaking the back-electrode 104 into discrete sections. Each section serves as the back-electrode 104 of a corresponding solar cell 700. The bottoms of grooves 292 expose the underlying substrate 102. In some embodiments, grooves 292 are scribed using a laser beam having a wavelength that is absorbed by back-electrode 104. Laser scribing provides many advantages over traditional methods of machine cutting. Using a focused laser beam to cut, mark or drill is preferable for solar cell production is precise, fast, and economical. Laser cutting only creates a small heat affected zone around the cut. Furthermore, there is little mechanical disturbance and no machine wear When processing thin films using laser, the terms laser scribing, etching and ablation are used interchangeably. Laser cutting of metal materials can be divided into two main methods: vaporization cutting and melt-and-blow cutting. In vaporization cutting, the material is rapidly heated to vaporization temperature and removed spontaneously as vapor. The melt-and-blow method heats the material to melting temperature while a jet of gas blows the melt away from the surface. In some embodiments, an inert gas (e.g., Ar) is used. In other embodiments, a reactive gas is used to increase the heating of the material through exothermal reactions with the melt. The thin film materials processed by laser scribing techniques include the semiconductors (e.g., cadmium telluride, copper indium gallium diselenide, and silicon), the transparent conducting oxides (e.g., fluorinedoped tin oxide and aluminum-doped zinc oxide), and the metals (e.g., molybdenum and gold). Such laser systems are all commercially available and are chosen based on pulse durations and wavelength. Some exemplary laser systems that may be used to laser scribe include but are not limited to Q-switched Nd:YAG laser systems, a Nd:YAG laser systems, copper-vapor laser systems, a XeC1-excimer laser systems, a KrFexcimer laser systems, and diode-laser-pumped Nd:YAG systems. For detailed discussions on laser scribing systems and methods, see Compaan et al., 1998, "Optimization of laser scribing for thin film PV module," National Renewable Energy Laboratory final technical progress report April 1995-October 1997; Quercia et al., 1995, "Laser patterning of $CuInSe_2$/Mo/SLS structures for the fabrication of $CuInSe_2$ sub modules," in *Semiconductor Processing and Characterization with Lasers: Application in Photovoltaics*, First International Symposium, Issue 173/174, Number corn P: 53-58; and Compaan, 2000, "Laser scribing creates monolithic thin film arrays," *Laser Focus World* 36: 147-148, 150, and 152, each of which is hereby incorporated by reference herein in its entirety. In some embodiments, grooves 292 are scribed using mechanical means. For example, a razor blade or other sharp instrument is dragged over back-electrode 104 thereby creating grooves 292. In some embodiments grooves 292 are formed using a lithographic etching method. Lithographic etching methods are described in Section 5.7, below.

FIGS. 2D-2F illustrate the case in which semiconductor junction 406 comprises a single absorber layer 106 and a single window layer 108. However, the invention is not so limited. For example, junction layer 406 can be a homojunction, a heterojunction, a heteroface junction, a buried homojunction, a p-i-n junction, or a tandem junction.

Referring to FIG. 2D, absorber layer 106 is circumferentially disposed on back-electrode 104. In some embodiments, absorber layer 106 is circumferentially deposited onto back-electrode 104 by thermal evaporation. For example, in some embodiments, absorber layer 106 is CIGS that is deposited using techniques disclosed in Beck and Britt, Final Technical Report, January 2006, NREL/SR-520-39119; and Delahoy and Chen, August 2005, "Advanced CIGS Photovoltaic Technology," subcontract report; Kapur et al., January 2005 subcontract report, NREL/SR-520-37284, "Lab to Large Scale Transition for Non-Vacuum Thin Film CIGS Solar Cells"; Simpson et al., October 2005 subcontract report, "Trajectory-Oriented and Fault-Tolerant- Based Intelligent Process Control for Flexible CIGS PV Module Manufacturing," NREL/SR-520-38681; and Ramanathan et al., 31$^{st}$ IEEE Photovoltaics Specialists Conference and Exhibition, Lake Buena Vista, Fla., Jan. 3-7, 2005, each of which is hereby incorporated by reference herein in its entirety. In some embodiments, absorber layer 106 is circumferentially deposited on back-electrode 104 by evaporation from elemental sources. For example, in some embodiments, absorber layer 106 is CIGS grown on a molybdenum back-electrode 104 by evaporation from elemental sources. One such evaporation process is a three stage process such as the one described in Ramanthan et al., 2003, "Properties of 19.2% Efficiency ZnO/CdS/CuInGaSe$_2$ Thin-film Solar Cells," Progress in Photovoltaics: Research and Applications 11, 225, which is hereby incorporated by reference herein in its entirety, or variations of the three stage process. In some embodiments, absorber layer 106 is circumferentially deposited onto back-electrode 104 using a single stage evaporation process or a two stage evaporation process. In some embodiments, absorber layer 106 is circumferentially deposited onto back-electrode 104 by sputtering (see, for example, Section 5.6.11, below). Typically, such sputtering requires a hot substrate 102.

In some embodiments, absorber layer 106 is circumferentially deposited onto back-electrode 104 as individual layers of component metals or metal alloys of the absorber layer 106 using electroplating. For example, consider the case where absorber layer 106 is copper-indium-gallium-diselenide (CIGS). The individual component layers of CIGS (e.g., copper layer, indium-gallium layer, selenium) can be electroplated layer by layer onto back-electrode 104. Electroplating is discussed in Section 5.6.21, below. In some embodiments, the individual layers of the absorber layer are circumferentially deposited onto back-electrode 104 using sputtering. Regardless of whether the individual layers of absorber layer 106 are circumferentially deposited by sputtering or electroplating, or a combination thereof, in typical embodiments (e.g. where active layer 106 is CIGS), once component layers have been circumferentially deposited, the layers are rapidly heated up in a rapid thermal processing step so that they react with each other to form the absorber layer 106. In some embodiments, the selenium is not delivered by electroplating or sputtering. In such embodiments the selenium is delivered to the absorber layer 106 during a low pressure heating stage in the form of an elemental selenium gas, or hydrogen selenide gas during the low pressure heating stage. In some embodiments, copper-indium-gallium oxide is circumferentially deposited onto back-electrode 104 and then converted to copper-indium-gallium diselenide. In some embodiments, a vacuum process is used to deposit absorber layer 106. In some embodiments, a non-vacuum process is used to deposit absorber layer 106. In some embodiments, a room temperature process is used to deposit absorber layer 106. In still other embodiments, a high temperature process is used to deposit absorber layer 106. Those of skill in the art will appreciate that these processes are just exemplary and there are a wide range of other processes that can be used to deposit absorber layer 106.

In some embodiments, absorber layer 106 is deposited using chemical vapor deposition. Exemplary chemical vapor deposition techniques are described in Sections 5.6.1, 5.6.2, 5.6.3, 5.6.4, and 5.6.5, below.

Referring to FIGS. 2E and 2F, window layer 108 is circumferentially disposed on absorber layer 106. In some embodiments, absorber layer 106 is circumferentially deposited onto absorber layer 108 using a chemical bath deposition process. For instance, in the case where window layer 108 is a buffer layer such as cadmium sulfide, the cadmium and sulfide can each be separately provided in solutions that, when reacted, results in cadmium sulfide precipitating out of the solution. Other compositions that can serve as window layer include, but are not limited to indium sulfide, zinc oxide, zinc oxide hydroxy sulfide or other types of buffer layers. In some embodiments, the window layer 108 is an n type buffer layer. In some embodiments, window layer 108 is sputtered onto absorber layer 106. See, for example, Section 5.6.11, below. In some embodiments, window layer 108 is evaporated onto absorber layer 106. See, for example, Section 5.6.10, below. In some embodiments, window layer 108 is circumferentially disposed onto absorber layer 106 using chemical vapor deposition. Exemplary chemical vapor deposition techniques are described in Section 5.6.1, 5.6.2, 5.6.3, 5.6.4, and 5.6.5, below.

Referring to FIGS. 2G and 2H, semiconductor junction 406 (e.g., layers 106 and 108) are patterned in order to create grooves 294. In some embodiments, grooves 294 run the full perimeter of semiconductor junction 406, thereby breaking the semiconductor junction 406 into discrete sections. In some embodiments, grooves 294 do not run the full perimeter of semiconductor junction 406. In fact, in some embodiments, each groove only extends a small percentage of the perimeter of semiconductor junction 406. In some embodiments, each solar cell 700 may have one, two, three, four or more, ten or more, or one hundred or more pockets arranged around the perimeter of semiconductor junction 406 instead of a given groove 294. In some embodiments, grooves 294 are scribed using a laser beam having a wavelength that is absorbed by semiconductor junction 406. In some embodiments, grooves 294 are scribed using mechanical means. For example, a razor blade or other sharp instrument is dragged over semiconductor junction 406 thereby creating grooves 294. In some embodiments grooves 294 are formed using a lithographic etching method. Lithographic etching methods are described in Section 5.7, below.

Referring to FIG. 2I, transparent conductive layer 110 is circumferentially disposed on semiconductor junction 406. In some embodiments, transparent conductive layer 110 is circumferentially deposited onto back-electrode 104 by sputtering. For a description of sputtering, see Section 5.6.11, below. In some embodiments, the sputtering is reactive sputtering. For example, in some embodiments a zinc target is used in the presence of oxygen gas to produce a transparent conductive layer 110 comprising zinc oxide. In another reactive sputtering example, an indium tin target is used in the presence of oxygen gas to produce a transparent conductive layer 110 comprising indium tin oxide. In another reactive sputtering example, a tin target is used in the presence of oxygen gas to produce a transparent conductive layer 110 comprising tin oxide. In general, any wide bandgap conductive transparent material can be used as transparent conductive layer 110. As used herein, the term "transparent" means a material that is considered transparent in the wavelength range from about 300 nanometers to about 1500 nanometers. However, components that are not transparent across this full wavelength range can also serve as a transparent conductive layer 110, particularly if they have other properties such as high conductivity such that very thin layers of such materials can be used. In some embodiments, transparent conductive layer 110 is any transparent conductive oxide that is conductive and can be deposited by sputtering, either reactively or using ceramic targets.

In some embodiments transparent conductive layer 110 is deposited using direct current (DC) diode sputtering, radio frequency (RF) diode sputtering, triode sputtering, DC magnetron sputtering or RF magnetron sputtering as described in Section 5.6.11, below. In some embodiments, transparent conductive layer 110 is deposited using atomic layer deposition. Exemplary atom layer deposition techniques are described in Section 5.6.17, below. In some embodiments, transparent conductive layer 110 is deposited using chemical vapor deposition. Exemplary chemical vapor deposition techniques are described in Section 5.6.1, 5.6.2, 5.6.3, 5.6.4, and 5.6.5, below.

Referring to 2J, transparent conductive layer 110 is patterned in order to create grooves 296. Grooves 296 run the full perimeter of transparent conductive layer 110 thereby breaking the transparent conductive layer 110 into discrete sections. The bottoms of grooves 296 expose the underlying semiconductor junction 406. In some embodiments, a groove 298 is patterned at an end of solar cell unit 270 in order to connect the back-electrode 104 exposed by groove 298 to an electrode or other electronic circuitry. In some embodiments, grooves 296 are scribed using a laser beam having a wavelength that is absorbed by transparent conductive layer 110. In some embodiments, grooves 296 are scribed using mechanical means. For example, a razor blade or other sharp instrument is dragged over back-electrode 104 thereby creating grooves 296. In some embodiments grooves 296 are formed using a lithographic etching method. Lithographic etching methods are described in Section 5.7, below.

Referring to FIG. 2K, optional antireflective coating 112 is circumferentially disposed on the transparent conductive layer 110 using any of the deposition techniques described above or one selected from Section 5.6 below. In some embodiments, solar cell units 270 are encased in a transparent tubular casing 310. More details on how elongated solar cells such as solar cell unit 270 can be encased in a transparent tubular case are described in copending U.S. patent application Ser. No. 11/378,847, entitled "Elongated Photovoltaic Cells in Tubular Casings," filed Mar. 18, 2006, which is hereby incorporated by reference herein in its entirety. In some embodiments, an optional filler layer 330 is used to ensure that there are no pockets of air between the outer layers of solar cell unit 270 and the transparent tubular casing 310.

In some embodiments, electrode strips 420 are deposited on transparent conductive layer 110 using ink jet printing. Exemplary ink jet printing techniques are described in Section 5.6.9, below. Examples of conductive ink that can be used for such strips include, but are not limited to silver loaded or nickel loaded conductive ink. In some embodiments epoxies as well as anisotropic conductive adhesives can be used to construct electrode strips 420. In typical embodiments such inks or epoxies are thermally cured in order to form electrode strips 420. In some embodiments, such electrode strips are not present in solar cell unit 270. In fact, a primary advantage of the use of the monolithic integrated designs of the present invention is that voltage across the length of the solar cell unit 270 is increased because of the independent solar cells 700. Thus, current is decreased, thereby reducing the current requirements of individual solar cells 700. As a result, in many embodiments, there is no need for electrode strips 420.

In some embodiments, grooves 292, 294, and 296 are not concentric as illustrated in FIG. 2. Rather, in some embodiments, such grooves are spiraled down the tubular (long) axis of substrate 102. The monolithic integration strategy of FIG. 2 has the advantage of minimal area and a minimal number of process steps.

Figure 3A:
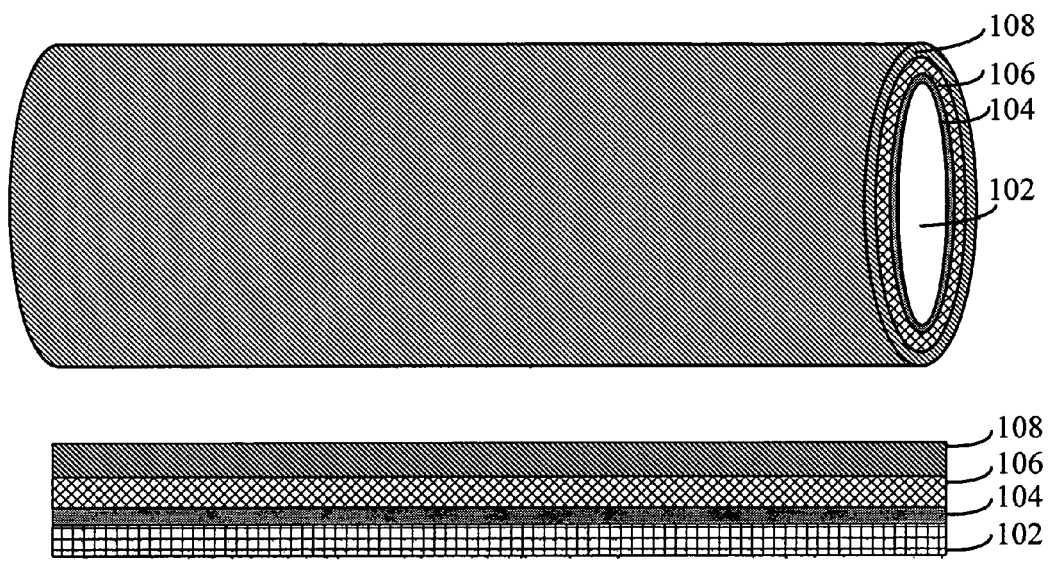
FIGS. 3A-3H illustrate processing steps for manufacturing a solar cell unit having a substrate using a first post absorber technique in accordance with the present invention.
Figure 3B:
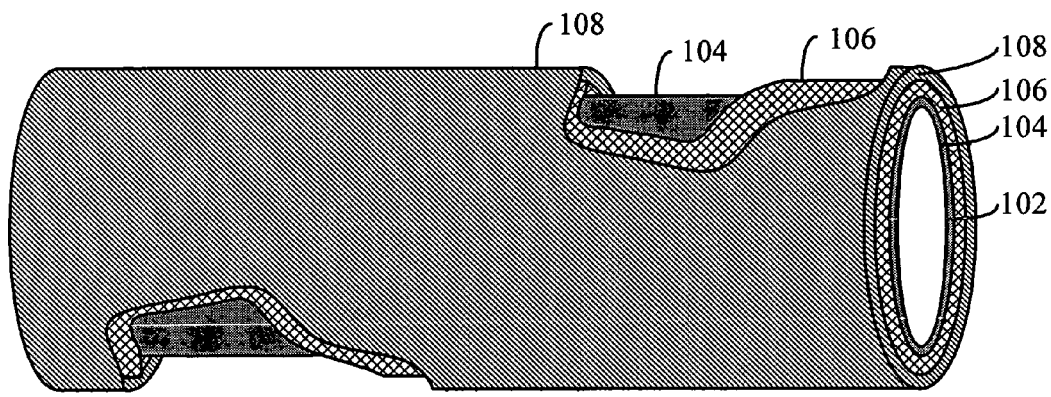

5.1.2 Manufacture of Monolithic Solar Cells on a Substrates Using a First Post Absorber Technique FIGS. 3A-3H illustrate processing steps for manufacturing a solar cell unit having a substrate using a first post absorber technique in accordance with the present invention. Substrate 102 is solid cylindrical shaped or hollowed cylindrical shaped. In some embodiments, substrate 102 is (i) tubular shaped or (ii) a rigid solid rod shaped. Referring to FIGS. 3A and 3B, back-electrode 104, absorber 106, and window layer 108 are sequentially circumferentially disposed on substrate 102 prior to the first patterning step. FIG. 3A illustrates the three-dimensional tubular profile of the solar cell unit. Below this three-dimensional tubular profile is a corresponding one-dimensional profile of solar cell unit 270 at this stage of fabrication. Like the one dimensional profiles of FIG. 2 and the one dimensional profiles shown in various component Figures of FIGS. 3-6, the one-dimensional profile is a cross-sectional view of one hemisphere of the corresponding solar cell unit 270.

Figure 3C:
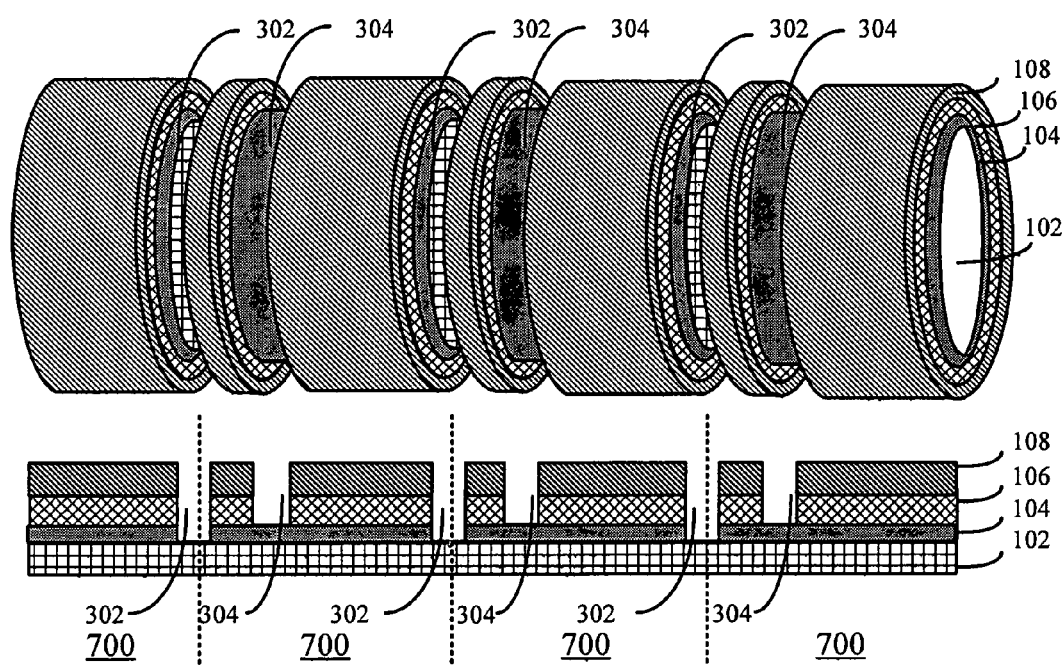

Referring to FIG. 3C, once window layer 108 has been circumferentially disposed, grooves 302 and 304 are scribed. The bottoms of grooves 302 expose substrate 102. The bottoms of grooves 304 expose back-electrode 104. Grooves 302 run the full perimeter of substrate 102 thereby defining solar cells 700 as illustrated. In contrast, there is no requirement that grooves 304 run the full perimeter of back-electrode 104. In some embodiments, grooves 304 do not run the full perimeter of back-electrode 104. In fact, in some embodiments, each groove 304 only extends a small percentage of the perimeter of back-electrode 104. In some embodiments, each solar cell 700 may have one, two, three, four or more, ten or more, or one hundred or more pockets arranged around the perimeter of back-electrode 104 instead of a given groove 304. In some embodiments, grooves 302 and 304 are scribed using a laser beam. In some embodiments, grooves 302 and 304 are scribed using mechanical means. In some embodiments grooves 302 and 304 are formed using a lithographic etching method. Lithographic etching methods are described in Section 5.7, below.

Figure 3D:
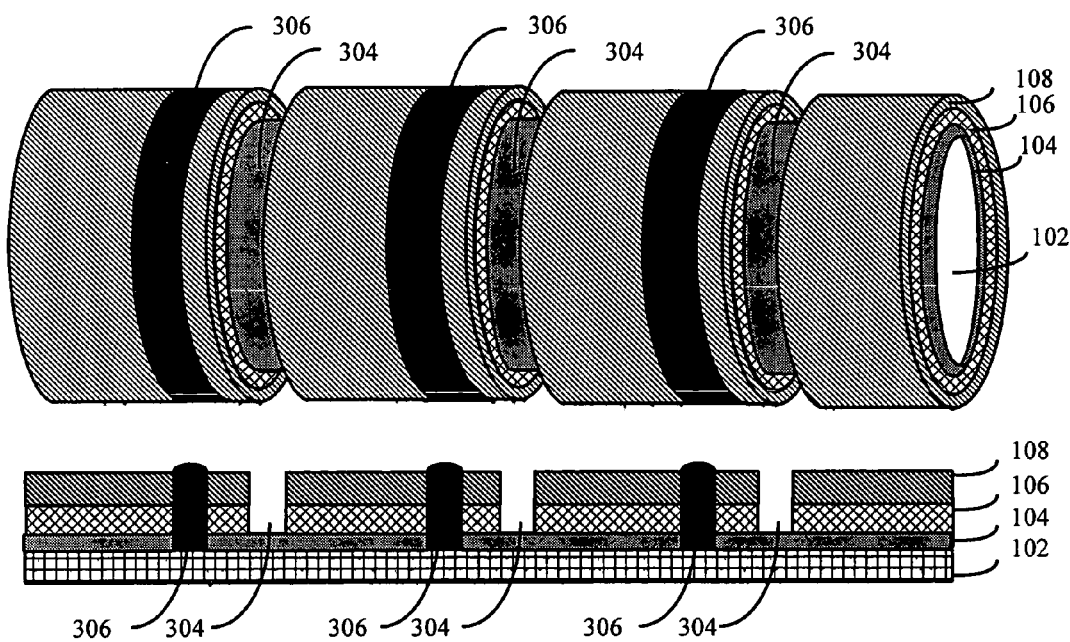

Referring to FIG. 3D, once grooves 302 have been formed, they are filled with an electrically insulating material thereby forming electrically insulating posts 310. In some embodiments, grooves 302 are filled using screen printing. Exemplary screen printing techniques are disclosed in Section 5.6.19, below. In some embodiments, grooves 302 are filled using ink jet printing. Exemplary ink jet printing techniques are disclosed in Section 5.6.9, below. In some embodiments, grooves 302 are filled by inserting a powder into the grooves and then fusing the power with a laser having a suitable wavelength. Insulating post 306 is any type of electrically insulating material.

Figure 3E:
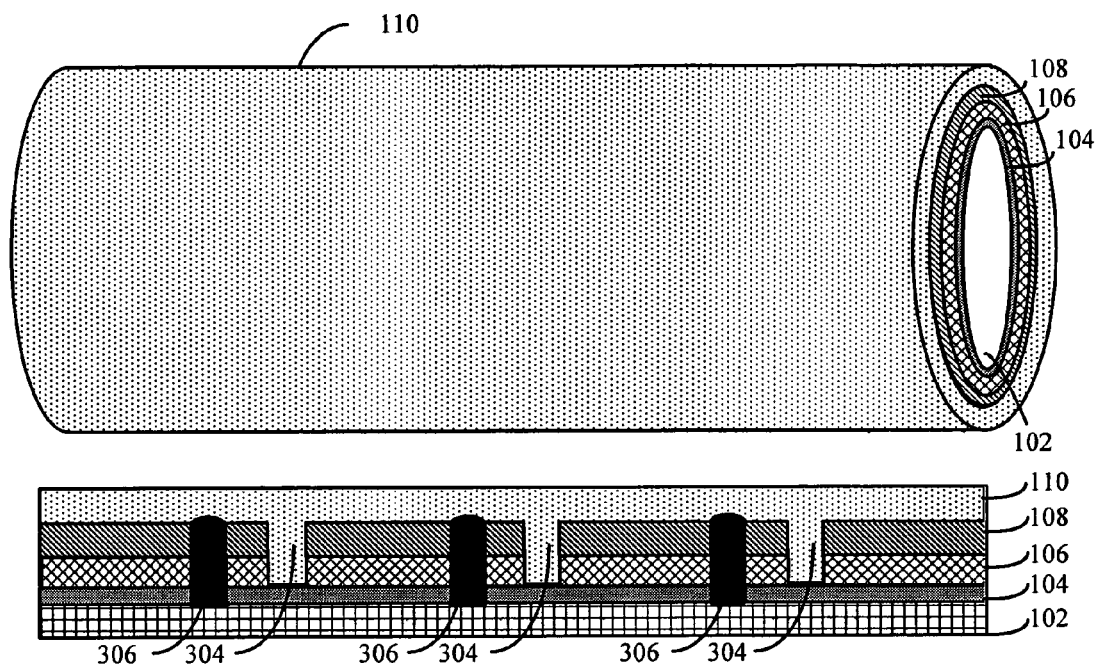
Figure 3F:
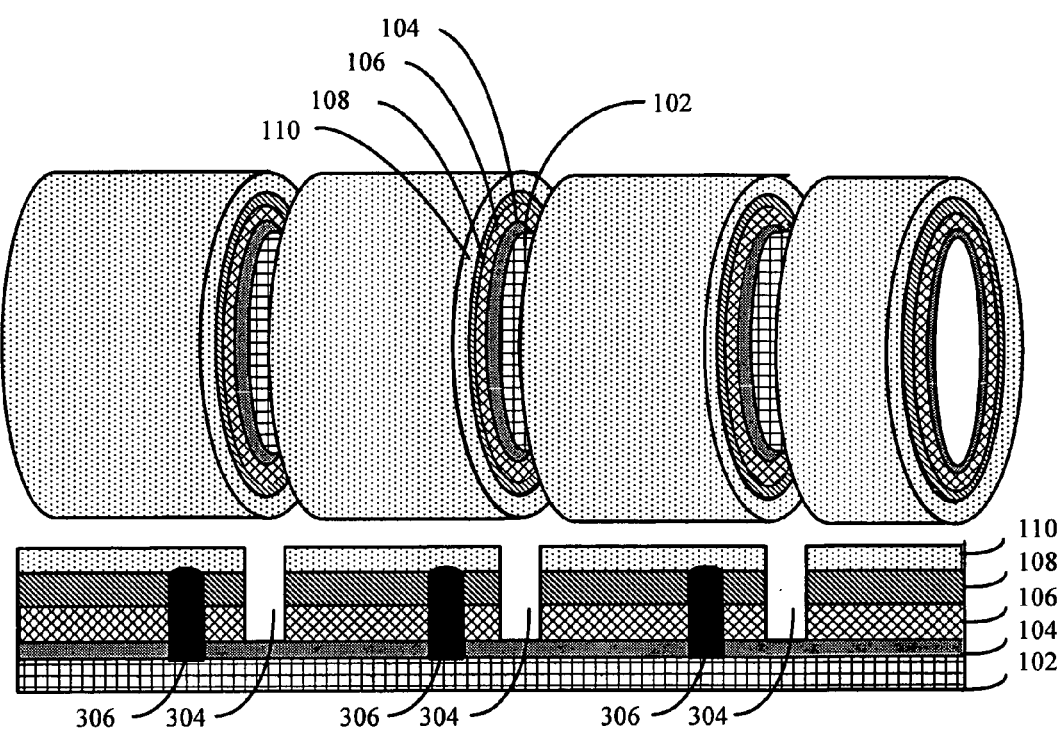
Figure 3G:
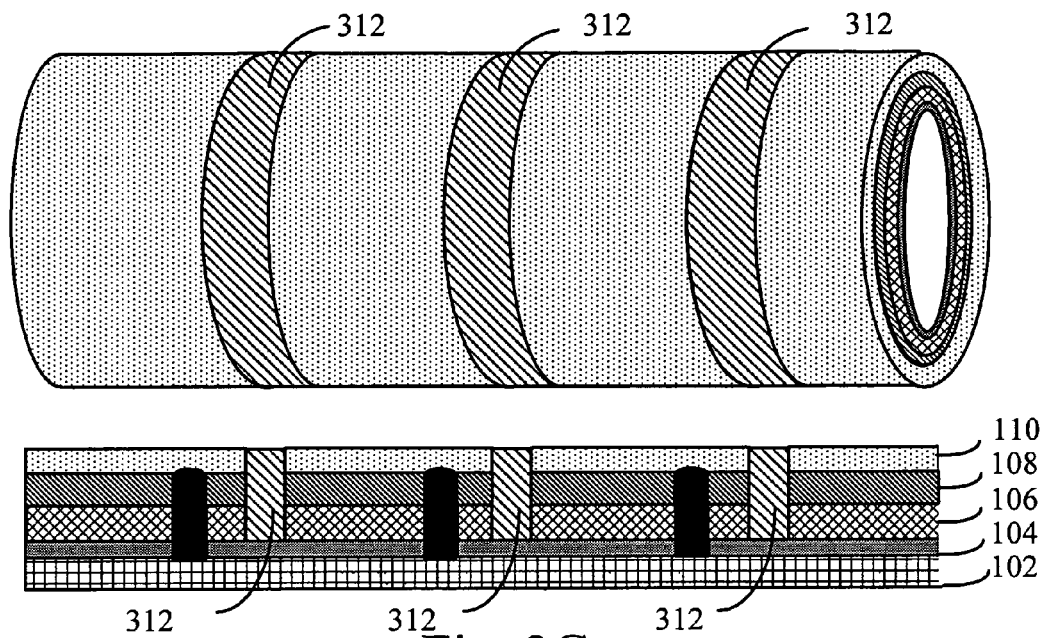
Figure 3H:
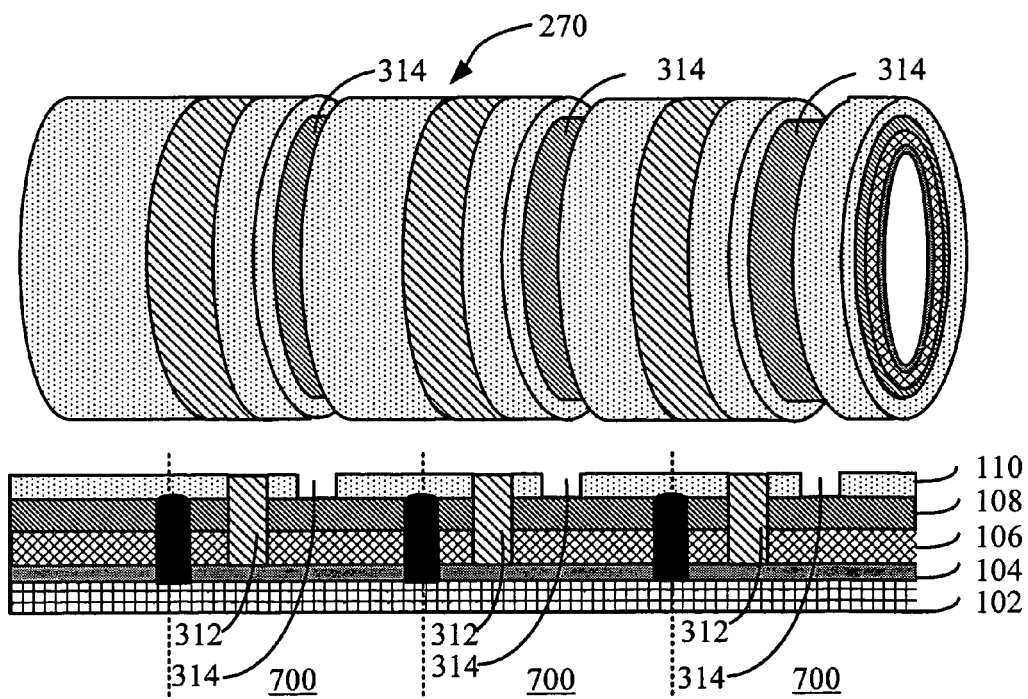

Referring to FIG. 3E, transparent conductive layer 110 is circumferentially deposited after grooves 302 have been filled with an insulative material. Material for the transparent conductive layer 110 fills grooves 304. However, referring to FIG. 3F, this material is scribed out of grooves 304 so that a more electrically conducting material can be deposited into the grooves thereby forming electrically conductive vias 312 as illustrated in FIG. 3G. The use of highly electrically conductive material for vias 312 allows the vias to have very narrow linewidths and still be effective. This is advantageous because it helps to reduce semiconductor junction 406 area loss. In some embodiments, grooves 304 are filled using screen printing. Exemplary screen printing techniques are disclosed in Section 5.6.19, below. In some embodiments, grooves 304 are filled using ink jet printing. Exemplary ink jet printing techniques are disclosed in Section 5.6.9, below. In some embodiments, grooves 304 are filled by inserting a powder into grooves 304 and then fusing the power with a laser having a suitable wavelength. Referring to FIG. 3H, grooves 314 are scribed into the transparent conductive oxide layer thereby exposing underlying window layer 108. Grooves 314 are necessary to form solar cells 700 that are monolithically integrated such that the transparent conductive layer 110 of one solar cell 700 on substrate 102 is serially connected to the back-electrode 104 of an adjacent solar cell 700 but the two solar cells 700 are otherwise electrically isolated from each other.

In some embodiments, grooves 302, 304, and 314 are not concentric as illustrated in FIG. 3. Rather, in some embodiments, such grooves are spiraled down the cylindrical (long) axis of substrate 102.

Figure 4A:
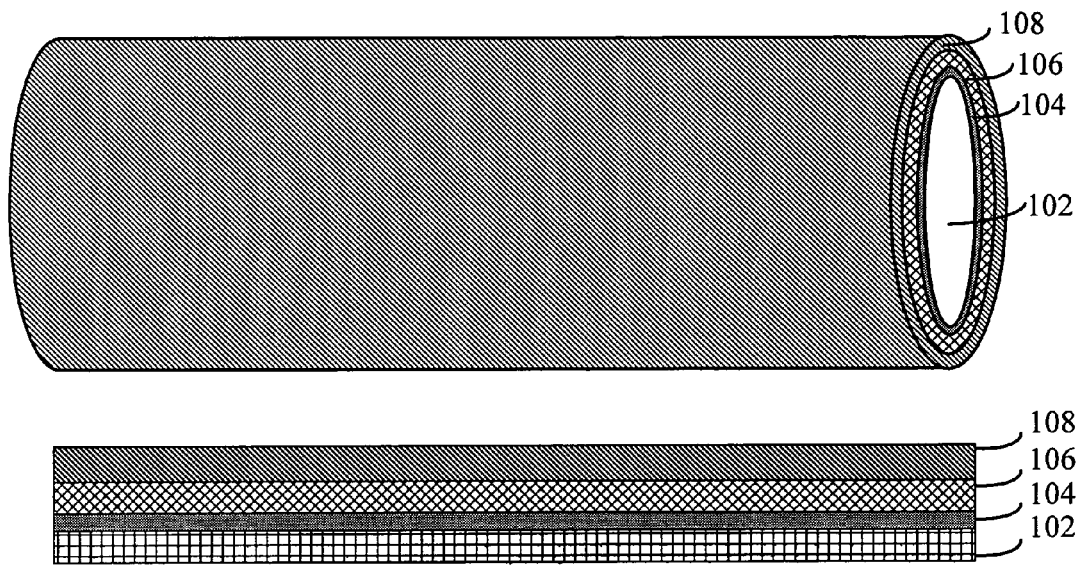
FIGS. 4A-4F illustrate processing steps for manufacturing a solar cell unit having a substrate using a second post absorber technique in accordance with the present invention.
Figure 4B:
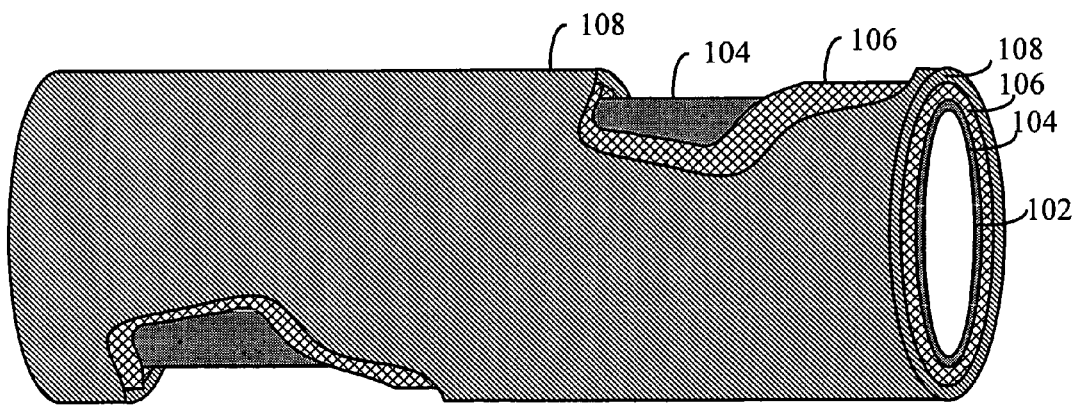

5.1.3 Manufacture of Monolithic Solar Cells on Substrates Using a Second Post Absorber Technique FIGS. 4A-4F illustrate processing steps for manufacturing a solar cell unit having a substrate using a second post absorber technique in accordance with the present invention. Substrate 102 is solid cylindrical shaped or hollowed cylindrical shaped. In some embodiments, substrate 102 is (i) tubular shaped or (ii) a rigid solid rod shaped. Referring to FIGS. 4A and 4B, back-electrode 104, absorber 106, and window layer 108 are sequentially circumferentially disposed on substrate 102 prior to the first patterning step. FIG. 4A illustrates the three-dimensional tubular profile of the solar cell unit. Below this three-dimensional tubular profile is a corresponding one-dimensional profile of solar cell unit 270 at this stage of fabrication. Like the one dimensional profiles of FIGS. 2 and 3 and the one dimensional profiles shown in various component Figures of FIGS. 5-6, the one-dimensional profile is a cross-sectional view of one hemisphere of the corresponding solar cell unit 270.

Figure 4C:
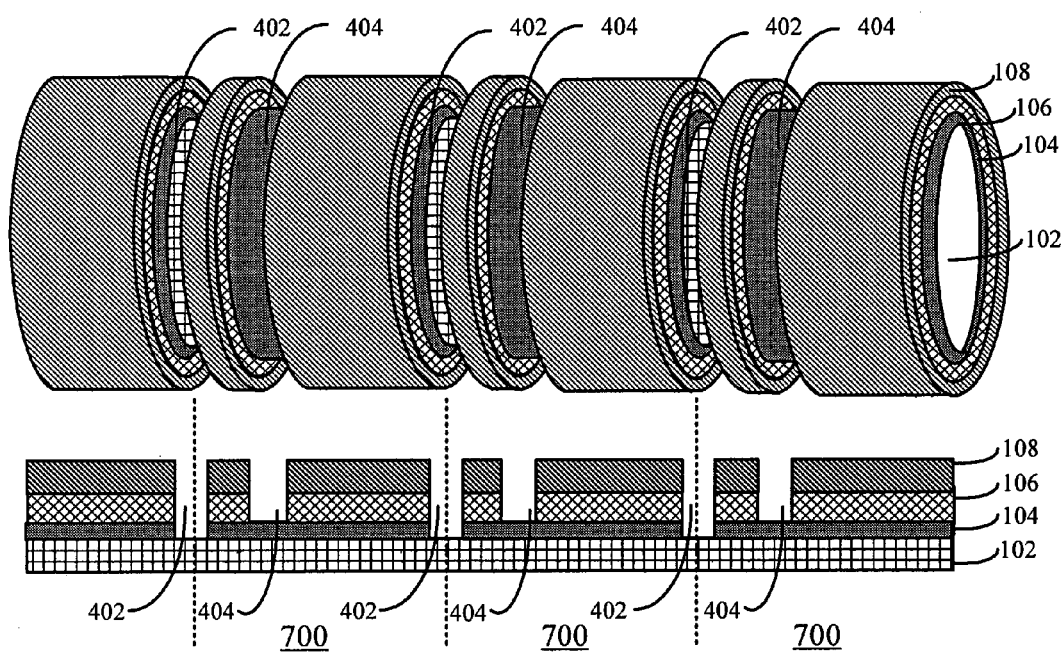

Referring to FIG. 4C, once window layer 108 has been deposited, grooves 402 and 404 are scribed. The bottoms of grooves 402 expose substrate 102. The bottoms of grooves 404 expose back-electrode 104. Grooves 402 run the full perimeter of substrate 102 thereby defining solar cells 700 as illustrated. In contrast, there is no requirement that grooves 404 run the full perimeter of back-electrode 104. In some embodiments, grooves 404 do not run the full perimeter of back-electrode 104. In fact, in some embodiments, each groove 404 only extends a small percentage of the perimeter of back-electrode 104. In some embodiments, each solar cell 700 may have one, two, three, four or more, ten or more, or one hundred or more pockets arranged around the perimeter of back-electrode 104 instead of a given groove 404. In some embodiments, grooves 402 and 404 are scribed using a laser beam. In some embodiments, grooves 402 and 404 are scribed using mechanical means. In some embodiments grooves 402 and 404 are formed using a lithographic etching method. Lithographic etching methods are described in Section 5.7, below.

Figure 4D:
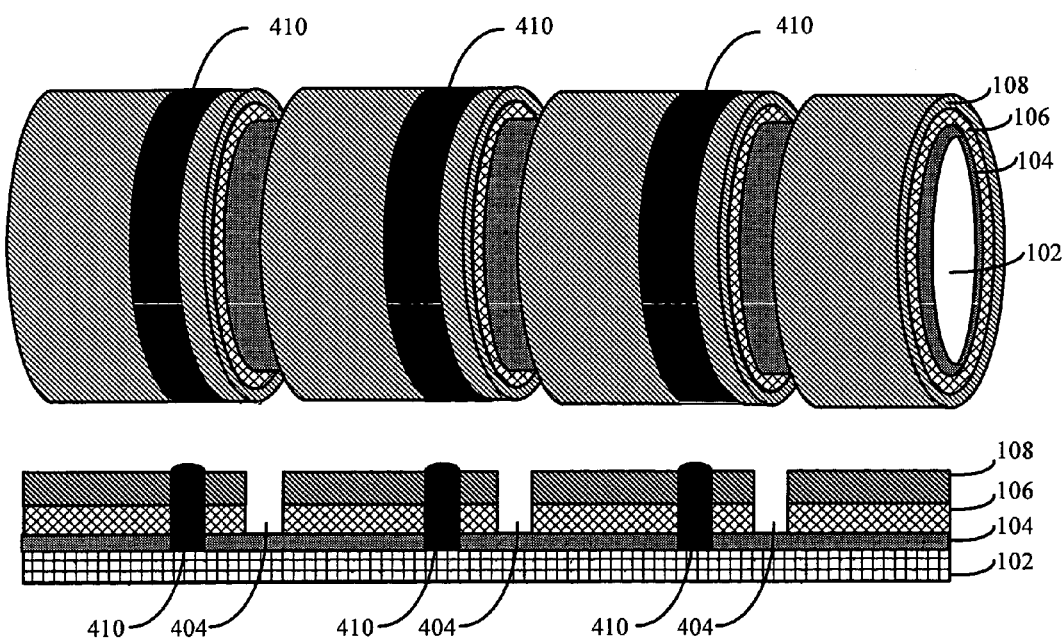

Referring to FIG. 4D, once grooves 402 have been formed, they are filled with an electrically insulating material thereby forming electrically insulating posts 410. In some embodiments, grooves 402 are filled using screen printing. Exemplary screen printing techniques are disclosed in Section 5.6.19, below. In some embodiments, grooves 402 are filled using ink jet printing. Exemplary ink jet printing techniques are disclosed in Section 5.6.9, below. In some embodiments, grooves 402 are filled by inserting a powder into grooves 402 and then fusing the power with a laser having a suitable wavelength. Grooves 402 are filled with any type of electrically insulating material.

Figure 4E:
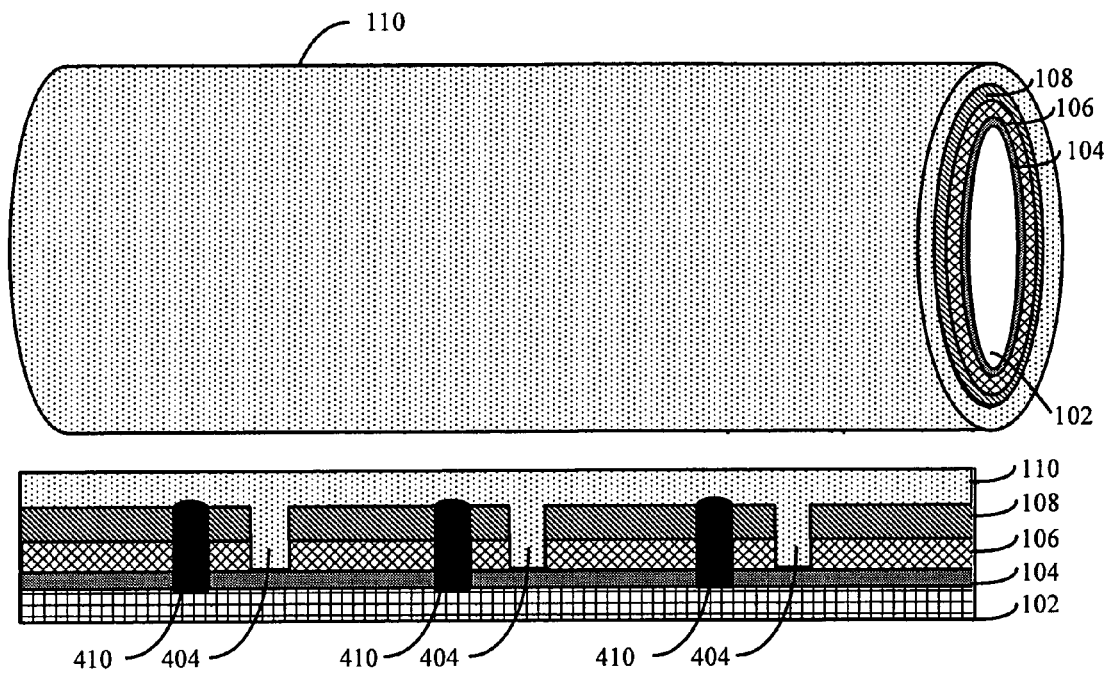
Figure 4F:
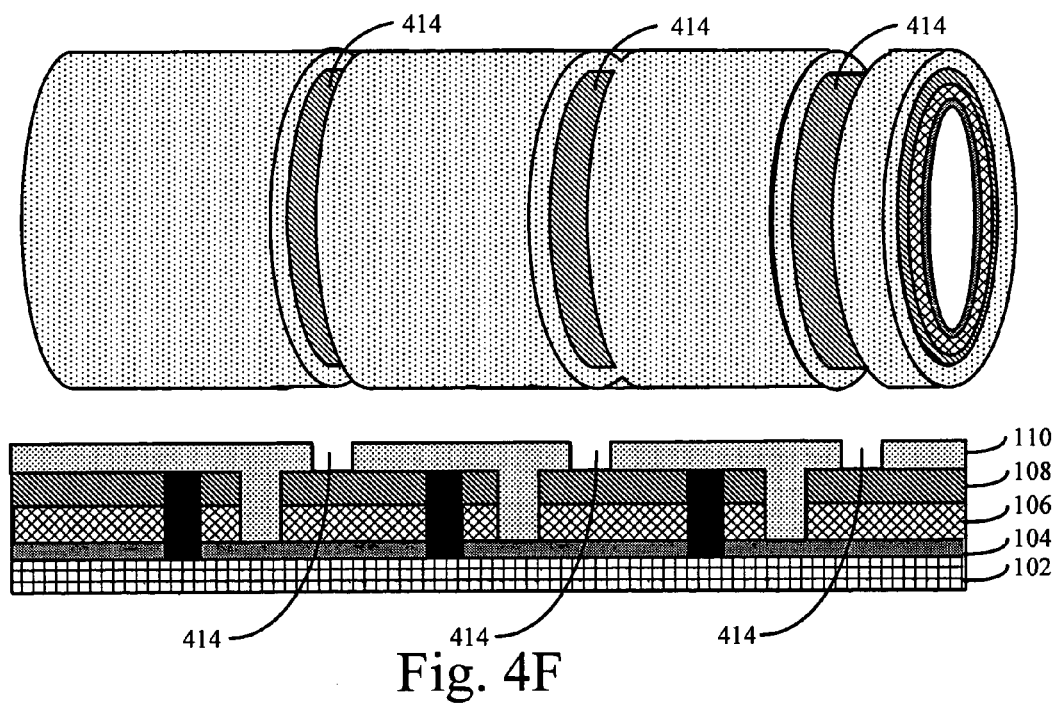

Referring to FIG. 4E, transparent conductive layer 110 is circumferentially deposited after grooves 402 have been filled with an insulative material. Material for transparent conductive layer fills grooves 404. Referring to FIG. 4F, grooves 414 are scribed into transparent conductive layer 110 thereby exposing underlying window layer 108. Grooves 414 are necessary to form solar cells 700 that are monolithically integrated such that the transparent conductive layer 110 of one solar cell 700 on substrate 102 is serially connected to the back-electrode 104 of an adjacent solar cell 700 but the two solar cells 700 are otherwise electrically isolated from each other.

In some embodiments, grooves 402, 404, and 414 are not concentric as illustrated in FIG. 4. Rather, in some embodiments, such grooves are spiraled down the cylindrical (long) axis of substrate 102.

Figure 5A:
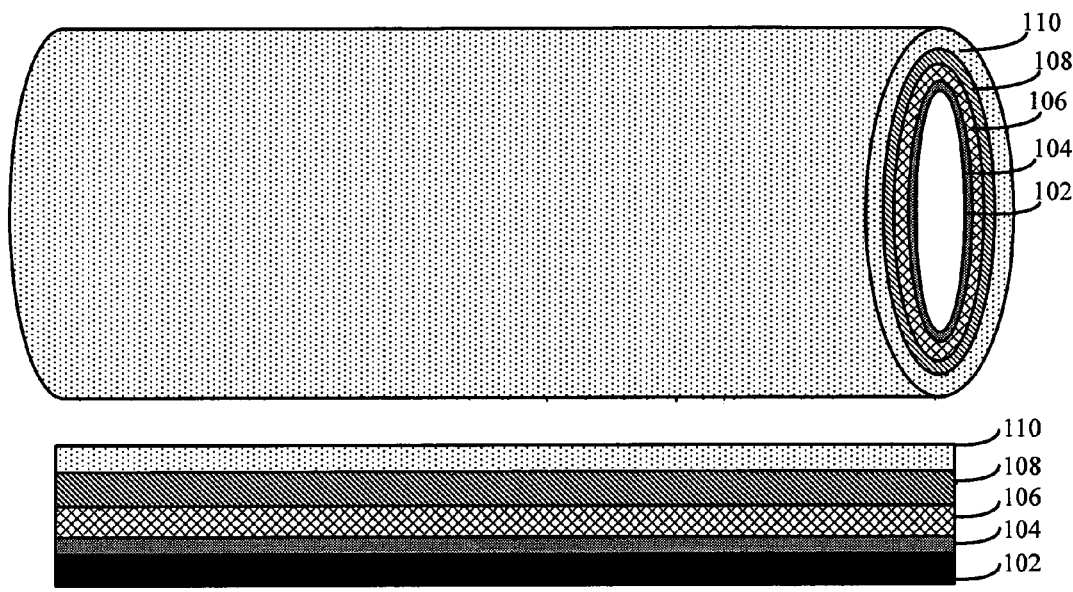
FIGS. 5A-5D illustrate processing steps for manufacturing a solar cell unit having a substrate using a first post device technique in accordance with the present invention.
Figure 5B:
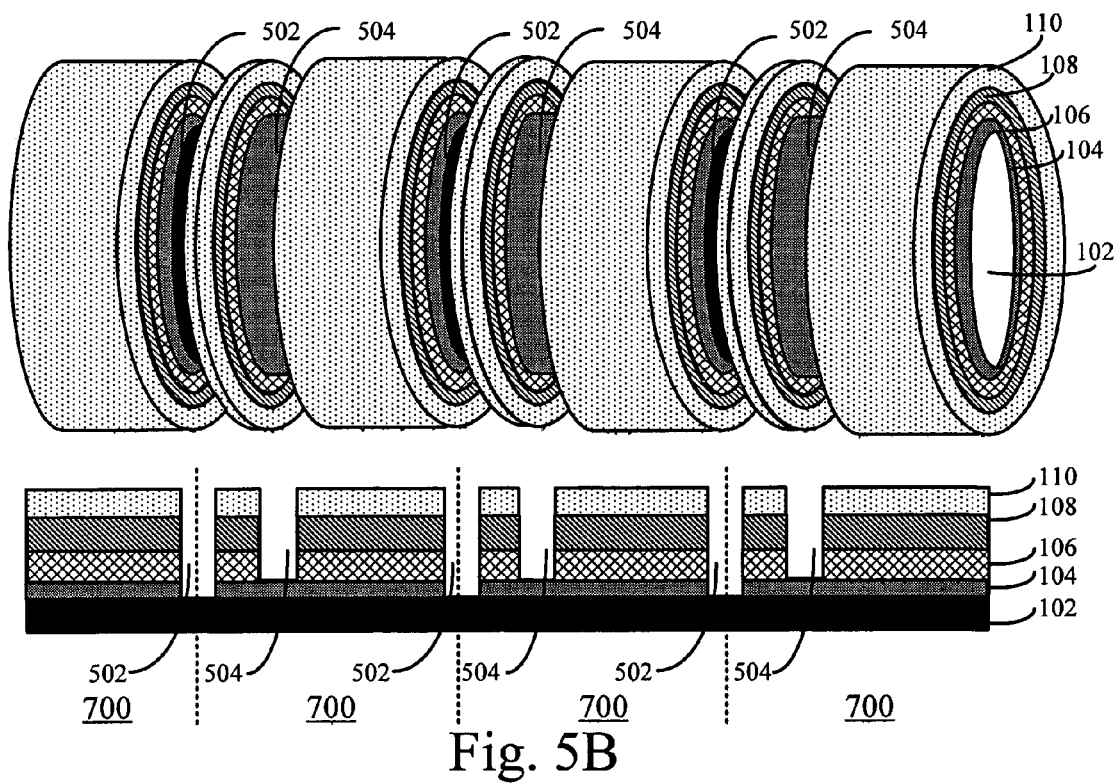

5.1.4 Manufacture of Monolithic Solar Cells on Substrates Using a First Post Device Technique FIGS. 5A-5D illustrate processing steps for manufacturing a solar cell unit having a substrate using a first post device technique in accordance with the present invention. Substrate 102 is solid cylindrical shaped or hollowed cylindrical shaped. In some embodiments, substrate 102 is (i) tubular shaped or (ii) a rigid solid rod shaped. Referring to FIGS. 5A and 5B, back-electrode 104, absorber 106, and window layer 108 and transparent conductive layer 110 are sequentially circumferentially disposed on substrate 102 prior to the first patterning step. FIG. 5A illustrates the three-dimensional tubular profile of the solar cell unit. Below this three-dimensional tubular profile is a corresponding one-dimensional profile of solar cell unit 270 at this stage of fabrication. The one-dimensional profile is a cross-sectional view of one hemisphere of the corresponding solar cell unit 270.

Referring to FIG. 5B, once transparent conductive layer 110 has been deposited, grooves 502 and 504 are scribed. The bottoms of grooves 502 expose substrate 102. The bottoms of grooves 504 expose back-electrode 104. Grooves 502 run the full perimeter of substrate 102 thereby defining solar cells 700 as illustrated. In contrast, there is no requirement that grooves 504 run the full perimeter of back-electrode 104. In some embodiments, grooves 504 do not run the full perimeter of back-electrode 104. In fact, in some embodiments, each groove 504 only extends a small percentage of the perimeter of back-electrode 104. In some embodiments, each solar cell 700 may have one, two, three, four or more, ten or more, or one hundred or more pockets arranged around the perimeter of back-electrode 104 instead of a given groove 504. In some embodiments, grooves 502 and 504 are scribed using a laser beam. In some embodiments, grooves 502 and 504 are scribed using mechanical means. In some embodiments grooves 502 and 504 are formed using a lithographic etching method. Lithographic etching methods are described in Section 5.7, below.

Figure 5C:
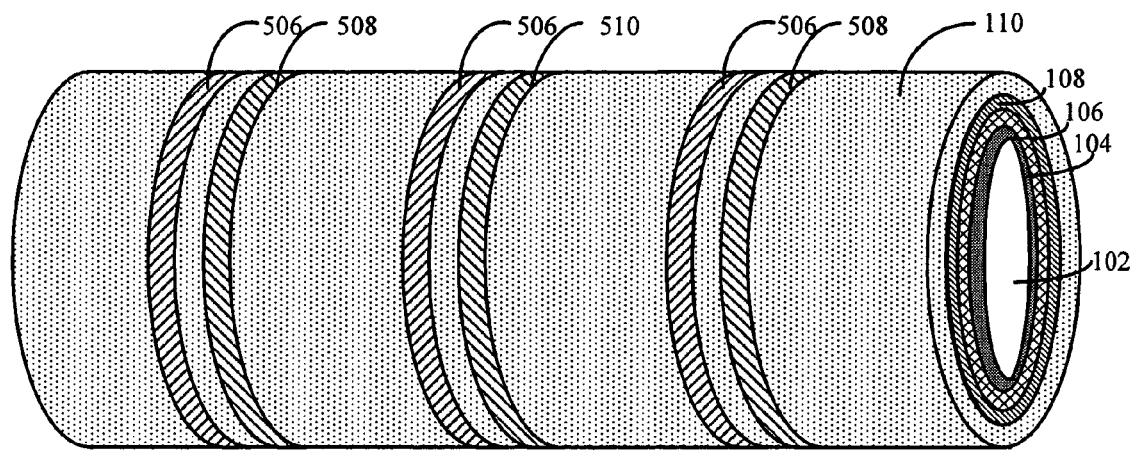
Figure 5C:
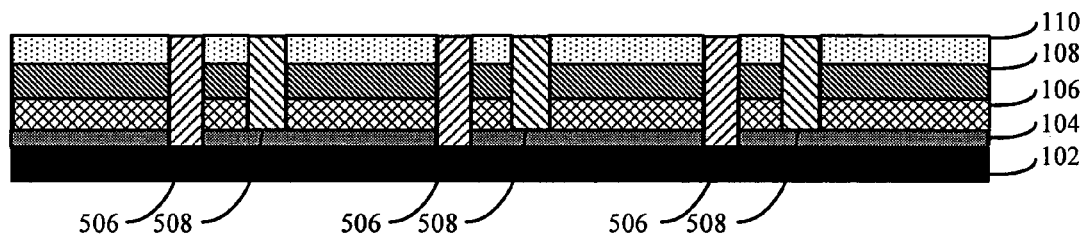

Referring to FIG. 5C, once grooves 502 have been formed, they are filled with an electrically insulating material thereby forming electrically insulating posts 506. In some embodiments, grooves 502 are filled using screen printing. Exemplary screen printing techniques are disclosed in Section 5.6.19, below. In some embodiments, grooves 502 are filled using ink jet printing. Exemplary ink jet printing techniques are disclosed in Section 5.6.9, below. In some embodiments, grooves 502 are filled by inserting a powder into the grooves and then fusing the power with a laser having a suitable wavelength. Grooves 502 are filled with any type of electrically insulating material. Further referring to FIG. 5C, electrically conducting material is circumferentially disposed into grooves 504 thereby forming electrically conductive vias 508. The use of highly electrically conductive material for vias 508 allows the vias to have very narrow linewidths and still be effective. This is advantageous because it helps to reduce semiconductor junction 406 area loss. In some embodiments, grooves 504 are filled by screen printing. Exemplary screen printing techniques are disclosed in Section 5.6.19, below. In some embodiments, groove 504 is filled using ink jet printing. Exemplary ink jet printing techniques are disclosed in Section 5.6.9, below. In some embodiments, grooves 504 are filled by inserting a powder into the grooves and then fusing the power with a laser having a suitable wavelength.

Figure 5D:
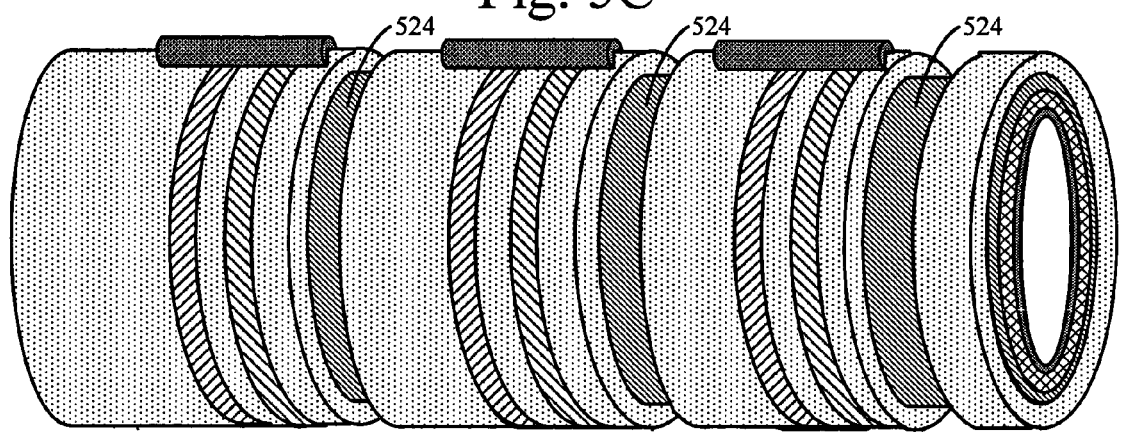
Figure 5D:
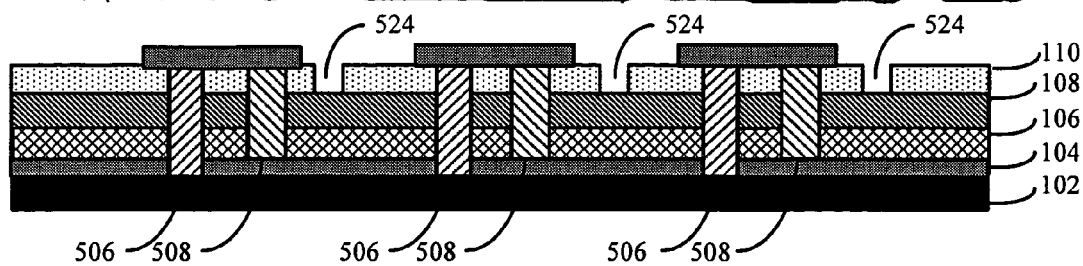

Referring to FIG. 5D, groove 514 is scribed into transparent conductive layer 110 thereby exposing underlying window layer 108. Groove 524 is necessary to form solar cells 700 that are monolithically integrated such that the transparent conductive layer 110 of one solar cell 700 on substrate 102 is serially connected to the back-electrode 104 of an adjacent solar cell 700 but the two solar cells 700 are otherwise electrically isolated from each other. Also, electrical conduit is disposed on portions of the first transparent conductive layer 110 as illustrated in Figure D. In some embodiments, grooves 502, 504, and 524 are not concentric as illustrated in FIG. 5. Rather, in some embodiments, such grooves are spiraled down the cylindrical (long) axis of substrate 102.

Figure 6A:
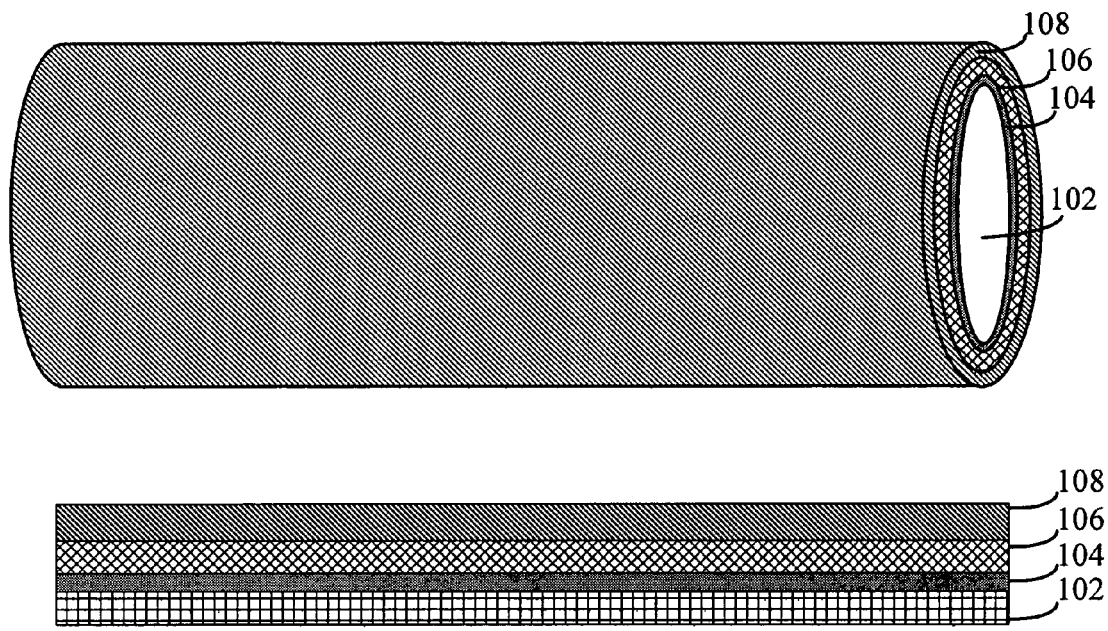
FIGS. 6A-6H illustrate processing steps for manufacturing a solar cell unit having a substrate using a second post device technique in accordance with the present invention.
Figure 6B:
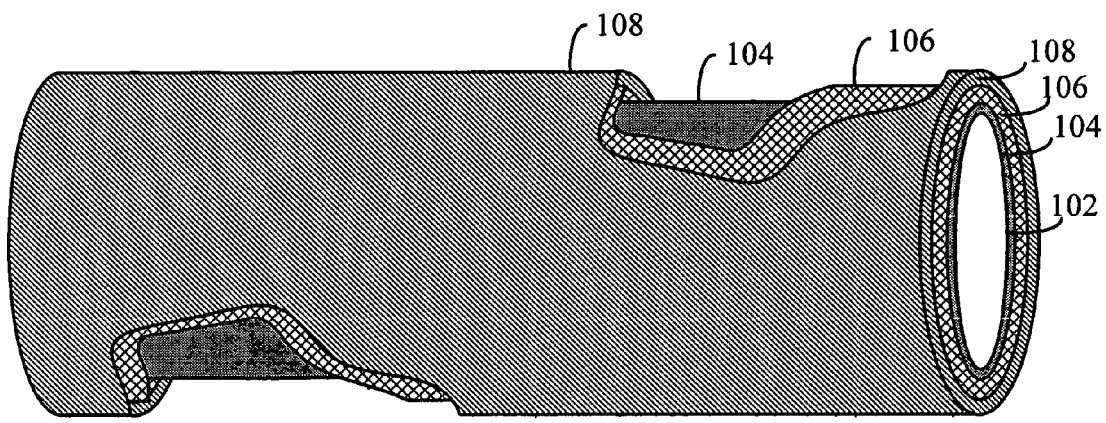

5.1.5 Manufacture of Monolithic Solar Cells on Substrates Using a Second Post Device Technique FIGS. 6A-6H illustrate processing steps for manufacturing a solar cell unit having a substrate using a second post device technique in accordance with the present invention. Substrate 102 is solid cylindrical shaped or hollowed cylindrical shaped. In some embodiments, substrate 102 is (i) tubular shaped or (ii) a rigid solid rod shaped. Referring to FIGS. 6A and 6B, back-electrode 104, absorber 106, and window layer 108 are sequentially circumferentially disposed on substrate 102 prior to the first patterning step. FIG. 6A illustrates the three-dimensional tubular profile of the solar cell unit. Below this three-dimensional tubular profile is a corresponding one-dimensional profile of solar cell unit 270 at this stage of fabrication. The one-dimensional profile is a cross-sectional view of one hemisphere of the corresponding solar cell unit 270.

Figure 6C:
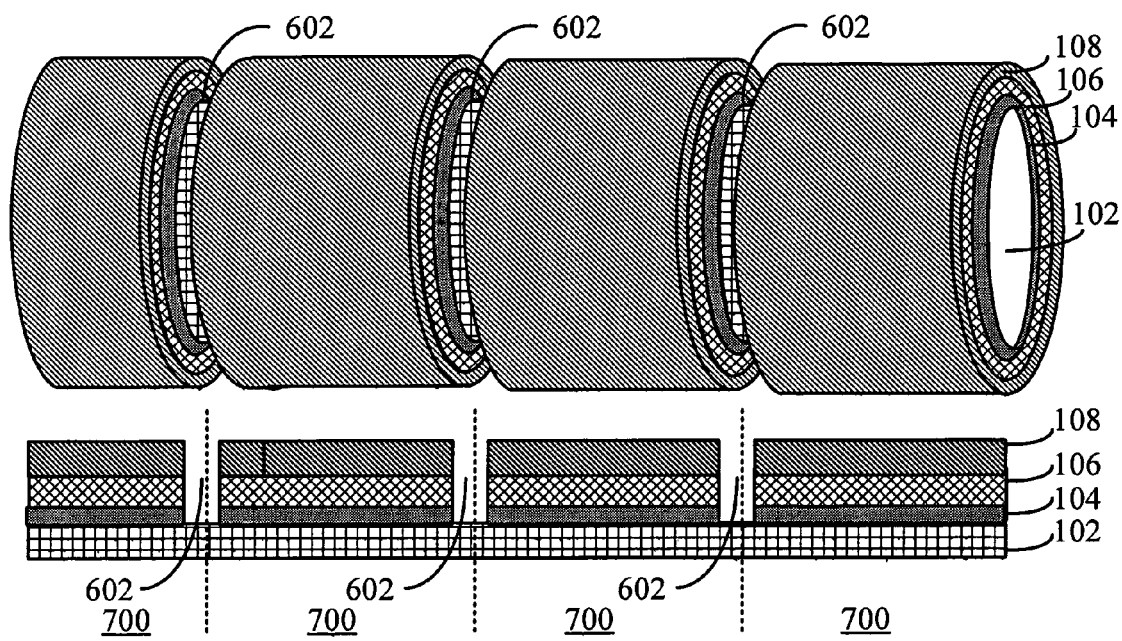

Referring to FIG. 6C, once window layer 108 has been circumferentially disposed, grooves 602 are scribed. The bottoms of grooves 602 expose substrate 102. Grooves 602 run the full perimeter of substrate 102 thereby defining solar cells 700 as illustrated. In some embodiments, grooves 602 are scribed using mechanical means. In some embodiments grooves 602 are formed using a lithographic etching method. Lithographic etching methods are described in Section 5.7, below.

Figure 6D:
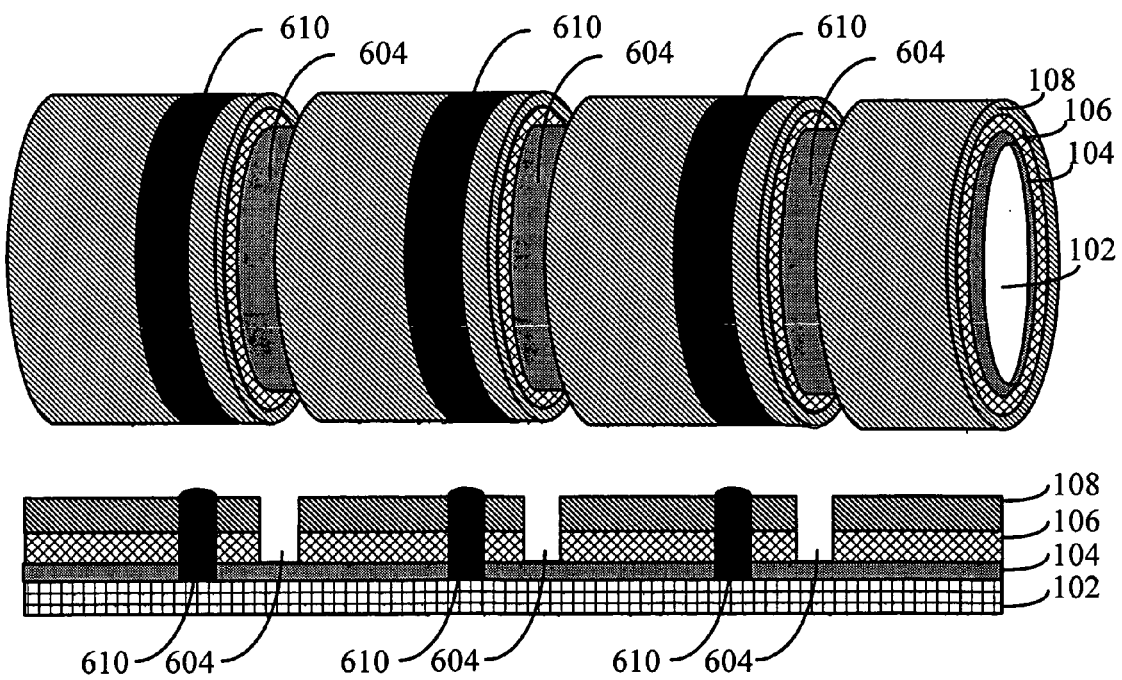

Referring to FIG. 6D, once grooves 602 have been formed, they are filled with an electrically insulating material thereby forming electrically insulating posts 610. In some embodiments, grooves 602 are filled using screen printing. Exemplary screen printing techniques are disclosed in Section 5.6.19, below. In some embodiments, grooves 602 is filled using ink jet printing. Exemplary ink jet printing techniques are disclosed in Section 5.6.9, below. In some embodiments, grooves 602 are filled by inserting a powder into the groove and then fusing the power with a laser having a suitable wavelength. Grooves 602 are filled with any type of electrically insulating material.

Referring to FIG. 6D, grooves 604 are scribed. The bottoms of grooves 604 expose back-electrode 104. There is no requirement that grooves 604 run the full perimeter of back-electrode 104. In some embodiments, grooves 604 do not run the full perimeter of back-electrode 104. In fact, in some embodiments, each groove 604 only extends a small percentage of the perimeter of back-electrode 104. In some embodiments, each solar cell 700 may have one, two, three, four or more, ten or more, or one hundred or more pockets arranged around the perimeter of back-electrode 104 instead of a given groove 604. In some embodiments, grooves 604 are scribed using a laser beam. In some embodiments, grooves 604 are scribed using mechanical means. In some embodiments grooves 604 are formed using a lithographic etching method. Lithographic etching methods are described in Section 5.7, below.

Figure 6E:
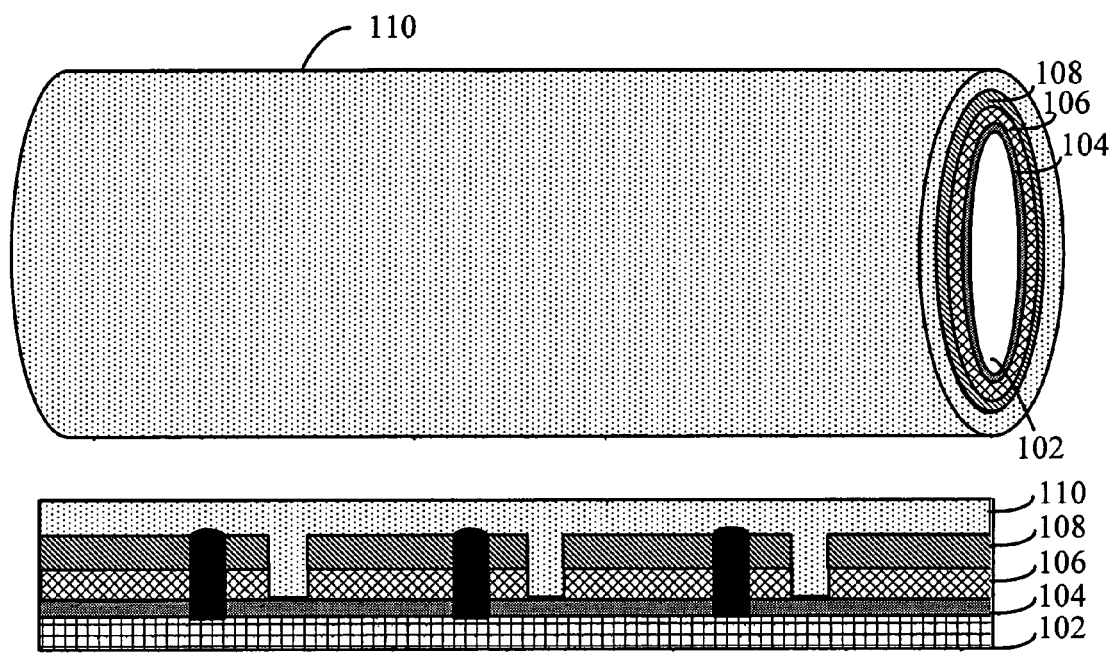
Figure 6F:
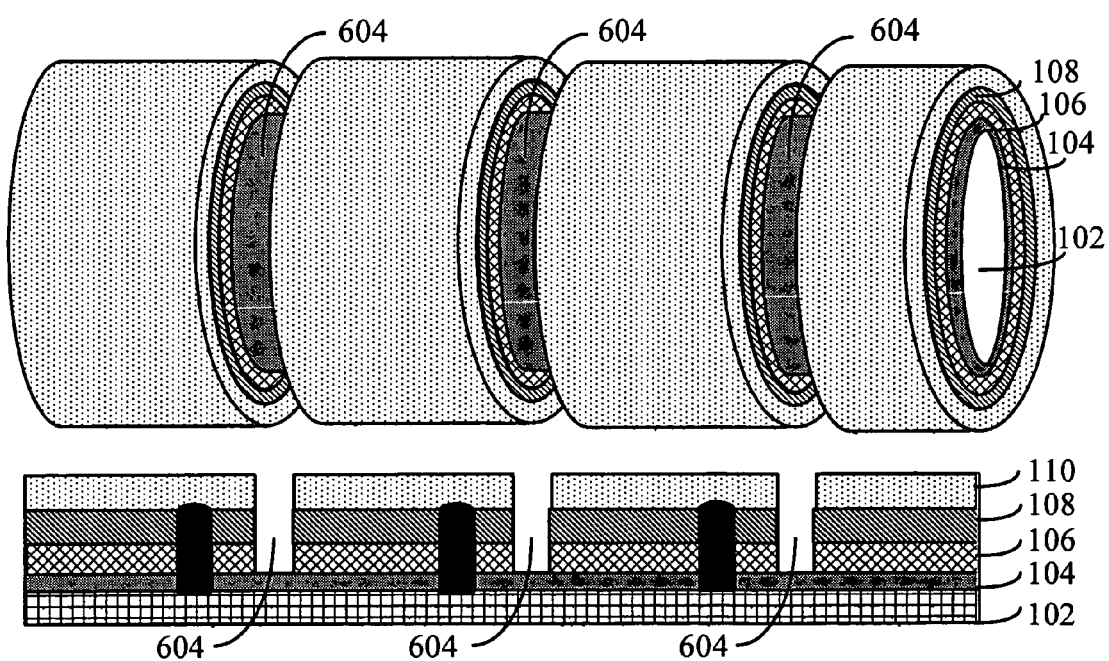
Figure 6G:
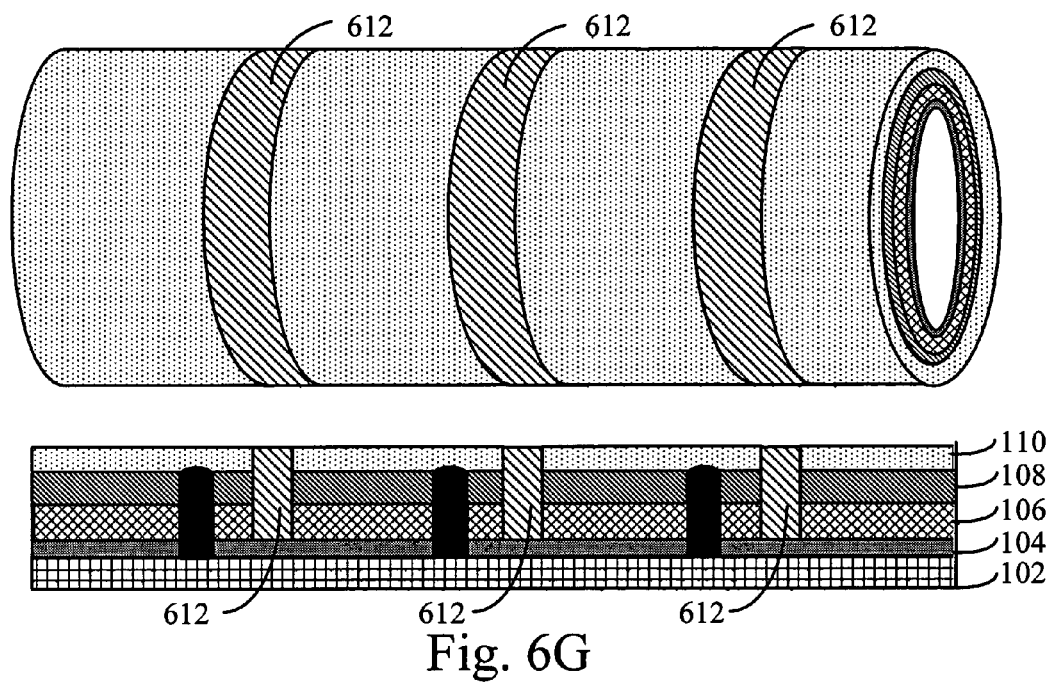

Referring to FIG. 6E, transparent conductive layer 110 is circumferentially deposited after grooves 602 have been filled with an insulative material. Material for transparent conductive layer fills grooves 604. However, referring to FIG. 6F, this material is scribed out of grooves 604 so that a more electrically conducting material can be deposited into the grooves thereby forming electrically conductive vias 612 as illustrated in FIG. 6G. The use of highly electrically conductive material for vias 612 allows the vias to have very narrow linewidths and still be effective. This is advantageous because it helps to reduce semiconductor junction 406 area loss. In some embodiments, grooves 604 are filled using screen printing. Exemplary screen printing techniques are disclosed in Section 5.6.19, below. In some embodiments, grooves 604 are filled using ink jet printing. Exemplary ink jet printing techniques are disclosed in Section 5.6.9, below. In some embodiments, grooves 604 are filled by inserting a powder into groove 604 and then fusing the power with a laser having a suitable wavelength.

Figure 6H:
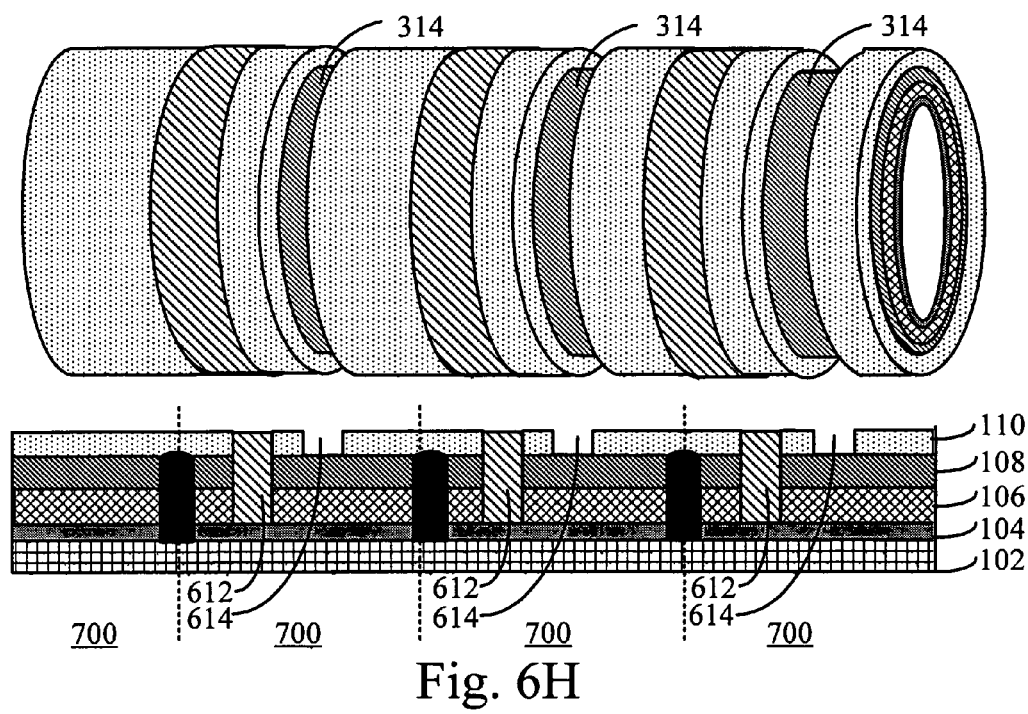

Referring to FIG. 6H, groove 614 is scribed into the transparent conductive layer 110 thereby exposing underlying window layer 108. Groove 614 is necessary to form solar cells 700 that are monolithically integrated such that the transparent conductive layer 110 of one solar cell 700 on substrate 102 is serially connected to the back-electrode 104 of an adjacent solar cell 700 but the two solar cells 700 are otherwise electrically isolated from each other.

In some embodiments, grooves 602, 604, and 614 are not concentric as illustrated in FIG. 6. Rather, in some embodiments, such grooves are spiraled down the cylindrical (long) axis of substrate 102.

Figure 8A:
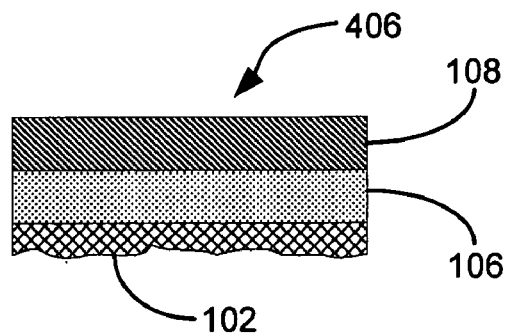
FIGS. 8A-8D illustrate semiconductor junctions that are used in various photovoltaic cells in various embodiments of the present invention.

5.2 Exemplary semiconductor junctions Referring to FIG. 8A, in one embodiment, semiconductor junction 406 is a heterojunction between an absorber layer 106, disposed on back-electrode 104, and a junction partner layer 108, disposed on absorber layer 106. Layers 106 and 108 are composed of different semiconductors with different band gaps and electron affinities such that junction partner layer 106 has a larger band gap than absorber layer 108. In some embodiments, absorber layer 106 is p-doped and junction partner layer 108 is n-doped. In such embodiments, transparent conductive layer 110 (not shown) is $n^+$-doped. In alternative embodiments, absorber layer 106 is n-doped and transparent conductive layer 110 is p-doped. In such embodiments, transparent conductive layer 110 is $p^+$-doped. In some embodiments, the semiconductors listed in Pandey,

*Handbook of Semiconductor Electrodeposition*, Marcel Dekker Inc., 1996, Appendix 5, which is hereby incorporated by reference herein in its entirety, are used to form semiconductor junction 406.

5.2.1 Thin-Film Semiconductor Junctions Based on Copper Indium Diselenide and Other Type I-III-VI Materials Continuing to refer to FIG. 5A, in some embodiments, absorber layer 106 is a group I-III-VI$_2$ compound such as copper indium di-selenide (CuInSe$_2$; also known as CIS). In some embodiments, absorber layer 106 is a group I-III-VI$_2$ ternary compound selected from the group consisting of CdGeAs$_2$, ZnSnAs$_2$, CuInTe$_2$, AgInTe$_2$, CuInSe$_2$, CuGaTe$_2$, ZnGeAs$_2$, CdSnP$_2$, AgInSe$_2$, AgGaTe$_2$, CuInS$_2$, CdSiAs$_2$, ZnSnP$_2$, CdGeP$_2$, ZnSnAs$_2$, CuGaSe$_2$, AgGaSe$_2$, AgInS$_2$, ZnGeP$_2$, ZnSiAs$_2$, ZnSiP$_2$, CdSiP$_2$, or CuGaS$_2$ of either the p-type or the n-type when such compound is known to exist.

In some embodiments, junction partner layer 108 is CdS, ZnS, ZnSe, or CdZnS. In one embodiment, absorber layer 106 is p-type CIS and junction partner layer 108 is n-type CdS, ZnS, ZnSe, or CdZnS. Such semiconductor junctions 406 are described in Chapter 6 of Bube, *Photovoltaic Materials*, 1998, Imperial College Press, London, which is hereby incorporated by reference in its entirety. Such semiconductor junctions 406 are described in Chapter 6 of Bube, Photovoltaic Materials, 1998, Imperial College Press, London, which is hereby incorporated by reference in its entirety.

In some embodiments, absorber layer 106 is copper-indium-gallium-diselenide (CIGS). Such a layer is also known as Cu(InGa)Se$_2$. In some embodiments, absorber layer 106 is copper-indium-gallium-diselenide (CIGS) and junction partner layer 108 is CdS, ZnS, ZnSe, or CdZnS. In some embodiments, absorber layer 106 is p-type CIGS and junction partner layer 108 is n-type CdS, ZnS, ZnSe, or CdZnS. Such semiconductor junctions 406 are described in Chapter 13 of *Handbook of Photovoltaic Science and Engineering*, 2003, Luque and Hegedus (eds.), Wiley & Sons, West Sussex, England, Chapter 12, which is hereby incorporated by reference in its entirety. In some embodiments, layer 106 is between 0.5 µm and 2.0 µm thick. In some embodiments, the composition ratio of Cu/(In+Ga) in layer 502 is between 0.7 and 0.95. In some embodiments, the composition ratio of Ga/(In+Ga) in layer 106 is between 0.2 and 0.4. In some embodiments the CIGS absorber has a <110> crystallographic orientation. In some embodiments the CIGS absorber has a <112> crystallographic orientation. In some embodiments the CIGS absorber is randomly oriented.

Figure 8B:
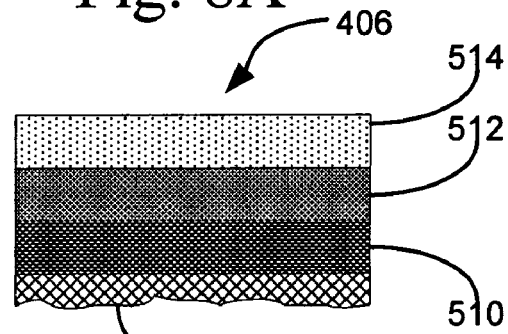

5.2.2 Semiconductor Junctions Based on Amorphous Silicon or Polycrystalline Silicon In some embodiments, referring to FIG. 8B, semiconductor junction 406 comprises amorphous silicon. In some embodiments this is an n/n type heterojunction. For example, in some embodiments, layer 514 comprises SnO$_2$ (Sb), layer 512 comprises undoped amorphous silicon, and layer 510 comprises n+ doped amorphous silicon.

In some embodiments, semiconductor junction 406 is a p-i-n type junction. For example, in some embodiments, layer 514 is p$^+$ doped amorphous silicon, layer 512 is undoped amorphous silicon, and layer 510 is n$^+$ amorphous silicon. Such semiconductor junctions 406 are described in Chapter 3 of Bube, *Photovoltaic Materials*, 1998, Imperial College Press, London, which is hereby incorporated by reference herein in its entirety.

In some embodiments of the present invention, semiconductor junction 406 is based upon thin-film polycrystalline. Referring to FIG. 8B, in one example in accordance with such embodiments, layer 510 is a p-doped polycrystalline silicon, layer 512 is depleted polycrystalline silicon and layer 514 is n-doped polycrystalline silicon. Such semiconductor junctions are described in Green, *Silicon Solar Cells: Advanced Principles & Practice*, Centre for Photovoltaic Devices and Systems, University of New South Wales, Sydney, 1995; and Bube, *Photovoltaic Materials*, 1998, Imperial College Press, London, pp. 57-66, which is hereby incorporated by reference herein in its entirety.

In some embodiments of the present invention, semiconductor junctions 406 based upon p-type microcrystalline Si:H and microcrystalline Si:C:H in an amorphous Si:H solar cell are used. Such semiconductor junctions are described in Bube, *Photovoltaic Materials*, 1998, Imperial College Press, London, pp. 66-67, and the references cited therein, which is hereby incorporated by reference herein in its entirety.

In some embodiments, of the present invention, semiconductor junction 406 is a tandem junction. Tandem junctions are described in, for example, Kim et al., 1989, "Lightweight (AlGaAs)GaAs/CuInSe2 tandem junction solar cells for space applications," Aerospace and Electronic Systems Magazine, IEEE Volume 4, Issue 11, November 1989 Page(s):23-32; Deng, 2005, "Optimization of a-SiGe based triple, tandem and single-junction solar cells Photovoltaic Specialists Conference, 2005 Conference Record of the Thirty-first IEEE 3-7 Jan. 2005 Page(s): 1365-1370; Arya et al., 2000, Amorphous silicon based tandem junction thin-film technology: a manufacturing perspective," Photovoltaic Specialists Conference, 2000, Conference Record of the Twenty-Eighth IEEE 15-22 Sep. 2000 Page(s): 1433-1436; Hart, 1988, "High altitude current-voltage measurement of GaAs/Ge solar cells," Photovoltaic Specialists Conference, 1988, Conference Record of the Twentieth IEEE 26-30 Sep. 1988 Page(s):764-765 vol. 1; Kim, 1988, "High efficiency GaAs/CuInSe2 tandem junction solar cells," Photovoltaic Specialists Conference, 1988., Conference Record of the Twentieth IEEE 26-30 Sep. 1988 Page(s):457-461 vol. 1; Mitchell, 1988, "Single and tandem junction CuInSe2 cell and module technology," Photovoltaic Specialists Conference, 1988, Conference Record of the Twentieth IEEE 26-30 Sep. 1988 Page(s):1384-1389 vol. 2; and Kim, 1989, "High specific power (AlGaAs)GaAs/CuInSe2 tandem junction solar cells for space applications," Energy Conversion Engineering Conference, 1989, IECEC-89, Proceedings of the 24$^{th}$ Intersociety 6-11 Aug. 1989 Page(s):779-784 vol. 2, each of which is hereby incorporated by reference herein in its entirety.

5.2.3 Semiconductor Junctions Based on Gallium Arsenide and Other Type III-V Materials In some embodiments, semiconductor junctions 406 are based upon gallium arsenide (GaAs) or other III-V materials such as InP, AlSb, and CdTe. GaAs is a direct-band gap material having a band gap of 1.43 eV and can absorb 97% of AM 1 radiation in a thickness of about two microns. Suitable type III-V junctions that can serve as semiconductor junctions 410 of the present invention are described in Chapter 4 of Bube, *Photovoltaic Materials*, 1998, Imperial College Press, London, which is hereby incorporated by reference herein in its entirety.

Furthermore, in some embodiments semiconductor junction 406 is a hybrid multijunction solar cell such as a GaAs/Si mechanically stacked multijunction as described by Gee and Virshup, 1988, 20$^{th}$ *IEEE Photovoltaic Specialist Conference*, IEEE Publishing, New York, p. 754, which is hereby incorporated by reference herein in its entirety, a GaAs/CuInSe$_2$ MSMJ four-terminal device, consisting of a GaAs thin film top cell and a ZnCdS/CuInSe$_2$ thin bottom cell described by Stanbery et al., 19$^{th}$ *IEEE Photovoltaic Specialist Conference*, IEEE Publishing, New York, p. 280, and Kim et al., 20$^{th}$ *IEEE Photovoltaic Specialist Conference*, IEEE Publishing, New York, p. 1487, each of which is hereby incorporated by reference herein in its entirety. Other hybrid multijunction solar cells are described in Bube, *Photovoltaic Materials*, 1998, Imperial College Press, London, pp. 131-132, which is hereby incorporated by reference herein in its entirety.

Figure 8C:
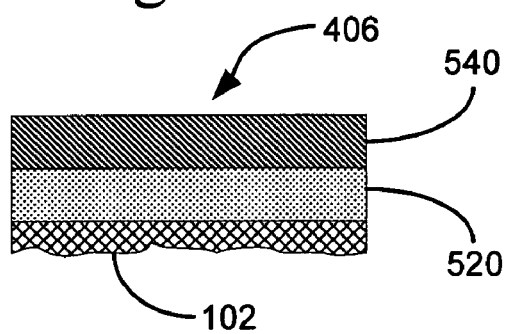

5.2.4 Semiconductor Junctions Based on Cadmium Telluride and Other Type II-VI Materials In some embodiments, semiconductor junctions 406 are based upon II-VI compounds that can be prepared in either the n-type or the p-type form. Accordingly, in some embodiments, referring to FIG. 8C, semiconductor junction 406 is a p-n heterojunction in which layers 520 and 540 are any combination set forth in the following table or alloys thereof.

| Layer 520 | Layer 540 |
|---|---|
| n-CdSe | p-CdTe |
| n-ZnCdS | p-CdTe |
| n-ZnSSe | p-CdTe |
| p-ZnTe | n-CdSe |
| n-CdS | p-CdTe |
| n-CdS | p-ZnTe |
| p-ZnTe | n-CdTe |
| n-ZnSe | p-CdTe |
| n-ZnSe | p-ZnTe |
| n-ZnS | p-CdTe |
| n-ZnS | p-ZnTe |

Methods for manufacturing semiconductor junctions 406 are based upon II-VI compounds are described in Chapter 4 of Bube, *Photovoltaic Materials*, 1998, Imperial College Press, London, which is hereby incorporated by reference herein in its entirety.

5.2.5 Semiconductor Junctions Based on Crystalline Silicon

Figure 8D:
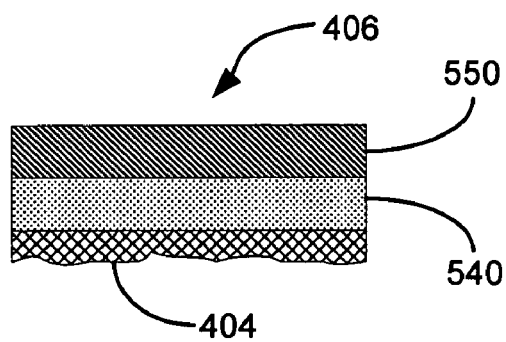

While semiconductor junctions 406 that are made from thin film semiconductor films are preferred, the invention is not so limited. In some embodiments semiconductor junctions 406 is based upon crystalline silicon. For example, referring to FIG. 8D, in some embodiments, semiconductor junction 406 comprises a layer of p-type crystalline silicon 540 and a layer of n-type crystalline silicon 550. Methods for manufacturing crystalline silicon semiconductor junctions 410 are described in Chapter 2 of Bube, *Photovoltaic Materials*, 1998, Imperial College Press, London, which is hereby incorporated by reference herein in its entirety.

5.3 Albedo Embodiments

The solar cell units 270 of the present invention may be arranged in solar cell assemblies. In such solar cell assemblies, solar cell units 270 are arranged in coplanar rows to form a plane having a first face and a second face. This is advantageous because such surface can collect light through either of their two faces. In some embodiments, there is spacing between individual solar cell units 270 in the solar cell assembly. In some embodiments of the present invention, these solar cell assemblies are arranged in a reflective environment in which surfaces around the solar cell assembly have some amount of albedo. Albedo is a measure of reflectivity of a surface or body. It is the ratio of electromagnetic radiation (EM radiation) reflected to the amount incident upon it. This fraction is usually expressed as a percentage from zero to one hundred. In some embodiments, surfaces in the vicinity of the solar cell assemblies of the present invention are prepared so that they have a high albedo by painting such surfaces a reflective white color. In some embodiments, other materials that have a high albedo can be used. For example, the albedo of some materials around such solar cells approach or exceed seventy, eighty, or ninety percent. See, for example, Boer, 1977, Solar Energy 19, 525, which is hereby incorporated by reference herein in its entirety. However, surfaces having any amount of albedo (e.g., fifty percent or more, sixty percent or more, seventy percent or more) are within the scope of the present invention. In one embodiment, the solar cells assemblies of the present invention are arranged in rows above a gravel surface, where the gravel has been painted white in order to improve the reflective properties of the gravel. In general, any Lambertian or diffuse reflector surface can be used to provide a high albedo surface. More description of albedo surfaces that can be used in conjunction with the present invention are disclosed in U.S. patent application Ser. No. 11/315,523, which is hereby incorporated by reference herein in its entirety.

5.4 Static Concentrators

Encapsulated solar cell unit 300 may be assembled into bifacial arrays as, for example, any of assemblies 400 (FIG. 4), 700 (FIG. 7), 800 (FIG. 8), 900 (FIG. 9), or 1000 (FIG. 10). In some embodiments, static concentrators are used to improve the performance of the solar cell assemblies of the present invention. The use of a static concentrator in one exemplary embodiment is illustrated in FIG. 11, where static concentrator 1102, with aperture AB, is used to increase the efficiency of bifacial solar cell assembly CD, where solar cell assembly CD is, for example, any of assemblies 400 (FIG. 4), 700 (FIG. 7), 800 (FIG. 8), 900 (FIG. 9), or 1000 (FIG. 10) of other assemblies of solar cell units 300 of the present invention. Static concentrator 1102 can be formed from any static concentrator materials known in the art such as, for example, a simple, properly bent or molded aluminum sheet, or reflector film on polyurethane. Concentrator 1102 is an example of a low concentration ratio, nonimaging, compound parabolic concentrator (CPC)-type collector. Any (CPC)-type collector can be used with the solar cell assemblies of the present invention. For more information on (CPC)-type collectors, see Pereira and Gordon, 1989, *Journal of Solar Energy Engineering*, 111, pp. 111-116, which is hereby incorporated by reference herein in its entirety.

Additional static concentrators that can be used with the present invention are disclosed in Uematsu et al., 1999, Proceedings of the 11$^{th}$ International Photovoltaic Science and Engineering Conference, Sapporo, Japan, pp. 957-958; Uematsu et al., 1998, Proceedings of the Second World Conference on Photovoltaic Solar Energy Conversion, Vienna, Austria, pp. 1570-1573; Warabisako et al., 1998, Proceedings of the Second World Conference on Photovoltaic Solar Energy Conversion, Vienna, Austria, pp. 1226-1231; Eames et al., 1998, Proceedings of the Second World Conference on Photovoltaic Solar Energy Conversion, Vienna Austria, pp. 2206-2209; Bowden et al., 1993, Proceedings of the $23^{rd}$ IEEE Photovoltaic Specialists Conference, pp. 1068-1072; and Parada et al., 1991, Proceedings of the $10^{th}$ EC Photovoltaic Solar Energy Conference, pp. 975-978, each of which is hereby incorporated by reference herein in its entirety.

In some embodiments, a static concentrator as illustrated in FIG. 12 is used. The bifacial solar cells illustrated in FIG. 12 can be any bifacial solar cell assembly of the present invention including. but not limited to assembly 400 (FIG. 4), 700 (FIG. 7), 800 (FIG. 8), 900 (FIG. 9), or 1000 (FIG. 10). The static concentrator illustrated in FIG. 12 uses two sheets of cover glass on the front and rear of the module with submillimeter V-grooves that are designed to capture and reflect incident light as illustrated in the figure. More details of such concentrators are found in Uematsu et al., 2001, Solar Energy Materials & Solar Cell 67, 425-434 and Uematsu et al., 2001, Solar Energy Materials & Solar Cell 67, 441-448, each of which is hereby incorporated by reference herein in its entirety. Additional static concentrators that can be used with the present invention are discussed in *Handbook of Photovoltaic Science and Engineering*, 2003, Luque and Hegedus (eds.), Wiley & Sons, West Sussex, England, Chapter 12, which is hereby incorporated by reference herein in its entirety.

5.5 Internal Reflector Embodiments

Figure 9:
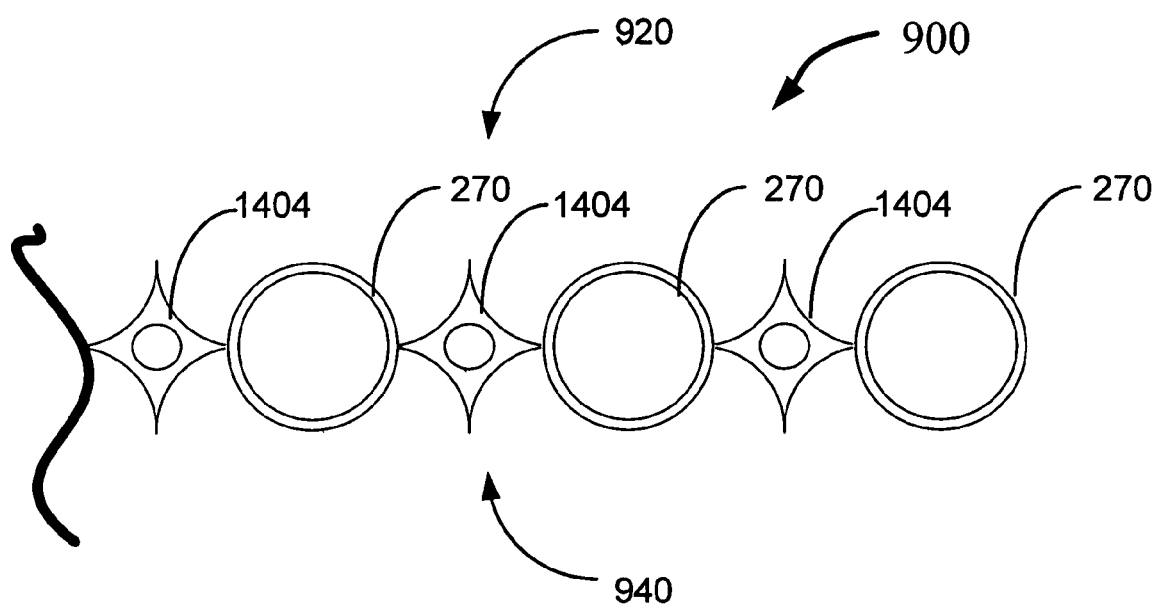
FIG. 9 illustrates a solar assembly with internal reflectors in accordance with an embodiment of the present invention.

Solar cell units 270 as depicted, for example, in FIG. 9, may be arranged to form solar cell assemblies. In FIG. 9, an internal reflector 270 is used to enhance solar input into the solar cell assembly 900. As illustrate in FIG. 9 solar cell units 270 and an internal reflector 1404 are assembled into an alternating array as shown. Solar cell units 270 in solar cell assembly 900 can have counter-electrodes 420. As illustrated in FIG. 9, solar cell assembly 900 comprises a plurality of solar cell units 270. There is no limit to the number of solar cell units 270 in this plurality (e.g., 10 or more, 100 or more, 1000 or more, 10,000 or more, between 5,000 and one million solar cells 402, etc.). In some embodiments, solar cell assembly 900 comprises a plurality of internal reflectors 1404. There is no limit to the number of internal reflectors 1404 in this plurality (e.g., 10 or more, 100 or more, 1000 or more, 10,000 or more, between 5,000 and one million reflector 1404, etc.).

Within solar cell assembly 900, internal reflectors 1404 run lengthwise along corresponding solar cell units 270. In some embodiments, internal reflectors 1404 have a hollow substrate core 102. Such a substrate is advantageous in many instances because it reduces the amount of material needed to make such devices, thereby lowering costs. In some embodiments, internal reflector 1404 is a plastic casing with a layer of highly reflective material (e.g., polished aluminum, aluminum alloy, silver, nickel, steel, etc.) deposited on the plastic casing. In some embodiments, internal reflector 1404 is a single piece made out of polished aluminum, aluminum alloy, silver, nickel, steel, etc. In some embodiments, internal reflector 1404 is a metal or plastic casing onto which is layered a metal foil tape. Exemplary metal foil tapes include, but are not limited to, 3M aluminum foil tape 425, 3M aluminum foil tape 427, 3M aluminum foil tape 431, and 3M aluminum foil tape 439 (3M, St. Paul, Minn.).

Internal reflector 1404 can adopt a broad range of designs, only one of which is illustrated in FIG. 9. Central to the design of reflectors 1404 found in some embodiments of the present invention is the desire to reflect direct light that enters into both sides of solar cell assembly 900 (i.e., side 920 and side 940).

In general, reflectors 1404 of the present invention are designed to optimize reflection of light into adjacent elongated solar cells 402. Direct light that enters one side of solar cell assembly 900 (e.g., side 920, above the plane of the solar cell assembly drawn in FIG. 9) is directly from the sun whereas light that enters the other side of the solar cell (e.g., side 940, below the plane of the solar cell assembly drawn in FIG. 9) will have been reflected off of a surface. In some embodiments, this surface is Lambertian, a diffuse or an involute reflector. Thus, because each side of the solar cell assembly faces a different light environment, the shape of internal reflector 1404 on side 920 may be different than on side 940.

Although internal reflector 1404 is illustrated in FIG. 9 as having a symmetrical four-sided cross-sectional shape, the cross-sectional shape of the internal reflectors 1404 of the present invention are not limited to such a configuration. In some embodiments, a cross-sectional shape of an internal reflector 1404 is astroid. In some embodiments, a cross-sectional shape of an internal reflector 1404 is four-sided and at least one side of the four-sided cross-sectional shape is linear. In some embodiments, a cross-sectional shape of an internal reflector 1404 is four-sided and at least one side of the four-sided cross-sectional shape is parabolic. In some embodiments, a cross-sectional shape of an internal reflector 1404 is four-sided and at least one side of the four-sided cross-sectional shape is concave. In some embodiments, a cross-sectional shape of an internal reflector 1404 is four-sided; and at least one side of the four-sided cross-sectional shape is circular or elliptical. In some embodiments, a cross-sectional shape of an internal reflector in the plurality of internal reflectors is four-sided and at least one side of the four-sided cross-sectional shape defines a diffuse surface on the internal reflector. In some embodiments, a cross-sectional shape of an internal reflector 1404 is four-sided and at least one side of the four-sided cross-sectional shape is the involute of a cross-sectional shape of an solar cell unit 270. In some embodiments, a cross-sectional shape of an internal reflector 1404 is two-sided, three-sided, four-sided, five-sided, or six-sided. In some embodiments, a cross-sectional shape of an internal reflector in the plurality of internal reflectors 1404 is four-sided and at least one side of the four-sided cross-sectional shape is faceted.

In some embodiments, the connection between an internal reflector 1404 and an adjacent elongated solar cell is provided by an additional adaptor piece. Such an adapter piece has surface features that are complementary to both the shapes of internal reflectors 1404 as well solar cell units 270 in order to provide a tight fit between such components. In some embodiments, such adaptor pieces are fixed on internal reflectors 1404. In other embodiments, the adaptor pieces are fixed on elongated solar cell units 270. In additional embodiments, the connection between solar cell units 270 and reflectors 1404 may be strengthened by electrically conducting glue or tapes.

Diffuse Reflection. In some embodiments in accordance with the present invention, the side surface of reflector 1404 is a diffuse reflecting surface. Diffuse reflection surfaces reflect off light with no directional dependence for the viewer. Whether the surface is microscopically rough or smooth has a tremendous impact upon the subsequent reflection of a beam of light. Diffuse reflection originates from a combination of internal scattering of light, e.g., the light is absorbed and then re-emitted, and external scattering from the rough surface of the object.

Lambertian reflection. In some embodiments in accordance with the present invention, the surface of reflector 1404 is a Lambertian reflecting surface. A Lambertian source is defined as an optical source that obeys Lambert's cosine law, i.e., that has an intensity directly proportional to the cosine of the angle from which it is viewed. Accordingly, a Lambertian surface is defined as a surface that provides uniform diffusion of incident radiation such that its radiance (or luminance) is the same in all directions from which it can be measured (e.g., radiance is independent of viewing angle) with the caveat that the total area of the radiating surface is larger than the area being measured.

On a perfectly diffusing surface, the intensity of the light emanating in a given direction from any small surface component is proportional to the cosine of the angle of the normal to the surface. The brightness (luminance, radiance) of a Lambertian surface is constant regardless of the angle from which it is viewed.

The incident light $\vec{1}$ strikes a Lambertian surface and reflects in different directions. When the intensity of $\vec{1}$ is defined as $I_{in}$, the intensity (e.g., $I_{out}$) of a reflected light $\vec{v}$ can be defined as following in accordance to Lambert's cosine law:

$$I_{out}(\vec{v}) = I_{in}(\vec{1})\varphi(\vec{v}, \vec{1})\frac{\cos\theta_{in}}{\cos\theta_{out}}$$

where $\varphi(\vec{v}, \vec{1}) = k_d \cos\theta_{out}$ and $k_d$ is related to the surface property. The incident angle is defined as $\theta_{in}$, and the reflected angle is defined as $\theta_{out}$. Using the vector dot product formula, the intensity of the reflected light can also be written as:

$$I_{out}(\vec{v}) = k_d I_{in}(\vec{1}) \vec{1} \cdot \vec{n},$$

where $\vec{n}$ denotes a vector that is normal to the Lambertian surface.

Such a Lambertian surface does not lose any incident light radiation, but re-emits it in all the available solid angles with a $2\pi$ radians, on the illuminated side of the surface. Moreover, a Lambertian surface emits light so that the surface appears equally bright from any direction. That is, equal projected areas radiate equal amounts of luminous flux. Though this is an ideal, many real surfaces approach it. For example, a Lambertian surface can be created with a layer of diffuse white paint. The reflectance of such a typical Lambertian surface may be 93%. In some embodiments, the reflectance of a Lambertian surface may be higher than 93%. In some embodiments, the reflectance of a Lambertian surface may be lower than 93%. Lambertian surfaces have been widely used in LED design to provide optimized illumination, for example in U.S. Pat. No. 6,257,737 to Marshall, et al.; U.S. Pat. No. 6,661,521 to Stern; and U.S. Pat. No. 6,603,243 to Parkyn, et al., which are hereby incorporated by reference herein in their entireties. Advantageously, Lambertian surfaces on reflector 1404 effectively reflect light in all directions. The reflected light is then directed towards adjacent solar cell units 270 to enhance solar cell performance.

Reflection on involute surfaces. In some embodiments in accordance with the present invention, a surface of reflector 1404 is an involute surface of an adjacent solar cell unit 270. In some embodiments, solar cell unit 270 is circular or near circular. The reflector surface of internal reflector 1404 is preferably the involute of a circle. The involute of circle is defined as the path traced out by a point on a straight line that rolls around a circle. For example, the involute of a circle can be drawn in the following steps. First, attach a string to a point on a curve. Second, extend the string so that it is tangent to the curve at the point of attachment. Third, wind the string up, keeping it always taut. The locus of points traced out by the end of the string is called the involute of the original circle. The original circle is called the evolute of its involute curve.

Although in general a curve has a unique evolute, it has infinitely many involutes corresponding to different choices of initial point. An involute can also be thought of as any curve orthogonal to all the tangents to a given curve. For a circle of radius r, at any time t, its equation can be written as:

$$x = r\cos t$$

$$y = r\sin t*$$

Correspondingly, the parametric equation of the involute of the circle is:

$$x_i = r(\cos t + t \sin t)$$

$$y_i = r(\sin t - t \cos t)*$$

Evolute and involute are reciprocal functions. The evolute of an involute of a circle is a circle.

Involute surfaces have been implemented in numerous patents to optimize light reflections. For example, a flash lamp reflector (U.S. Pat. No. 4,641,315 to Draggoo, hereby incorporated by reference herein in its entirety) and concave light reflector devices (U.S. Pat. No. 4,641,315 to Rose, hereby incorporated by reference herein in its entirety), both utilize involute surfaces to enhance light reflection efficiency.

Solar Cell Assembly. As illustrated in FIG. 9, solar cell units 270 in the plurality of elongated solar cells 270 are geometrically arranged in a parallel or near parallel manner. In some embodiments, each internal reflector 1404 connects to two solar cell units 270. Because of this, solar cell units 270 in such embodiments are effectively joined into a single composite device. More details on internal reflectors that can be used with the present invention are disclosed in U.S. patent Ser. No. 11/248,789, which is hereby incorporated herein by reference in its entirety.

5.6 Deposition Methods

The following subsections describe individual fabrication techniques that can be used to circumferentially deposit individual layers of solar cells 700.

5.6.1 Chemical Vapor Deposition

In some embodiments, one or more layers of solar cells 700 are deposited by chemical vapor deposition. In chemical vapor deposition (CVD), the constituents of a vapor phase, often diluted with an inert carrier gas, react at a hot surface (typically higher than 300° C.) to deposit a solid film. Generally, chemical vapor deposition reactions require the addition of energy to the system, such as heating the chamber or the wafer. For more information on chemical vapor deposition, devices used to perform chemical vapor deposition, and process conditions that may be used to perform chemical vapor deposition of silicon nitride, see Van Zant, *Microchip Fabrication*, Fourth Edition, McGraw-Hill, New York, 2000, pp. 363-393; and Madou, Fundamentals of Microfabrication, Second Edition, 2002, pp. 144-154, CRC Press, each of which are hereby incorporated by reference herein in their entireties.

5.6.2 Reduced Pressure Chemical Vapor Deposition

In some embodiments, one or more layers of solar cells 700 are deposited by reduced pressure chemical vapor deposition (RPCVD). RPCVD is typically performed at below 10 Pa and at temperatures in the range of (550° C.-600° C.). The low pressure used in RPCVD results in a large diffusion coefficient, which leads to growth of a layer that is limited by the rate of surface reactions rather than the rate of mass transfer to the substrate. In RPCVD, reactants can typically be used without dilution. RPCVD may be performed, for example, in a horizontal tube hot wall reactor.

5.6.3 Low Pressure Chemical Vapor Deposition

In some embodiments, one or more layers of solar cells 700 are deposited by low pressure chemical vapor deposition (LPCVD) or very low pressure CVD. RPCVD is typically performed at below 1 Pa.

5.6.4 Atmospheric Chemical Vapor Deposition

In some embodiments, one or more layers of solar cells 700 are deposited by atmospheric to slightly reduced pressure chemical vapor deposition. Atmospheric pressure to slightly reduced pressure CVD (APCVD) is used, for example, to grow APCVD is a relatively simplistic process that has the advantage of producing layers at high deposition rates and low temperatures (350° C.-400° C.).

5.6.5 Plasma Enhanced Chemical Vapor Deposition

In some embodiments, one or more layers of solar cells 700 are deposited by plasma enhanced (plasma assisted) chemical vapor deposition (PECVD). PECVD systems feature a parallel plate chamber operated at a low pressure (e.g., 2-5 Torr) and low temperature (300° C.-400° C.). A radio-frequency-induced glow discharge, or other plasma source is used to induce a plasma field in the deposition gas. PECVD systems that may be used include, but are not limited to, horizontal vertical flow PECVD, barrel radiant-heated PECVD, and horizontal-tube PECVD. In some embodiments, remote plasma CVD (RPCVD) is used. Remote plasma CVD is described, for example, in U.S. Pat. No. 6,458,715 to Sano et al., which is hereby incorporated by reference in its entirety.

5.6.6 Anodization

In some embodiments, one or more layers of solar cells 700 are deposited by anodization. Anodization is an oxidation process performed in an electrolytic cell. The material to be anodized (e.g. back-electrode 104) becomes the anode (+) while a noble metal is the cathode (−). Depending on the solubility of the anodic reaction products, an insoluble layer (e.g., an oxide) results. If the primary oxidizing agent is water, the resulting oxides generally are porous, whereas organic electrolytes lead to very dense oxides providing excellent passivation. See, for example, Madou et al., 1982, J. Electrochem. Soc. 129, pp. 2749-2752, which is hereby incorporated by reference in its entirety.

5.6.7 Sol-Gel Deposition Techniques

In some embodiments, one or more layers of solar cells 700 are deposited by a sol-gel process. In a sol-gel process solid particles, chemical precursors, in a colloidal suspension in a liquid (a sol) forms a gelatinous network (a gel). Upon removal of the solvent by heating a glass or ceramic layer 104. Both sol and gel formation are low-temperature processes. For sol formation, an appropriate chemical precursor is dissolved in a liquid, for example, tetraethylsiloxane (TEOS) in water. The sol is then brought to its gel-point, that is, the point in the phase diagram where the sol abruptly changes from a viscous liquid to a gelatinous, polymerized network. In the gel state the material is shaped (e.g., a fiber or a lens) or applied onto a substrate by spinning, dipping, or spraying. In the case of TEOS, a silica gel is formed by hydrolysis and condensation using hydrochloric acid as the catalyst. Drying and sintering at temperatures between 200° C. to 600° C. transforms the gel into a glass and ultimately into silicon dioxide.

5.6.8 Plasma Spraying Techniques

In some embodiments, one or more layers of solar cells 700 are deposited by a plasma spraying process. With plasma spraying, almost any material can be coated on many types of substrates. Plasma spraying is a particle deposition method. Particles, a few microns to 100 microns in diameter, are transported from source to substrate. In plasma spraying, a high-intensity plasma arc is operated between a sticktype cathode and a nozzle-shaped water-cooled anode. Plasma gas, pneumatically fed along the cathode, is heated by the arc to plasma temperatures, leaving the anode nozzle as a plasma jet or plasma flame. Argon and mixtures of argon with other noble (He) or molecular gases ($H_2$, $N_2$, $O_2$, etc.) are frequently used for plasma spraying. Fine powder suspended in a carrier gas is injected into the plasma jet where the particles are accelerated and heated. The plasma jet may reach temperatures of 20,000 K and velocities up to 1000 ms$^{-1}$. The temperature of the particle surface is lower than the plasma temperature, and the dwelling time in the plasma gas is very short. The lower surface temperature and short duration prevent the spray particles from being vaporized in the gas plasma. The particles in the plasma assume a negative charge, owing to the different thermal velocities of electrons and ions. As the molten particles splatter with high velocities onto a substrate, they spread, freeze, and form a more or less dense coating, typically forming a good bond with the substrate. Plasma spraying equipment is available from Sulzer Metco (Winterthur Switzerland). For more information on plasma spraying, see, for example, Madou, *Fundamentals of Microfabrication*, Second Edition, 2002, pp. 157-159, CRC Press, which is hereby incorporated by reference in its entirety.

5.6.9 Ink Jet Printing

In some embodiments, one or more layers of solar cells 700 are deposited by ink-jet printing. Ink-jet printing is based on the same principles of commercial ink-jet printing. The ink-jet nozzle is connected to a reservoir filled with the chemical solution and placed above a computer-controlled x-y stage. The target object is placed on the x-y stage and, under computer control, liquid drops (e.g., 50 microns in diameter) are expelled through the nozzle onto a well-defined place on the object. Different nozzles may print different spots in parallel. In one embodiment of the invention, a bubble jet, with drops as small as a few picoliters, is used to form a layer of a solar cell 700. In another embodiment, a thermal ink jet (Hewlett Packard, Palo Alto, Calif.) is used to form a layer of a solar cell 700. In a thermal ink jet, resistors are used to rapidly heat a thin layer of liquid ink. A superheated vapor explosion vaporizes a tiny fraction of the ink to form an expanding bubble that ejects a drop of ink from the ink cartridge onto the substrate. In still another embodiment of the present invention, a piezoelectric inkjet head is used for ink-jet printing. A piezoelectric ink-jet head includes a reservoir with an inlet port and a nozzle at the other end. One wall of the reservoir consists of a thin diaphragm with an attached piezoelectric crystal. When voltage is applied to the crystal, it contracts laterally, thus deflecting the diaphragm and ejecting a small drop of fluid from the nozzle. The reservoir then refills via capillary action through the inlet. One, and only one, drop is ejected for each voltage pulse applied to the crystal, thus allowing complete control over the when a drop is ejected. In yet another embodiment of the present invention, an epoxy delivery system is used to deposit a layer of a solar cell. An example of an epoxy delivery system is the Ivek Digispense 2000 (Ivek Corporation, North Springfield, Vt.). For more information on jet spraying, see, for example, Madou, *Fundamentals of Microfabrication*, Second Edition, 2002, pp. 164-167, CRC Press, which is hereby incorporated by reference herein in its entirety.

5.6.10 Vacuum Evaporation

In one embodiment of the present invention, one or more layers of solar cells 700 are deposited by vacuum evaporation. Vacuum evaporation takes place inside an evacuated chamber. The chamber can be, for example, a quartz bell jar or a stainless steal enclosure. Inside the chamber is a mechanism that evaporates the metal source, a wafer holder, a shutter, thickness and rate monitors, and heaters. The chamber is connected to a vacuum pump. There are any number of different ways in which the metal may be evaporated within the chamber, including filament evaporation, E-beam gun evaporation, and hot plate evaporation. See, for example, Van Zant, *Microchip Fabrication*, Fourth Edition, McGraw-Hill, New York, 2000, pp. 407-411, which is hereby incorporated by reference herein in its entirety.

5.6.11 Sputter Deposition/Physical Vapor Deposition

In another embodiment of the present invention, one or more layers of solar cells 700 are deposited by sputtering. Sputtering, like evaporation, takes place in a vacuum. However, it is a physical not a chemical process (evaporation is a chemical process), and is referred to as physical vapor deposition. Inside the vacuum chamber is a slab, called a target, of the desired film material. The target is electrically grounded. An inert gas such as argon is introduced into the chamber and is ionized to a positive charge. The positively charged argon atoms are attracted to the grounded target and accelerate toward it.

During the acceleration they gain momentum, and strike the target, causing target atoms to scatter. That is, the argon atoms "knock off" atoms and molecules from the target into the chamber. The sputtered atoms or molecules scatter in the chamber with some coming to rest on the wafer. A principal feature of a sputtering process is that the target material is deposited on the wafer with chemical or compositional change. In some embodiments of the present invention, direct current (DC) diode sputtering, radio frequency (RF) diode sputtering, triode sputtering, DC magnetron sputtering or RF magnetron sputtering is used. See, for example, Van Zant, *Microchip Fabrication*, Fourth Edition, McGraw-Hill, New York, 2000, pp. 411-415; U.S. Pat. No. 5,203,977; U.S. Pat. No. 5,486,277; and U.S. Pat. No. 5,742,471, each of which is hereby incorporated by reference herein in its entirety.

RF diode sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes is reversed at very high frequencies to prevent the formation of a positive charge on the cathode that would stop the ion bombardment process. Since the electrode polarity is reversed at a radio frequency, this process is referred to as I33 sputtering. Magnetron sputtering is different form of sputtering. Magnetron sputtering uses a magnetic field to trap electrons in a region near the target surface thus creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

5.6.12 Collimated Sputtering

In another embodiment of the present invention, one or more layers of solar cells 700 are deposited by collimated sputtering. Collimated sputtering is a sputtering process where the arrival of metal occurs at an angel normal to the wafer surface. The metal may be collimated by a thick honeycomb grid that effectively blocks off angle metal atoms. Alternatively, ionizing the metal atoms and attracting them towards the wafer may collimate the metal. Collimated sputtering improves filling of high aspect ratio contacts.

5.6.13 Laser Ablated Deposition

In another embodiment of the present invention, one or more layers of solar cells 700 are deposited by laser ablated deposition. In one form of laser ablated deposition, a rotating cylindrical target surface is provided for the laser ablation process. The target is mounted in a vacuum chamber so that it may be rotated about the longitudinal axis of the cylindrical surface target and simultaneously translated along the longitudinal axis. A laser beam is focused by a cylindrical lens onto the target surface along a line that is at an angle with respect to the longitudinal axis to spread a plume of ablated material over a radial arc. The plume is spread in the longitudinal direction by providing a concave or convex lateral target surface. The angle of incidence of the focused laser beam may be other than normal to the target surface to provide a glancing geometry. Simultaneous rotation about and translation along the longitudinal axis produce a smooth and even ablation of the entire cylindrical target surface and a steady evaporation plume. Maintaining a smooth target surface is useful in reducing undesirable splashing of particulates during the laser ablation process and thereby depositing high quality thin films. See, for example, U.S. Pat. No. 5,049,405, which is hereby incorporated by reference herein in its entirety.

5.6.14 Molecular Beam Deposition

In another embodiment of the present invention, one or more layers of solar cells 700 are deposited by molecular beam deposition. Molecular beam deposition is a method of growing films, under vacuum conditions, by directing one or more molecular beams at a substrate. In some instances, molecular beam deposition involves epitaxial film growth on single crystal substrates by a process that typically involves either the reaction of one or more molecular beams with the substrate or the deposition on the substrate of the beam particles. The term "molecular beam" refers to beams of monoatomic species as well as polyatomic species. The term molecular beam deposition includes both epitaxial growth and nonepitaxial growth processes. Molecular beam deposition is a variation of simple vacuum evaporation. However, molecular beam deposition offers better control over the species incident on the substrate than does vacuum evaporation. Good control over the incident species, coupled with the slow growth rates that are possible, permits the growth of thin layers having compositions (including dopant concentrations) that are precisely defined. Compositional control is aided by the fact that growth is generally at relatively low substrate temperatures, as compared to other growth techniques such as liquid phase epitaxy or chemical vapor deposition, and diffusion processes are very slow.

Essentially arbitrary layer compositions and doping profiles may be obtained with precisely controlled layer thickness. In fact, layers as thin as a monolayer are grown by MBE. Furthermore, the relatively low growth temperature permits growth of materials and use of substrate materials that could not be used with higher temperature growth techniques. See for example, U.S. Pat. No. 4,681,773, which is hereby incorporated by reference herein in its entirety.

5.6.15 Ionized Physical Vapor Deposition

In another embodiment of the present invention, one or more layers of solar cells 700 are deposited by ionized physical vapor deposition (I-PVD), also known as ionized metal plasma (IMP). In I-PVD, metal atoms are ionized in an intense plasma. Once ionized, the metal is directed by electric fields perpendicular to the wafer surface. Metal atoms are introduced into the plasma by sputtering from the target. A high density plasma is generated in the central volume of the reactor by an inductively coupled plasma (ICP) source. This electron density is sufficient to ionize approximately 80% of the metal atoms incident at the wafer surface. The ions from the plasma are accelerated and collimated at the surface of the wafer by a plasma sheath. The sheath is a region of intense electric field that is directed toward the wafer surface. The field strength is controlled by applying a radio frequency bias.

5.6.16 Ion Beam Deposition

In another embodiment of the present invention, one or more layers of solar cells 700 are deposited by ion beam deposition (IBD). IBD uses an energetic, broad beam ion source carefully focused on a grounded metallic or dielectric sputtering target. Material sputtered from the target deposits on a nearby substrate to create a film. Most applications also use a second ion source, termed an ion assist source (IAS), that is directed at the substrate to deliver energetic noble or reactive ions at the surface of the growing film. The ion sources are "gridded" ion sources and are typically neutralized with an independent electron source. IBD processing yields excellent control and repeatability of film thickness and properties. Process pressures in IBD systems are approximately $10^{-4}$ Torr. Hence, there is very little scattering of either ions delivered by the ion sources or material sputtered from the target of the surface. Compared to sputter deposition using magnetron or diode systems, sputter deposition by IBD is highly directional and more energetic. In combination with a substrate fixture that rotates and changes angle, IBD systems deliver a broad range of control over sidewall coatings, trench filling and liftoff profiles.

5.6.17 Atomic Layer Deposition

In another embodiment of the present invention, one or more layers of solar cells 700 are deposited by atomic layer deposition. Atomic layer deposition is also known as atomic layer epitaxy, sequential layer deposition, and pulsed-gas chemical vapor deposition. Atomic layer deposition involves use of a precursor based on self-limiting surface reactions. Generally, an object is exposed to a first species that deposits as a monolayer on the object. Then, the monolayer is exposed to a second species to form a fully reacted layer plus gaseous byproducts. The process is typically repeated until a desired thickness is achieved. Atomic layer deposition and various methods to carry out the same are described in U.S. Pat. No. 4,058,430 to Suntola et al., entitled "Method for Producing Compound Thin Films," U.S. Pat. No. 4,413,022 to Suntola et al., entitled "Method for Performing Growth of Compound Thin Films," to Ylilammi, and George et al., 1996, J. Phys. Chem. 100, pp. 13121-13131, each of which is hereby incorporated by reference herein in its entirety. Atomic layer deposition has also been described as a chemical vapor deposition operation performed under controlled conditions that cause the deposition to be self-limiting to yield deposition of, at most, a monolayer. The deposition of a monolayer provides precise control of film thickness and improved compound material layer uniformity. Atomic layer deposition may be performed using equipment such as the Endura Integrated Cu Barrier/Seed system (Applied Materials, Santa Clara, Calif.).

5.6.18 Hot Filament Chemical Vapor Deposition

In another embodiment of the present invention, one or more layers of solar cells 700 are deposited by hot filament chemical vapor deposition (HFCVD). In HFCVD, reactant gases are flowed over a heated filament to form precursor species that subsequently impinge on the substrate surface, resulting in the deposition of high quality films. HFCVD has been used to grow a wide variety of films, including diamond, boron nitride, aluminum nitride, titanium nitride, boron carbide, as well as amorphous silicon nitride. See, for example, Deshpande et al., 1995, J. Appl. Phys. 77, pp. 6534-6541, which is hereby incorporated by reference herein in its entirety.

5.6.19 Screen Printing

In another embodiment of the present invention, one or more layers of solar cells 700 are deposited by a screen printing (also known as silk-screening) process. A paste or ink is pressed onto portions of an underlying structure through openings in the emulsion on a screen. See, for example, Lambrechts and Sansen, *Biosensors: Microelectrochemical Devices*, The Institute of Physics Publishing, Philadelphia, 1992, which is hereby incorporated by reference in its entirety. The paste consists of a mixture of the material of interest, an organic binder, and a solvent. The organic binder determines the flow properties of the paste. The bonding agent provides adhesion of particles to one another and to the substrate. The active particles make the ink a conductor, a resistor, or an insulator. The lithographic pattern in the screen emulsion is transferred onto portions of the underlying structure by forcing the paste through the mask openings with a squeegee. In a first step, paste is put down on the screen. Then the squeegee lowers and pushes the screen onto the substrate, forcing the paste through openings in the screen during its horizontal motion. During the last step, the screen snaps back, the thick film paste that adheres between the screening frame and the substrate shears, and the printed pattern is formed on the substrate. The resolution of the process depends on the openings in the screen and the nature of the paste. With a 325-mesh screen (i.e., 325 wires per inch or 40 µM holes) and a typical paste, a lateral resolution of 100 µM can be obtained.

For difficult-to-print pastes, a shadow mask may complement the process, such as a thin metal foil with openings. However, the resolution of this method is inferior (>500 µM). After printing, the wet films are allowed to settle for a period of time (e.g., fifteen minutes) to flatten the surface while drying. This removes the solvents from the paste. Subsequent firing burns off the organic binder, metallic particles are reduced or oxidized, and glass particles are sintered. Typical temperatures range from 500° C. to 1000° C. After firing, the thickness of the resulting layer ranges from 10 µM to 50 µM. One silk-screening setup is the DEK 4265 (Universal Instrument Corporation, Binghamton, N.Y.). Commercially available inks (pastes) that can be used in the screen printing include conductive (e.g., Au, Pt, Ag/Pd, etc.), resistive (e.g., $RuO_2$, $IrO_2$), overglaze, and dielectric (e.g., $Al_2O_3$, $ZrO_2$). The conductive pastes are based on metal particles, such as Ag, Pd, Au, or Pt, or a mixture of these combined with glass. Resistive pastes are based on $RuO_2$ or $Bi_2Ru_2O_7$ mixed with glass (e.g., 65% PBO, 25% $SiO_2$, 10% $Bi_2O_3$).

The resistivity is determined by the mixing ratio. Overglaze and dielectric pastes are based on glass mixtures. Different melting temperatures can be achieved by adjusting the paste composition. See, for example, Madou, *Fundamentals of Microfabrication*, Second Edition, CRC Press, Boca Raton, Fla., 2002, pp. 154-156, which is hereby incorporated by reference herein in its entirety.

5.6.20 Electroless Metal Deposition

In another embodiment of the present invention, one or more layers of solar cells 700 (e.g. back-electrode 104) are deposited by electroless metal deposition. In electroless plating a layer is built by chemical means without applying a voltage. Electroless plating baths can be used to form Au, Co—P, Cu, Ni—Co, Ni—P, Pd, or Pt layers. See, for example, Madou, *Fundamentals of Microfabrication*, Second Edition, CRC Press, Boca Raton, Fla., 2002, pp. 344-345, which is hereby incorporated by reference herein in its entirety.

5.6.21 Electroplating

In another embodiment of the present invention, one or more layers of solar cells 700 is deposited by electroplating. Electroplating takes place in an electrolytic cell. The reactions that take place in electroplating involve current flow under an imposed bias. In some embodiments, a layer is deposited as part of a damascene process. See, for example, Madou, Fundamentals of Microfabrication, Second Edition, CRC Press, Boca Raton, Fla., 2002, pp. 346-357, which is hereby incorporated herein by reference in its entirety.

5.7 Lithographic Etching Methods

In some embodiments of the present invention, grooves and/or via ducts are formed by patterning one or more layers of solar cells 700. In some embodiments, such layers are patterned by semiconductor photolithographic photoresist coating and optical imaging through an optical mask, thereby forming grooves (e.g., groove 292, 294, 296, and/or 298 of FIG. 2).

One form of photolithographic processing in accordance with the present invention begins with the coating of a resist layer over the layer of solar cells 700 to be patterned. Resists used to form this resist layer are typically comprised of organic polymers applied from a solution. In some embodiments, this resist layer has a thickness in the range of 0.1 μm to 2.0 μm. Furthermore, in some embodiments, the resist layer has a uniformity of plus or minus 0.01 μm. In some embodiments, the resist layer is applied using a spin technique such as a static spin process or a dynamic dispense process. In some embodiments, the resist layer is applied using a manual spinner, a moving-arm resist dispenser, or an automatic spinner. See, for example, Van Zant, *Microchip Fabrication*, Forth Edition, McGraw-Hill, New York, 2000, pp. 217-222, which is hereby incorporated by reference herein in its entirety.

In some embodiments, the resist layer is an optical resist that is designed to react with ultraviolet or laser sources. In some embodiments, the resist layer is a negative resist in which polymers in the resist form a cross-linked material that is etch resistant upon exposure to light. Examples of negative resists that can be used to make the resist layer include, but are not limited to, azidelisoprene negative resists, polymethylmethacrylate (PMMA), polymethyliso- propyl ketone (PMIPK), poly-butene-1-sulfone (PBS), poly- (trifluoroethyl chloroacrylate) TFECA, copolymer-(V-cyano ethyl acrylate-V-amido ethyl acrylate) (COP), poly-(2-methyl pentene-1-sulfone) (PMPS) and the like. In other embodiments, the resist layer is a positive resist. The positive resist is relatively unsoluble. After exposure to the proper light energy, the resist converts to a more soluble state. This reaction is called photosobulization. One positive photoresist in accordance with the present invention is the phenol-formaldehyde polymer, also called phenol-formaldehyde novolak resin. See, for example, DeForest, *Photoresist: Materials and Processes*, McGraw-Hill, New York, 1975, which is hereby incorporated by reference herein in its entirety. In some embodiments, the resist layer is LOR 05A, LOR 5 0.7A, LOR 1A, LOR 3A, or LOR 5A (MICROCHEM, Newton, Mass.). LOR lift-off resists use polydimethylglutarimide.

After the resist layer has been applied, the density is often insufficient to support later processing. Accordingly, in some embodiments of the present invention, a bake is used to densify the resist layer and drive off residual solvent. This bake is referred to as a softbake, prebake, or post-apply bake. Several methods of baking the resist layer are contemplated by the present invention including, but not limited to, convection ovens, infrared ovens, microwave ovens, or hot plates. See, for example, Levinson, *Principles of Lithography*, SPIE Press, Bellingham, Wash., 2001, pp. 68-70, which is hereby incorporated by reference herein in its entirety.

After the spacer has been coated with a resist layer, the next step is alignment and exposure of the resist layer 8002. Alignment and exposure is, as the name implies, a two-purpose photomasking step. The first part of the alignment and exposure step is the positioning or alignment of the required image on the solar cell surface. The image is found on a mask. The second part is the encoding of the image in the resist layer from an exposing light or radiation source. In the present invention, any conventional alignment system can be used to align the mask with the resist layer, including but not limited to, contact aligners, proximity aligners, scanning projection aligners, steppers, step and scan aligners, x-ray aligners, and electron beam aligners. For a review of aligners that can be used in the present invention, see Solid State Teclznology, April 1993, p. 26; and Van Zant, *Microchip Fabrication*, Fourth Edition, McGraw-Hill, New York, 2000, pp. 232-241, each of which in incorporated herein by reference in its entirety. Masks can be negative or positive.

A positive mask (not shown) used to develop a positive resist would have the opposite pattern of a negative mask. Both negative masks and positive masks used in the methods of the present invention are fabricated with techniques similar to those used in wafer processing. A photomask blank, consisting of an opaque film (usually chromium) deposited on glass substrates, is covered with resist. The resist is exposed according to the desired pattern, is then developed, and the exposed opaque material etched. Mask patterning is accomplished primarily by means of beam writers, which are tools that expose mask blanks according to suitably formatted biosensor electrode patterns. In some embodiments electron or optical beam writers are used to pattern negative masks or positive masks. See for, example, Levison, *Principles of Lithography*, SPIE Press, Bellingham, Wash., 200 1, pp. 229-256, which is hereby incorporated by reference herein in its entirety.

In one embodiment of the present invention, the tool used to project the pattern of a mask onto a solar cell unit is a wafer stepper. Wafer steppers exist in two configurations, step-and-repeat and step-and-scan. In a step-and-repeat system, the entire area of the mask to be exposed is illuminated when a shutter is opened. In a step-and scan system, only part of the mask, and therefore only part of the exposure field on the solar cell unit, is exposed when a shutter is opened. The entire field is exposed by scanning mask and solar cell unit 270 synchronously. See, for example, Levison, *Principles of Lithography*, SPIE Press, Bellingham, Wash., 200 1, pp. 1 33-174, which is hereby incorporated by reference herein in its entirety.

After exposure through a mask, the pattern for the groove and/or via is coded as a latent image in resist as regions of exposed and unexposed resist. The pattern is developed in the resist by chemical dissolution of the unpolymerized resist regions to form the structures illustrated in FIGS. 2-6. A number of development techniques can be used to develop the resist. Development techniques are designed to leave in the resist layer an exact copy of the pattern that was on the mask or reticle. The successful development of the image coded in resist is dependent on the nature of the resist's exposure mechanisms.

Negative resist, upon exposure to light, goes through a process of polymerization which renders the resist resistant to dissolution in the developer chemical. The dissolving rate between the two regions is high enough so that little of the layer is lost from the polymerized regions. The chemical preferred for most negative-resist-developing situations is xylene or Stoddart solvent. The development step is done with a chemical developer followed by a rinse. For negative resists, the rinse chemical is usually n-butyl acetate.

Positive resists present a different developing condition. The two regions, polymerized and unpolymerized, have a different dissolving rate. This means that during the developing step some resist is always lost from the polymerized region. Use of developers that are too aggressive or that have overly long developing times may result in an unacceptable thinning of the resist. Two types of chemical developers used with positive resists in accordance with the present invention are alkaline-water solutions and nonionic solutions. The alkaline-water solutions can be sodium hydroxide or potassium hydroxide. Typical nonionic solutions include, but are not limited to, tetramethylamrnonimurn hydroxide (TMAH). The rinse chemical for positive-resist developers is water. A rinse is used for both positive and negative resists. This rinse is used to rapidly dilute the developer chemical to stop the developing action.

There are several methods in which a developer may be applied to resist in order to develop the latent image. Such methods include, but are not limited to, immersion, spray development, and puddle development. In some embodiments of the present invention, wet development methods are not used. Rather, a dry (or plasma) development is used. In such dry processes, a plasma etcher uses energized ions to chemically dissolve away either exposed or unexposed portions of the resist layer. In some embodiments of the present invention, resist is hard baked after is has been developed. The purpose of the hard bake is to achieve good adhesion of the resist layer to the underlying layer to be patterned. A hard bake may be accomplished using a convection oven, in-line or manual hot plates, infrared tunneling ovens, moving-belt convection ovens, vacuum ovens and the like. General baking temperature and baking times are provided by the resist manufacture. Therefore, specific baking temperatures and times is application dependent. Nominal hard bake temperatures are from 130° C. to 200° C. for thirty minutes in a convection oven.

After development, an etching step is used for patterning. A number of etching methods are available.

Wet etching. In one embodiment of the present invention, the structure to be patterned is immersed in a tank of an etchant for a specific time. Then the structure is transferred to a rinse station for acid removal, and transferred to a station for final rinse and a spin dry step.

Wet spray etching or vapor etching. In some embodiments of the present invention, wet spray etching or vapor etching is used for patterning. Wet spray etching offers several advantages over immersion etching including the added definition gained from the mechanical pressure of the spray. In vapor etching, the wafer is exposed to etchant vapors such as hydroflowic acid vapors.

Plasma etching. In some embodiments of the present invention, plasma etching is used. Plasma etching is a chemical process that uses gases and plasma energy to cause the chemical reaction. Plasma etching is performed using a plasma etcher. Physically, a plasma etcher comprises a chamber, vacuum system, gas supply, and a power supply. The structure to be etched is loaded into the chamber and the pressure inside is reduced by the vacuum system. After the vacuum is established, the chamber is filled with the reactive gas. For the etching of silicon dioxide, for example, the gas is usually $CF_4$ that is mixed with oxygen. A power supply creates a radio frequency (RF) field through electrodes in the chamber. The field energizes the gas mixture to a plasma state. In the energized state, the fluorine attacks the silicon dioxide, converting it into volatile components that are removed from the system by the vacuum system.

A wide variety of plasma etchers may be used to perform etching, in accordance with various embodiments of the present invention. Such etchers include, but are not limited to, barrel etchers, plasma planar systems, electron cyclotron resonance sources, high density reflected electron sources, helicon wave sources, inductively coupled plasma sources, and transformer coupled plasma sources.

Ion beam etching. Another type of etcher that may be used to perform the etching of spacer 140 in accordance with various aspects of the present invention is ion beam etching. Unlike chemical plasma systems, ion beam etching is a physical process. The structure to be etched is placed on a holder in a vacuum chamber and a stream of argon is introduced into the chamber. Upon entering the chamber, the argon is subjected to a stream of high-energy electrons from a set of cathode (−)-anode (+) electrodes. The electrons ionize the argon atoms to a high-energy state with a positive charge. The wafers are held on a negatively grounded holder that attracts the ionized argon atoms. As the argon atoms travel to the wafer holder they accelerate, picking up energy. At the wafer surface, they crash into the exposed wafer layer and blast small amounts from the wafer surface. No chemical reaction takes place between the argon atoms and the wafer material. The material removal (etching) is highly directional (anisotropic), resulting in good definition in small openings.

Reactive ion etching. Yet another type of etcher that may be used to perform the etching is a reactive ion etcher. A reactive ion etcher system combines plasma etching and ion beam etching principles. The systems are similar in construction to the plasma systems but have a capability of ion milling. The combination brings the benefits of chemical plasma etching along with the benefits of directional ion milling. See, Van Zant, *Microchip Fabrication*, Fourth Edition, McGraw-Hill, New York, 2000, pp. 256-270, for more information on etching techniques and etching equipment that can be used in accordance with the present invention.

Residual layer removal. The result of the etching process described above is the formation of grooves (e.g., grooves 292, 294, 296, and 298 of FIG. 2). Next, the residual layer is removed in a process known as resist stripping in order to yield the patterned structure. In some embodiments, the resist is stripped off with a strong acid such as $H_2SO_4$ or an acidoxidant combination, such as $H_2SO_4$-$Cr_2O_3$, attacking the resist but not the groove to yield the fully patterned structure. Other liquid strippers include organic solvent strippers (e.g., phenolic organic strippers and solventlamine strippers) and alkaline strippers (with or without oxidants). In some embodiments of the present invention, a dry plasma process is applied to remove a resist. In such embodiments, the patterned solar cell unit 280 is placed in a chamber and oxygen is introduced. The plasma field energizes the oxygen to a high energy state, which, in turn, oxidizes the resist components to gases that are removed from the chamber by the vacuum pump. In dry strippers, the plasma is generated by microwave, radio frequency, or ultraviolet-ozone sources. More information on photolithographic processes that can be used to pattern spacer solar cell units 270 is found in Madou, *Fundamentals of Microfabrication*, Second Edition, CRC Press, Boca Raton, Fla., 2002, pp. 2-65; and Van Zant, Microchip Fabrication, Fourth Edition, McGraw-Hill, New York, 2000, each of which are hereby incorporated by reference herein in their entireties. Such methods include the use of a positive photoresist rather than a negative photoresist as well as extreme ultraviolet lithography, x-ray lithography, charged-particle-beam lithography, scanning probe lithography, soft lithography, and three-dimensional lithographic methods.

6. REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

The invention claimed is:

1. A solar cell unit comprising:
   (A) a substrate having a first end and a second end, wherein the substrate is either (i) hollowed cylindrical shaped or (ii) a rigid solid rod; and
   (B) a plurality of photovoltaic cells linearly arranged on said substrate, the plurality of photovoltaic cells comprising a first photovoltaic cell and a second photovoltaic cell, each photovoltaic cell in said plurality of photovoltaic cells comprising:
      a back-electrode circumferentially disposed on said substrate;
      a semiconductor junction layer circumferentially disposed on said back-electrode; and
      a transparent conductive layer circumferentially disposed on said semiconductor junction, wherein
   the transparent conductive layer of the first photovoltaic cell in said plurality of photovoltaic cells is in serial electrical communication with the back-electrode of the second photovoltaic cell in said plurality of photovoltaic cells.

2. The solar cell unit of claim 1, wherein said plurality of photovoltaic cells comprises:
   a first terminal photovoltaic cell at the first end of said substrate;
   a second terminal photovoltaic cell at the second end of said substrate; and
   at least one intermediate photovoltaic cell between said first terminal photovoltaic cell and said second photovoltaic cell, wherein the transparent conductive layer of each intermediate photovoltaic cell in said at least one intermediate photovoltaic cell is in serial electrical communication with the back-electrode of an adjacent photovoltaic cell in said plurality of photovoltaic cells.

3. The solar cell unit of claim 2, wherein the adjacent photovoltaic cell is the first terminal photovoltaic cell or the second terminal photovoltaic cell.

4. The solar cell unit of claim 2, wherein the adjacent photovoltaic cell is another intermediate photovoltaic cell.

5. The solar cell unit of claim 1, wherein the plurality of photovoltaic cells comprises three or more photovoltaic cells.

6. The solar cell unit of claim 1, wherein the plurality of photovoltaic cells comprises ten or more photovoltaic cells.

7. The solar cell unit of claim 1, wherein the plurality of photovoltaic cells comprises fifty or more photovoltaic cells.

8. The solar cell unit of claim 1, wherein the plurality of photovoltaic cells comprises one hundred or more photovoltaic cells.

9. The solar cell unit of claim 1, further comprising a transparent tubular casing that is circumferentially disposed onto the transparent conductive layer of all or a portion of the photovoltaic cells in said plurality of photovoltaic cells.

10. The solar cell unit of claim 9, wherein the transparent tubular casing is made of plastic or glass.

11. The solar cell unit of claim 9, wherein the transparent tubular casing comprises aluminosilicate glass, borosilicate glass, dichroic glass, germanium/semiconductor glass, glass ceramic, silicate/fused silica glass, soda lime glass, quartz glass, chalcogenide/sulphide glass, fluoride glass, flint glass, or cereated glass.

12. The solar cell unit of claim 9, wherein the transparent tubular casing comprises a urethane polymer, an acrylic polymer, a fluoropolymer, a silicone, a silicone gel, an epoxy, a polyamide, or a polyolefin.

13. The solar cell unit of claim 9, wherein the transparent tubular casing comprises polymethylmethacrylate (PMMA), poly-dimethyl siloxane (PDMS), ethyl vinyl acetate (EVA), perfluoroalkoxy fluorocarbon (PFA), nylon, cross-linked polyethylene (PEX), polypropylene (PP), polyethylene terephtalate glycol (PETG), polytetrafluoroethylene (PTFE), polyvinyl chloride (PVC), or polyvinylidene fluoride (PVDF).

14. The solar cell assembly of claim 9, a luminal or an exterior surface of said transparent tubular casing is coated with a fluorescent material.

15. The solar cell unit of claim 1, wherein the substrate comprises plastic, metal or glass.

16. The solar cell unit of claim 1, wherein the substrate comprises a urethane polymer, an acrylic polymer, a fluoropolymer, polybenzamidazole, polymide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoro-ethylene, polymethacrylate, nylon 6,6, cellulose acetate butyrate, cellulose acetate, rigid vinyl, plasticized vinyl, or polypropylene.

17. The solar cell unit of claim 1, wherein the substrate comprises aluminosilicate glass, borosilicate glass, dichroic glass, germanium/semiconductor glass, glass ceramic, silicate/fused silica glass, soda lime glass, quartz glass, chalcogenide/sulphide glass, fluoride glass, a glass-based phenolic, flint glass, or cereated glass.

18. The solar cell unit of claim 1, wherein the substrate is tubular hollowed cylindrical shape.

19. The solar cell unit of claim 18, wherein the substrate is configured so that a fluid is passed through said substrate.

20. The solar cell unit of claim 19, wherein said fluid is air, water, nitrogen, or helium.

21. The solar cell unit of claim 1, wherein the substrate comprises a rigid solid rod.

22. The solar cell unit of claim 1, wherein the back-electrode of a photovoltaic cell in said plurality of photovoltaic cells is made of aluminum, molybdenum, tungsten, vanadium, rhodium, niobium, chromium, tantalum, titanium, steel, nickel, platinum, silver, gold, an alloy thereof, or any combination thereof.

23. The solar cell unit of claim 1, wherein the back-electrode of a photovoltaic cell in said plurality of photovoltaic cells is made of indium tin oxide, titanium nitride, tin oxide, fluorine doped tin oxide, doped zinc oxide, aluminum doped zinc oxide, gallium doped zinc oxide, boron dope zinc oxide indium-zinc oxide, a metal-carbon black-filled oxide, a graphite-carbon black-filled oxide, a carbon black-carbon black-filled oxide, a superconductive carbon black-filled oxide, an epoxy, a conductive glass, or a conductive plastic.

24. The solar cell unit of claim 1, wherein the semiconductor junction of a photovoltaic cell in said plurality of photovoltaic cells comprises a homojunction, a heterojunction, a heteroface junction, a buried homojunction, a p-i-n junction, or a tandem junction.

25. The solar cell unit of claim 1, wherein the transparent conductive layer of a photovoltaic cell in said plurality of photovoltaic cells comprises carbon nanotubes, tin oxide, fluorine doped tin oxide, indium-tin oxide (ITO), doped zinc oxide, aluminum doped zinc oxide, gallium doped zinc oxide, boron dope zinc oxide indium-zinc oxide or any combination thereof or any combination thereof.

26. The solar cell unit of claim 1, wherein said semiconductor junction of a photovoltaic cell in said plurality of photovoltaic cells comprises an absorber layer and a junction partner layer, wherein said junction partner layer is circumferentially deposed on said absorber layer.

27. The solar cell unit of claim 26, wherein said absorber layer comprises copper-indium-gallium-diselenide and said junction partner layer comprises $In_2Se_3$, $In_2S_3$, ZnS, ZnSe, CdInS, CdZnS, $ZnIn_2Se_4$, $Zn_{1-x}Mg_xO$, CdS, $SnO_2$, ZnO, $ZrO_2$, or doped ZnO.

28. The solar cell unit of claim 1, wherein a photovoltaic cell in said plurality of photovoltaic cells further comprises an intrinsic layer circumferentially disposed on the semiconductor junction of the photovoltaic cell and wherein the transparent conductive layer of the photovoltaic cell is disposed on said the intrinsic layer.

29. The solar cell unit of claim 28, wherein the intrinsic layer comprises an undoped transparent oxide.

30. The solar cell unit of claim 28, wherein the intrinsic layer comprises undoped zinc oxide.

31. The solar cell unit of claim 1, further comprising:
a filler layer that is circumferentially disposed onto the transparent conductive layer of all or a portion of the photovoltaic cells in said plurality of photovoltaic cells; and
a transparent tubular casing that is circumferentially disposed on said filler layer.

32. The solar cell unit of claim 31, wherein the filler layer comprises ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, or a urethane.

33. The solar cell assembly of claim 31, wherein said filler layer is coated with a fluorescent material.

34. The solar cell unit of claim 1, further comprising:
a water resistant layer that is circumferentially disposed onto the transparent conductive layer of all or a portion of the photovoltaic cells in said plurality of photovoltaic cells; and
a transparent tubular casing that is circumferentially disposed on said water resistant layer.

35. The solar cell unit of claim 34, wherein the water resistant layer comprises clear silicone, SiN, $SiO_xN_y$, $SiO_x$, or $Al_2O_3$, where x and y are integers.

36. The solar cell unit of claim 34, wherein a fluorescent material is coated on said water resistant layer.

37. The solar cell unit of claim 36, wherein the fluorescent material is copper-activated zinc sulfide (ZnS:Cu), silver-activated zinc sulfide (ZnS:Ag), zinc sulfide, cadmium sulfide (ZnS:CdS), strontium aluminate activated by europium ($SrAlO_3$:Eu), strontium titanium activated by praseodymium and aluminum (SrTiO3:Pr, Al), calcium sulfide with strontium sulfide with bismuth ((Ca,Sr)S:Bi), copper and magnesium activated zinc sulfide (ZnS:Cu,Mg), quantum dots of CdSe, a stilbene, trans-1,2-diphenylethylene, or (E)-1,2-diphenylethene, umbelliferone (7-hydroxycoumarin, or any combination thereof.

38. The solar cell unit of claim 1, further comprising:
a transparent tubular casing that is circumferentially disposed onto the transparent conductive layer of all or a portion of the photovoltaic cells in said plurality of photovoltaic cells; and
an antireflective coating circumferentially disposed on said transparent tubular casing.

39. The solar cell unit of claim 38, wherein the antireflective coating comprises $MgF_2$, silicone nitrate, titanium nitrate, silicon monoxide, or silicone oxide nitrite.

40. The solar cell unit of claim 1, further comprising:
an antireflective coating that is circumferentially disposed onto the transparent conductive layer of all or a portion of the photovoltaic cells in said plurality of photovoltaic cells.

41. The solar cell unit of claim 40, wherein the antireflective coating comprises $MgF_2$, silicone nitrate, titanium nitrate, silicon monoxide, or silicone oxide nitrite.

42. The solar cell unit of claim 1, wherein a length of said solar cell is between 2 centimeters and 300 centimeters.

43. The solar cell unit of claim 1, wherein a length of said solar cell is between 2 centimeters and 30 centimeters.

44. The solar cell unit of claim 1, wherein a length of said solar cell is between 30 centimeters and 300 centimeters.

45. A solar cell assembly comprising a plurality of solar cell units, each solar cell unit in the plurality of solar cell units having the structure of the solar cell unit of claim 1, wherein solar cell units in said plurality of solar cell units are arranged in coplanar rows to form said solar cell assembly.

46. A solar cell assembly comprising:
(A) a plurality of solar cell units, each solar cell unit in the plurality of solar cell units having the structure of the solar cell unit of claim 1, wherein solar cell units in said plurality of solar cells units are geometrically arranged in a parallel or a near parallel manner thereby forming a planar array having a first face and a second face; and (B) a plurality of internal reflectors, wherein each respective internal reflector in the plurality of internal reflectors is configured between a corresponding first and second solar cell unit in said plurality of elongated solar cells such that a portion of the solar light reflected from the respective internal reflector is reflected onto the corresponding first and second elongated solar cell.

47. The solar cell assembly of claim 46, further comprising:

(C) a transparent electrically insulating substrate that covers all or a portion of said first face of said planar array.

48. The solar cell assembly of claim 47, further comprising:

(D) a transparent insulating covering disposed on said second face of said planar array, thereby encasing said plurality of elongated solar cells between said transparent insulating covering and said transparent electrically insulating substrate.

49. The solar cell assembly of claim 48, wherein said transparent insulating covering and said transparent insulating substrate are bonded together by a sealant.

50. The solar cell assembly of claim 49, wherein said sealant is ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, or a urethane.

51. The solar cell assembly of claim 46, wherein said plurality of elongated solar cells is configured to receive direct light from the direction of said first face and from the direction of said second face of said planar array.

52. The solar cell assembly of claim 46, further comprising an albedo surface positioned to reflect sunlight into the plurality of solar cell units.

53. The solar cell assembly of claim 52, wherein the albedo surface has an albedo that exceeds 80%.

54. The solar cell assembly of claim 46, wherein a first solar cell unit and a second solar cell unit in the plurality of solar cell units is electrically arranged in series.

55. The solar cell assembly of claim 46, wherein a first solar cell unit and a second solar cell unit in the plurality of solar cell units is electrically arranged in parallel.

56. A solar cell assembly comprising:

(A) a plurality of solar cell units, each solar cell unit in the plurality of solar cell units having the structure of the solar cell unit of claim 1, wherein solar cell units in said plurality of solar cells units are geometrically arranged in a parallel or a near parallel manner thereby forming a planar array having a first face and a second face;

(B) a transparent electrically insulating substrate that covers all or a portion of said first face of said planar array; and (C) a transparent insulating covering disposed on said second face of said planar array, thereby encasing said plurality of elongated solar cells between said transparent insulating covering and said transparent electrically insulating substrate.

57. The solar cell assembly of claim 56, wherein said transparent insulating covering and said transparent insulating substrate are bonded together by a sealant.

58. The solar cell assembly of claim 57, wherein said sealant is ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, or a urethane.

59. The solar cell unit of claim 1, wherein a transparent conductive layer in a photovoltaic cell in a plurality of photovoltaic cells is coated with a fluorescent material.

60. The solar cell unit of claim 59, wherein the fluorescent material is copper-activated zinc sulfide (ZnS:Cu), silver-activated zinc sulfide (ZnS:Ag), zinc sulfide, cadmium sulfide (ZnS:CdS), strontium aluminate activated by europium (SrAlO$_3$:Eu), strontium titanium activated by praseodymium and aluminum (SrTiO3 Pr, Al), calcium sulfide with strontium sulfide with bismuth ((Ca,Sr)S:Bi), copper and magnesium activated zinc sulfide (ZnS:Cu,Mg), quantum dots of CdSe, a stilbene, trans-1,2-diphenylethylene, or (E)-1,2-diphenylethene, umbelliferone (7-hydroxycoumarin, or any combination thereof.

61. A solar cell unit comprising:

(A) a substrate, wherein the substrate is either (i) hollowed cylindrical shaped or (ii) a rigid solid rod:

(B) a first photovoltaic cell comprising:
    a first back-electrode circumferentially disposed on a first portion of said substrate;
    a first semiconductor junction layer circumferentially disposed on said first back-electrode; and
    a first transparent conductive layer circumferentially disposed on said first semiconductor junction; and (C) a second photovoltaic cell comprising:
    a second back-electrode circumferentially disposed on a second portion of said substrate;
    a second semiconductor junction layer circumferentially disposed on said second back-electrode; and
    a second transparent conductive layer circumferentially disposed on said second semiconductor junction; wherein (i) the first photovoltaic cell is adjacent to the second photovoltaic cell;

(ii) the first transparent conductive layer is in serial electrical communication with the second back-electrode;

(iii) the first transparent conductive layer is electrically isolated from the second transparent conductive layer; and (iv) the first back-electrode is electrically isolated from the second back-electrode.

62. A method comprising:

passing a fluid through a substrate, wherein (A) said substrate has a first end and a second end, wherein the substrate is hollowed cylindrical shaped; and (B) a plurality of photovoltaic cells are linearly arranged on said substrate, the plurality of photovoltaic cells comprising a first photovoltaic cell and a second photovoltaic cell, each photovoltaic cell in said plurality of photovoltaic cells comprising:
    a back-electrode circumferentially disposed on said substrate;
    a semiconductor junction layer circumferentially disposed on said back-electrode; and
    a transparent conductive layer circumferentially disposed on said semiconductor junction, wherein
    the transparent conductive layer of the first photovoltaic cell in said plurality of photovoltaic cells is in serial electrical communication with the back-electrode of the second photovoltaic cell in said plurality of photovoltaic cells.

63. The method of claim 62, wherein said fluid is air, water, nitrogen, or helium.

* * * * *